(12) United States Patent
Lung et al.

(10) Patent No.: US 8,237,140 B2
(45) Date of Patent: *Aug. 7, 2012

(54) SELF-ALIGNED, EMBEDDED PHASE CHANGE RAM

(75) Inventors: Hsiang Lan Lung, Elmsford, NY (US); Shih Hung Chen, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 919 days.

This patent is subject to a terminal disclaimer.

(21) Appl. No.: 11/424,749

(22) Filed: Jun. 16, 2006

(65) Prior Publication Data

US 2006/0284158 A1  Dec. 21, 2006

Related U.S. Application Data

(63) Continuation-in-part of application No. 11/155,067, filed on Jun. 17, 2005, now Pat. No. 7,321,130.

(51) Int. Cl.
*H01L 45/00* (2006.01)

(52) U.S. Cl. ................... 257/2; 257/E45.002
(58) Field of Classification Search ........ 257/2, E45.002
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,389,566 A | 2/1995 | Lage | |
| 5,534,712 A | 7/1996 | Ovshinsky et al. | |
| 5,687,112 A | 11/1997 | Ovshinsky | |
| 5,751,012 A | 5/1998 | Wolstenholme et al. | |
| 5,789,277 A | 8/1998 | Zahorik et al. | |
| 5,789,758 A | 8/1998 | Reinberg | |
| 5,814,527 A | 9/1998 | Wolstenholme et al. | |

(Continued)

FOREIGN PATENT DOCUMENTS
WO    WO 00/45108 A1    8/2000

(Continued)

OTHER PUBLICATIONS

Claim recitation for U.S. Appl. No. 11/425,183, filed Apr. 21, 2009.*

(Continued)

*Primary Examiner* — Tom Thomas
*Assistant Examiner* — Christopher M Roland
(74) *Attorney, Agent, or Firm* — Kenta Suzue; Haynes Beffel & Wolfeld LLP

(57) ABSTRACT

An integrated circuit with an embedded memory comprises a substrate and a plurality of conductor layers arranged for interconnecting components of the integrated circuit. An intermediate layer in the plurality of conductor layers includes a first electrode having a top surface, a second electrode having a top surface, an insulating member between the first electrode and the second electrode. A bridge overlies the intermediate layer between the first and second electrodes across the insulating member, wherein the bridge comprises a programmable resistive memory material, such as a phase change material. A conductor in at least one layer in the plurality of conductor layers over said intermediate layer is connected to said bridge.

19 Claims, 59 Drawing Sheets

U.S. PATENT DOCUMENTS

| | | | |
|---|---|---|---|
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,920,788 A | 7/1999 | Reinberg | |
| 5,952,671 A | 9/1999 | Reinberg et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,077,729 A | 6/2000 | Harshfield | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,507,061 B1 | 1/2003 | Hudgens et al. | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,858 B1 | 4/2003 | Jones et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,621,730 B1 | 9/2003 | Lage | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,791,102 B2 | 9/2004 | Johnson et al. | |
| 6,797,979 B2 | 9/2004 | Chiang et al. | |
| 6,800,563 B2 | 10/2004 | Xu | |
| 6,815,704 B1 | 11/2004 | Chen | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,888,750 B2 | 5/2005 | Walker et al. | |
| 6,894,305 B2 | 5/2005 | Yi et al. | |
| 6,897,467 B2 | 5/2005 | Doan et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,992,932 B2 | 1/2006 | Cohen | |
| 7,018,911 B2 | 3/2006 | Lee et al. | |
| 7,238,994 B2* | 7/2007 | Chen et al. | 257/379 |
| 7,321,130 B2* | 1/2008 | Lung et al. | 257/4 |
| 7,394,089 B2 | 7/2008 | Doyle et al. | |
| 7,485,891 B2 | 2/2009 | Hamann et al. | |
| 7,504,653 B2 | 3/2009 | Lung | |
| 7,560,337 B2 | 7/2009 | Ho et al. | |
| 7,579,613 B2 | 8/2009 | Lung et al. | |
| 7,606,059 B2 | 10/2009 | Toda | |
| 7,623,370 B2 | 11/2009 | Toda et al. | |
| 7,778,063 B2 | 8/2010 | Brubaker et al. | |
| 7,868,313 B2 | 1/2011 | Breitwisch et al. | |
| 2002/0042158 A1 | 4/2002 | Kersch et al. | |
| 2003/0003647 A1 | 1/2003 | Dennison et al. | |
| 2003/0215978 A1 | 11/2003 | Maimon et al. | |
| 2004/0026686 A1 | 2/2004 | Lung | |
| 2004/0113181 A1* | 6/2004 | Wicker | 257/246 |
| 2004/0113192 A1* | 6/2004 | Wicker | 257/298 |
| 2004/0114317 A1 | 6/2004 | Chiang et al. | |
| 2004/0164290 A1* | 8/2004 | Yi et al. | 257/4 |
| 2004/0166604 A1* | 8/2004 | Ha et al. | 438/102 |
| 2004/0248339 A1 | 12/2004 | Lung | |
| 2005/0019975 A1 | 1/2005 | Lee et al. | |
| 2005/0127347 A1 | 6/2005 | Choi et al. | |
| 2005/0215009 A1 | 9/2005 | Cho | |
| 2006/0001174 A1 | 1/2006 | Matsui | |
| 2006/0003263 A1 | 1/2006 | Chang | |
| 2006/0077741 A1 | 4/2006 | Wang et al. | |
| 2006/0110878 A1 | 5/2006 | Lung et al. | |
| 2006/0175596 A1 | 8/2006 | Happ et al. | |
| 2007/0045605 A1 | 3/2007 | Hsueh | |
| 2007/0045606 A1 | 3/2007 | Magistretti et al. | |
| 2008/0116441 A1 | 5/2008 | Raghuram et al. | |
| 2009/0148980 A1 | 6/2009 | Yu | |
| 2009/0298223 A1 | 12/2009 | Cheek et al. | |
| 2010/0193763 A1 | 8/2010 | Chen et al. | |
| 2010/0270529 A1 | 10/2010 | Lung | |
| 2010/0291747 A1 | 11/2010 | Lung et al. | |
| 2011/0034003 A1 | 2/2011 | Lung | |
| 2011/0121253 A1 | 5/2011 | Lung | |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Claim recitation for U.S. Appl. No. 11/466,421, filed May 26, 2009.*
Claim recitation for U.S. Appl. No. 11/959,708, filed Apr. 17, 2009.*
Adler, David, "Amorphous-Semiconductor Devices," Sci. Amer., vol. 236, pp. 36-48, May 1977.
Adler, D. et al., "Threshold Switching in Chalcogenide-Glass Thin Films," J. Appl/Phys 51(6), Jun. 1980, pp. 3289-3309.
Ahn, S.J. et al., "A Highly Manufacturable High Density Phase Change Memory of 64 Mb and Beyond," IEEE IEDM 2004, pp. 907-910.
Axon Technologies Corporation paper: Technology Description, pp. 1-6.
Bedeschi, F. et al., "4-MB MOSFET—Selected Phase-Change Memory Experimental Chip," IEEE, 2004, 4 pp.
Blake thesis, "Investigation of GeTeSb5 Chalcogenide Films for Use as an Analog Memory," AFIT/GE/ENG/00M-04, Mar. 2000, 121 pages.
Chen, AN et al., "Non-Volatile Resistive Switching for Advanced Memory Applications," IEEE IEDM, Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24µm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era—vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

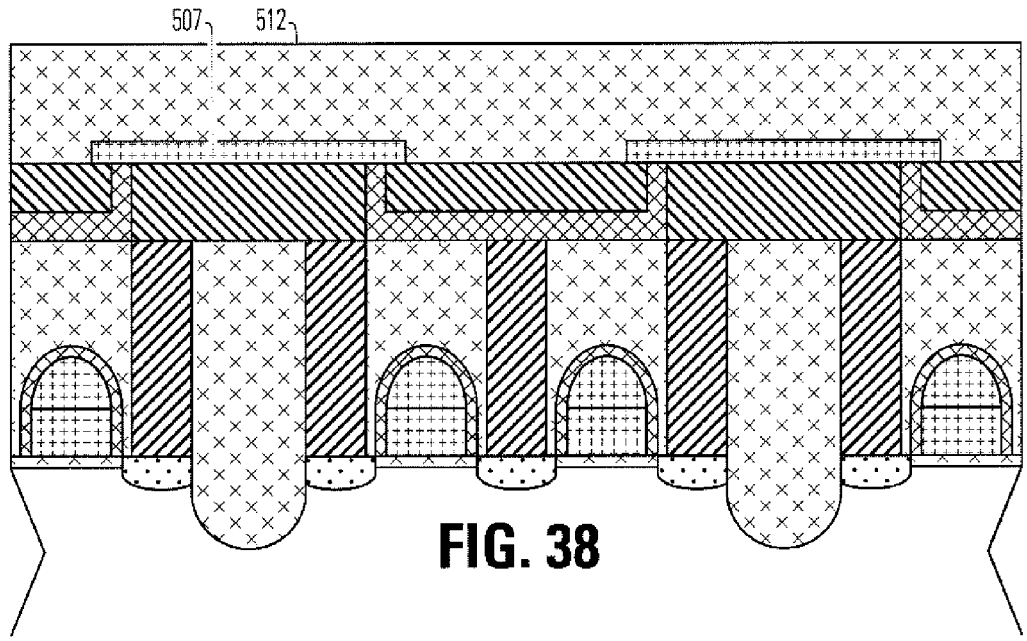
FIG. 38
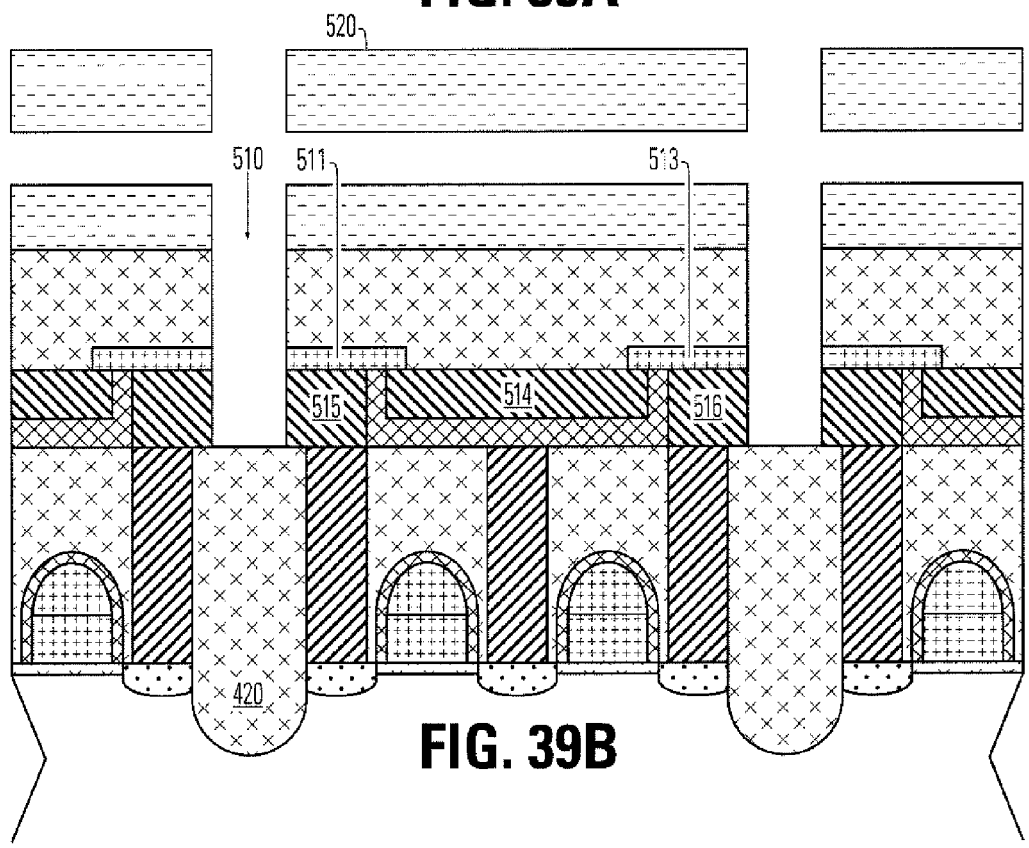
FIG. 39A
FIG. 39B

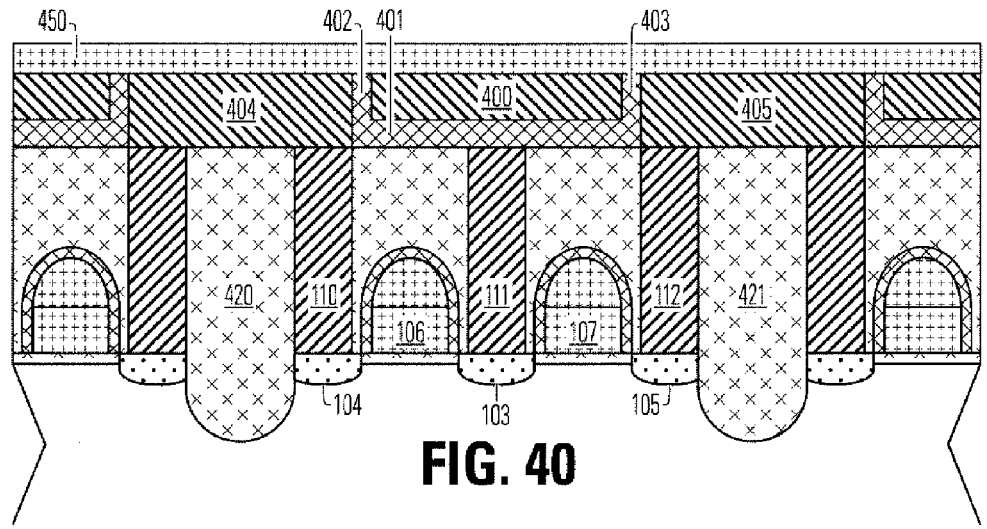
FIG. 40
FIG. 41A
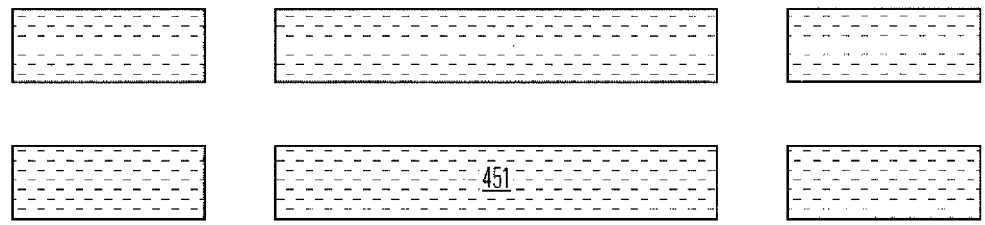
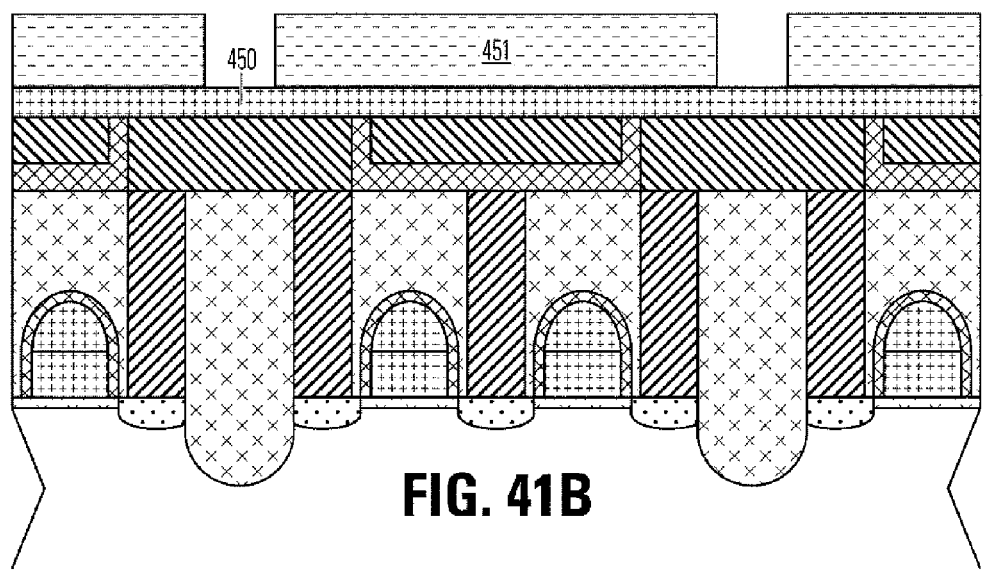
FIG. 41B

FIG. 42A
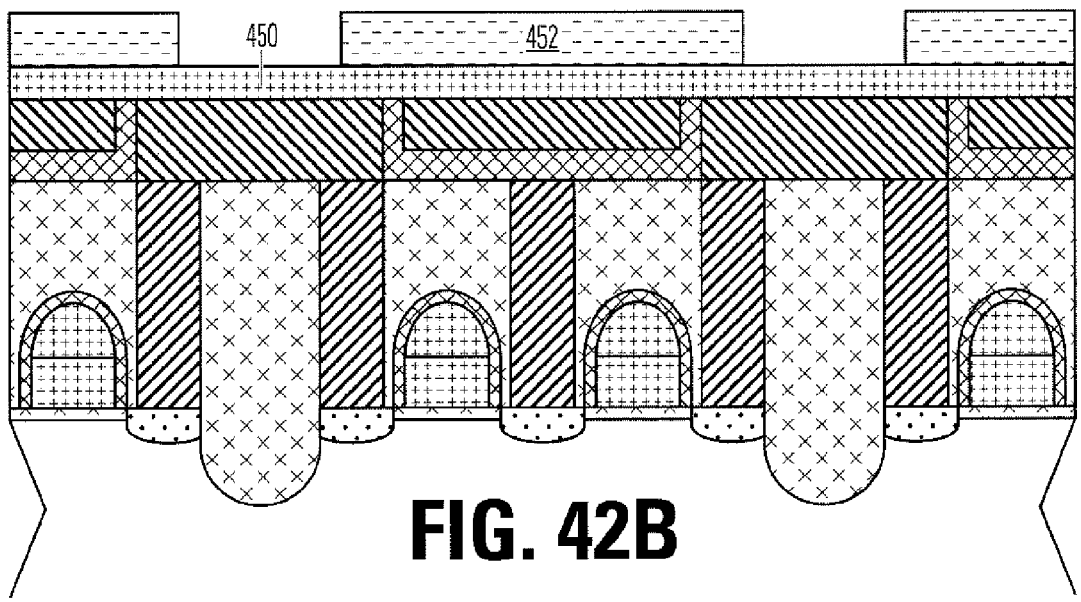
FIG. 42B

SELF-ALIGNED, EMBEDDED PHASE CHANGE RAM

CROSS-REFERENCE TO RELATED APPLICATION

The present application is a continuation-in-part of our co-pending U.S. patent application Ser. No. 11/155,067, filed Jun. 17, 2005, entitled Thin Film Fuse Phase Change RAM and Manufacturing Method.

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meets tight specifications needed for large-scale memory devices. It is desirable therefore to provide a memory cell structure having small dimensions and low reset currents, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

A phase change random access memory PCRAM device is described suitable for use in large-scale integrated circuits. Technology described herein includes a memory device comprising a first electrode having a top side, a second electrode having a top side and an insulating member between the first electrode and the second electrode. The insulating member has a thickness between the first and second electrodes near the top side of the first electrode and the top side of the second electrode. A thin film bridge crosses the insulating member, and defines an inter-electrode path between the first and second electrodes across the insulating member. The inter-electrode path across the insulating member has a path length defined by the width of the insulating member. For the purpose of illustration, the bridge can be thought of as having a structure like a fuse. For the phase change memory however, and unlike a fuse, the bridge comprises memory material having at least two solid phases that are reversible, such as a chalcogenide-based material or other related material, by applying a current through the material or applying a voltage across the first and second electrodes.

The volume of memory material subject of phase change can be very small, determined by the thickness of the insulating member (path length in the x-direction), the thickness of the thin film used to form the bridge (y-direction), and the width of the bridge orthogonal to the path length (z-direction). The thickness of the insulating member and the thickness of the thin film of memory material used to form the bridge are determined in embodiments of the technology by thin film thicknesses which are not limited by the two graphic processes used in manufacturing the memory cell. The width of the bridge is also smaller than a minimum feature size F that is specified for a lithographic process used in patterning the layer of material in embodiments of the present invention. In one embodiment, the width of the bridge is defined using photoresist trimming technologies in which a mask pattern is used to define a lithographical photoresist structure on the chip having the minimum feature size F, and the photoresist structure is trimmed by isotropic etching to achieve a feature size less than F. The trimmed photoresist structure is then used to lithographically transfer the more narrow pattern onto the layer of memory material. Also, other techniques can be used to form narrow lines of material in a layer on an integrated circuit. Accordingly, a phase change memory cell with simple structure achieves very small reset current and low power consumption, and is easily manufactured.

In embodiments of the technology described herein, an array of memory cells is provided. In the array, a plurality of electrode members and insulating members therebetween comprise an electrode layer on an integrated circuit. The electrode layer has a top surface which is substantially planar in some embodiments of the invention. The corresponding plurality of thin film bridges across the insulating members between pairs of electrode members comprise memory elements on the top surface of the electrode layer. A current path from a first electrode in the electrode layer through a thin film bridge on the top surface of the electrode layer to a second electrode in the electrode layer is established for each memory cell in the array.

Circuitry below the electrode layer on integrated circuits described herein can be implemented using well understood technology for logic circuitry and memory array circuitry, such as CMOS technology. In one embodiment, an isolation device such as a transistor has a terminal beneath at least a second electrode in an electrode pair, and a conductor forms a connection between the terminal of the transistor and the second electrode for a memory cell in the array. According to a representative embodiment, the circuitry below the electrode layer includes a plurality of bias lines, such as common source conductors, and a plurality of isolation devices. The isolation devices in the plurality have a first terminal coupled to a bias line in the plurality of bias lines, a second terminal, and a conductor extending between the second terminal and the first electrode in the electrode layer of a corresponding memory cell in the array. In addition, a plurality of word lines is provided in the circuitry beneath the electrode layer. Word lines in the plurality are coupled with isolation devices for memory cells along respective rows in the array, so that control signals on the word lines control connection of memory cells along the respective rows to one of the bias lines in the plurality of bias lines. In one array embodiment described herein, bias lines in the plurality of bias lines are arranged adjacent corresponding pairs of rows in the array, and two rows of isolation devices in the plurality of isolation devices coupled with said corresponding pairs of rows of memory cells are coupled to a shared bias line in the plurality of bias lines.

Embodiments described are adapted for integration as embedded memory arrays on integrated circuits having one, two, three or more layers of metallization, or other patterned conductor layers. In such embodiments, a substrate includes integrated circuit components, including a plurality of conductor layers arranged for interconnecting at least some of said components. The plurality of conductor layers including a first layer and a particular layer above the first layer, which is intermediate between the first or bottom layer and the last or top layer in the plurality of patterned conductor layers. The particular layer includes a first electrode having a top surface, a second electrode having a top surface, an insulating member between the first electrode and the second electrode, whereby the particular conductor layer includes the electrode layer of the memory structure. Also, the insulating member is formed using a self-aligned process, on the sidewall of the first electrode structure. The bridge of memory material is formed over the particular conductor layer, spanning across the insulating member and contacting the first electrode and the second electrode.

Also, in one array embodiment described herein, circuitry above the electrode layer includes a plurality of bit lines. In an embodiment having bit lines above the electrode layer that is described herein, electrode members in the electrode layer which act as a first electrode for a memory cell are shared so that a single electrode member provides a first electrode for two memory cells in a column of the array. Also, in an embodiment that is described herein, bit lines in the plurality of bit lines are arranged along corresponding columns in the array, and two adjacent memory cells in the corresponding columns share a contact structure for contacting said first electrodes.

A method for manufacturing a memory device is also described. The method comprises forming an electrode layer in an intermediate patterned conductor layer on a substrate which comprises circuitry made using front-end-of-line procedures. The electrode layer in this method has a top surface. The electrode layer includes a first electrode and a second electrode, and an insulating member between the first and second electrodes for each phase change memory cell to be formed. The first and second electrodes and the insulating member extend to the top surface of the electrode layer, and the insulating member has a width between the first and second electrodes at the top surface, as described above in connection with the phase change memory cell structures. The method also includes forming a bridge of memory material on the top surface of the electrode layer across the insulating member for each memory cell to be formed. The bridge comprises a film of memory material having a first side and a second side and contacts the first and second electrodes on the first side. The bridge defines an inter-electrode path between the first and second electrodes across the insulating member having a path length defined by the width of the insulating member. In embodiments of the method, an access structure over the electrode layer is made by forming a patterned conductive layer over said bridge, and forming a contact between said first electrode and said patterned conductive layer.

In an embodiment of a manufacturing method, the electrode layer is made by a process comprising a number of steps including the following:

forming a dielectric layer on a substrate;

forming a first conductive layer on the dielectric layer;

etching a pattern in the first conductive layer, the pattern including regions between the stacks exposing the substrate, and stacks on the substrate including remaining portions of the dielectric layer and remaining portions of the first conductive layer, the stacks having sidewalls;

forming a sidewall dielectric layer over the stacks and etching the sidewall dielectric layer to form sidewall spacers on the sidewalls of the stacks;

forming a second conductive layer over the regions between the stacks, the sidewall spacers and the stacks; and polishing the second conductive layer, by chemical mechanical polishing or otherwise, to define the electrode layer, wherein the sidewall spacers are exposed on the top surface and act as the insulating member, portions of the first conductive layer in the stacks are exposed on the top surface and act as the first electrode, and portions of the second conductive layer in the regions between the stacks are exposed on the top surface and act as the second electrode.

In an embodiment of the manufacturing method, the bridges of memory material are made by a process comprising a number of steps including the following:

forming a layer of memory material on the top surface of the electrode layer;

forming a layer of resist material over the layer of memory material;

patterning the layer of resist material using a lithographic process to define a stripe;

trimming the width of the stripe to define a more narrow stripe of resist material over the layer of memory material;

etching the layer of memory material which is not protected by the more narrow stripe of resist material to form a stripe of memory material; and patterning the stripe of memory material to define said bridge.

The method described herein for formation of the bridge, for use in a memory cell in the PCRAM, can be used to make a very small bridge for other uses. Nano-technology devices with very small bridge structures are provided using materials other than phase change to materials, like metals, dielectrics, organic materials, semiconductors, and so on.

BRIEF DESCRIPTION OF THE DRAWINGS

FIGS. 32A-3B illustrate a fifth step in a set of steps for manufacturing a self-aligned memory bridge and electrode structure based on a bridge sidewall mask.

FIG. 38 illustrates a fifth step in a set of steps for manufacturing a bridge of memory material using a damascene procedure.

FIGS. 39A and 39B illustrate a sixth step in a set of steps for manufacturing a bridge of memory material using a damascene procedure.

FIG. 40 illustrates a first step in a set of steps for manufacturing a bridge of memory material using an alternative damascene procedure.

FIGS. 41A-41B illustrate a second step in a set of steps for manufacturing a bridge of memory material using an alternative damascene procedure.

FIGS. 42A-42B illustrate a third step in a set of steps for manufacturing a bridge of memory material using an alternative damascene procedure.

DETAILED DESCRIPTION

Figure 1:
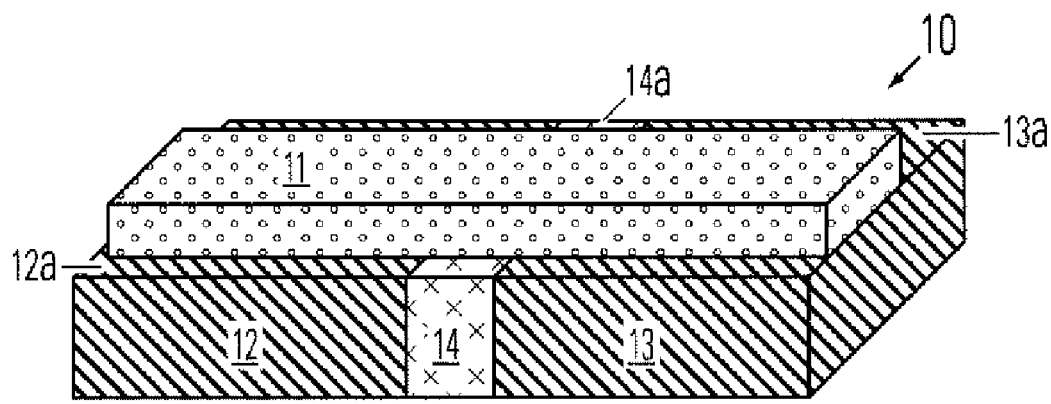
FIG. 1 illustrates an embodiment of a thin film bridge phase change memory element.
Figure 83:
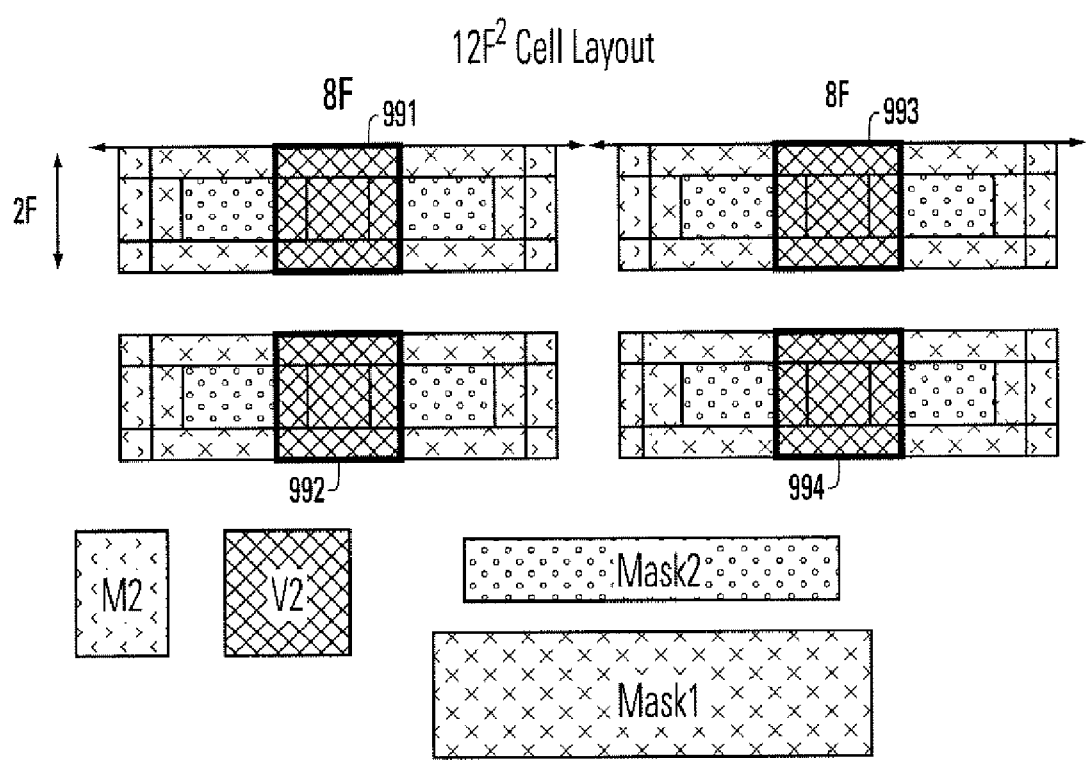
FIG. 83 illustrates a mask layout for defining the vias for contact to electrodes of FIG. 80.

A detailed description of thin film fuse phase change memory cells, arrays of such memory cells, and methods for manufacturing such memory cells, is provided with reference to FIGS. 1-83.

FIG. 1 illustrates a basic structure of a memory cell 10 including a bridge 11 of memory material on an electrode layer which comprises a first electrode 12, a second electrode 13, and an insulating member 14 between the first electrode 12 and the second electrode 13. As illustrated, the first and second electrodes 12, 13 have top surfaces 12a and 13a. Likewise the insulating member 14 has a top surface 14a. The top surfaces 12a, 13a, 14a of the structures in the electrode layer define a substantially planar top surface for the electrode layer in the illustrated embodiment. The bridge 11 of memory material lies on the planar top surface of the electrode layer, so that contacts between the first electrode and the bridge 11 and between the second electrode 13 and the bridge 11 are made on the bottom side of the bridge 11.

Figure 2:
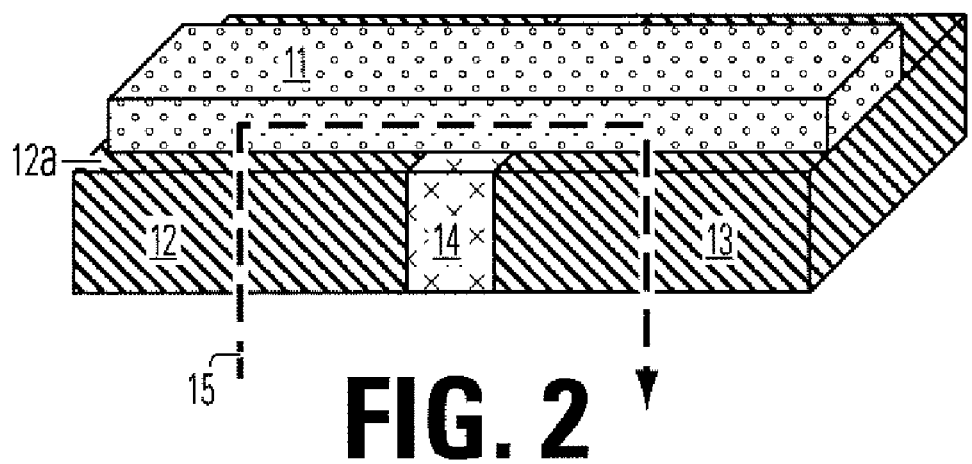
FIG. 2 illustrates a current path in a thin film bridge phase change memory element as shown in FIG. 1.

FIG. 2 shows a current path 15 between the first electrode 12, the bridge 11, and the second electrode 13 formed by the memory cell structure. Access circuitry can be implemented to contact the first electrode 12 and the second electrode 13 in a variety of configurations for controlling the operation of the memory cell, so that it can be programmed to set the bridge 11 in one of the two solid phases that can be reversibly implemented using the memory material. For example, using a chalcogenide-based phase change memory material, the memory cell may be set to a relatively high resistivity state in which at least a portion of the bridge in the current path is an amorphous state, and a relatively low resistivity state in which most of the bridge in the current path is in a crystalline state.

Figure 3:
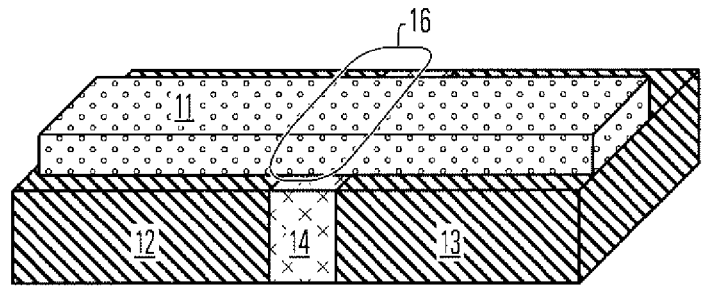
FIG. 3 illustrates an active region for phase changes in a thin film bridge phase change memory element as shown in FIG. 1.

FIG. 3 shows the active channel 16 in the bridge 11, where the active channel 16 is the region in which the material is induced to change between the at least two solid phases. As can be appreciated, the active channel 16 can be made extremely small in the illustrated structure, reducing the magnitude of current needed to induce the phase changes.

Figure 4:
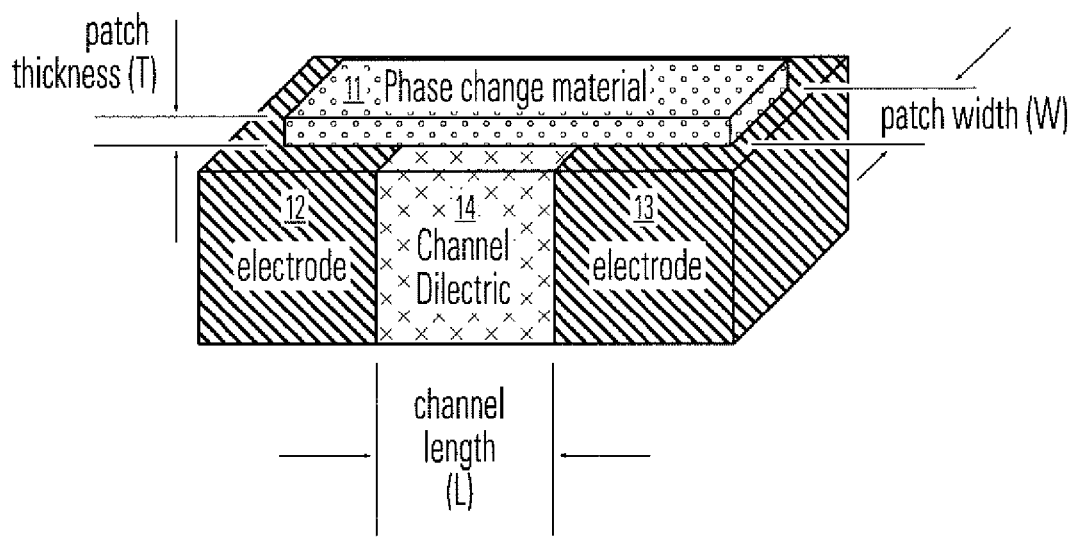
FIG. 4 illustrates dimensions for a thin film bridge phase change memory element as shown in FIG. 1.

FIG. 4 illustrates important dimensions of the memory cell 10. The length L (x-dimension) of the active channel is defined by the thickness of the insulating member 14 (called channel dielectric in the figure), between the first electrode 12 and the second electrode 13. This length L can be controlled by controlling the width of the insulating member 14 in embodiments of the memory cell. In representative embodiments, the width of the insulating member 14 can be established using a thin film deposition technique to form a thin sidewall dielectric on the side of an electrode stack. Thus, embodiments of the memory cell have a channel length L less than 100 nm. Other embodiments have a channel length L of about 40 nm or less. In yet other embodiments, the channel length is less than 20 nm. It will be understood that the channel length L can be even smaller than 20 nm, using thin-film deposition techniques such as atomic layer deposition and the like, according to the needs of the particular application.

Likewise, the bridge thickness T (y-dimension) can be very small in embodiments of the memory cell. This bridge thickness T can be established using a thin film deposition technique on the top surfaces of the first electrode 12, insulating member 14, and second electrode 13. Thus, embodiments of the memory cell have a bridge thickness T about 50 nm or less. Other embodiments of the memory cell have a bridge thickness of about 20 nm or less. In yet other embodiments, the bridge thickness T is about 10 nm or less. It will be understood that the bridge thickness T can be even smaller than 10 nm, using thin film deposition techniques such as atomic layer deposition and the like, according to the needs of the particular application, so long as the thickness is sufficient for the bridge performs its purpose as memory element, having at least two solid phases, reversible by a current or by a voltage applied across the first and second electrodes.

As illustrated in FIG. 4, the bridge width W (z-dimension) is likewise very small. This bridge width W is implemented in preferred embodiments, so that it has a width less than 100 nm. In some embodiments, the bridge width W is about 40 nm or less.

Embodiments of the memory cell include phase change based memory materials, including chalcogenide based materials and other materials, for the bridge 11. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", *SPIE* v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x:y=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr ~100 mtorr. The deposition temperature can range from room temperature to ~600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO (YBaCuO$_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr ~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr ~100 mtorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $ArN_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer is held (typically at room temperature or temperature less than 200° C.) for a time sufficient for solid-state formation. The hold time ranges from several minutes to days, depending on the temperature and on the formation conditions.

Figure 5:
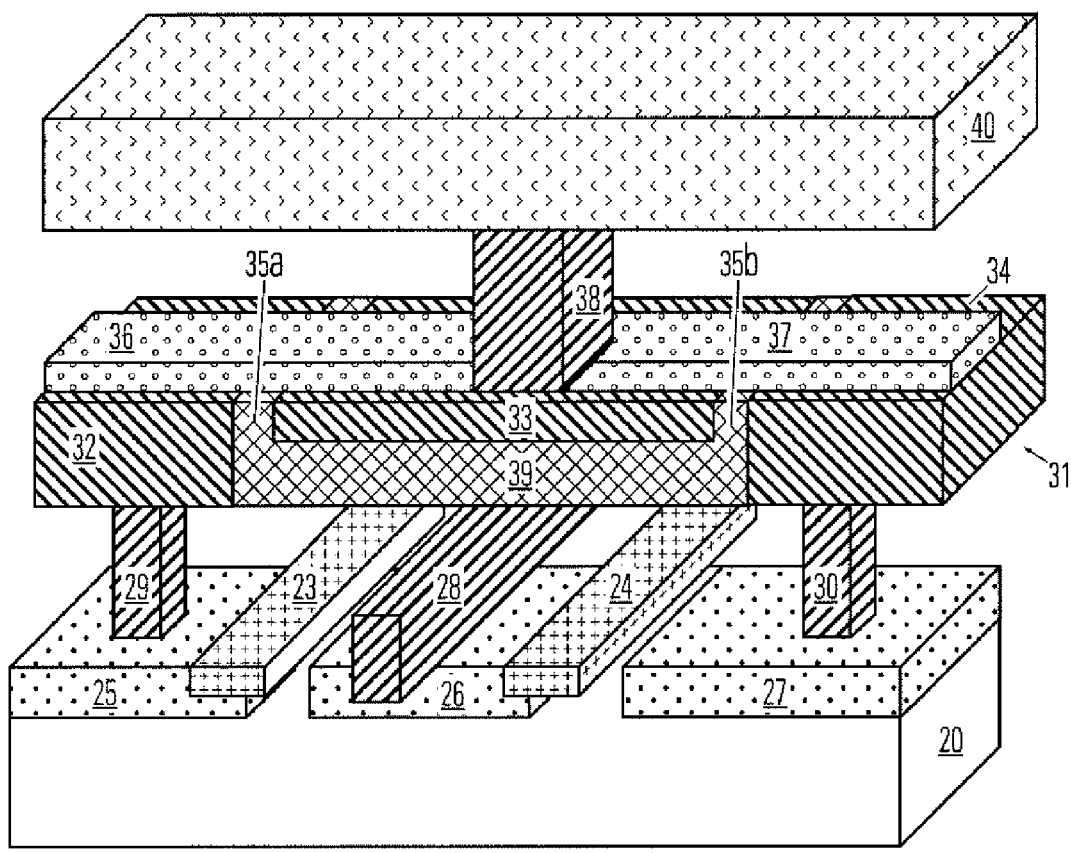
FIG. 5 illustrates a structure for a pair of phase change memory elements with access circuitry below an electrode layer and bit lines above the electrode layer.

FIG. 5 depicts a structure for PCRAM cells. The cells are formed on a semiconductor substrate 20. Isolation structures such as shallow trench isolation STI dielectrics (not shown) isolate pairs of rows of memory cell access transistors. The access transistors are formed by n-type terminal 26 acting as a common source region and n-type terminals 25 and 27 acting as drain regions in a p-type substrate 20. Polysilicon word lines 23 and 24 form the gates of the access transistors. A dielectric fill layer (not illustrated) is formed over the polysilicon word lines. The layer is patterned and conductive structures, including common source line 28 and plug structures 29 and 30 are formed. The conductive material can be tungsten or other materials and combinations suitable for the plug and lines structures. The common source line 28 contacts the source region 26, and acts as a common source line along a row in the array. The plug structures 29 and 30 contact the drain terminals 25 and 26, respectively. The fill layer (not shown), the common source line 28 and the plug structures 29 and 30, have a generally planar top surface, suitable for formation of an electrode layer 31.

The electrode layer 31 includes electrode members 32, 33 and 34, which are separated from one another by an insulating member including fences 35a and 35b formed for example by a sidewall process as described below, and base member 39. The base member 39 can be thicker than the fences 35a, 35b in embodiments of the structure, and separates the electrode member 33 from the common source line 28. For example the base member can be for instance, 80 to 140 nm thick while the fences are much narrower, as needed to reduce capacitive coupling between the source line 28 and the electrode member 33. The fences 35a, 35b comprise a thin film dielectric material on the sidewalls of electrode members 32, 34 in the illustrated embodiment, with a thickness at the surface of the electrode layer 31 determined by the thin film thickness on the sidewalls. In some embodiments the thickness of the fence members is about 50 nm or less.

A thin film bridge 36 of memory material, such as GST, overlies the electrode layer 31 on one side traversing across the fence member 35a, forming a first memory cell, and a thin film bridge 37 of memory material, such as GST, overlies the electrode layer 31 on another side traversing across the fence member 35b, forming a second memory cell.

A dielectric fill layer (not illustrated) overlies the thin film bridges 36, 37. The dielectric fill layer comprises silicon dioxide, a polyimide, silicon nitride or other dielectric fill materials. In embodiments, the fill layer comprises a relatively good insulator for heat as well as for electricity, providing thermal and electrical isolation for the bridges. Tungsten plug 38 contacts the electrode member 33. A patterned conductive layer 40, comprising metal or other conductive material, including bit lines in an array structure, overlies the dielectric fill layer, and contacts the plug 38 to establish access to the memory cells corresponding to the thin film bridge 36 and the thin film bridge 37.

Figure 6:
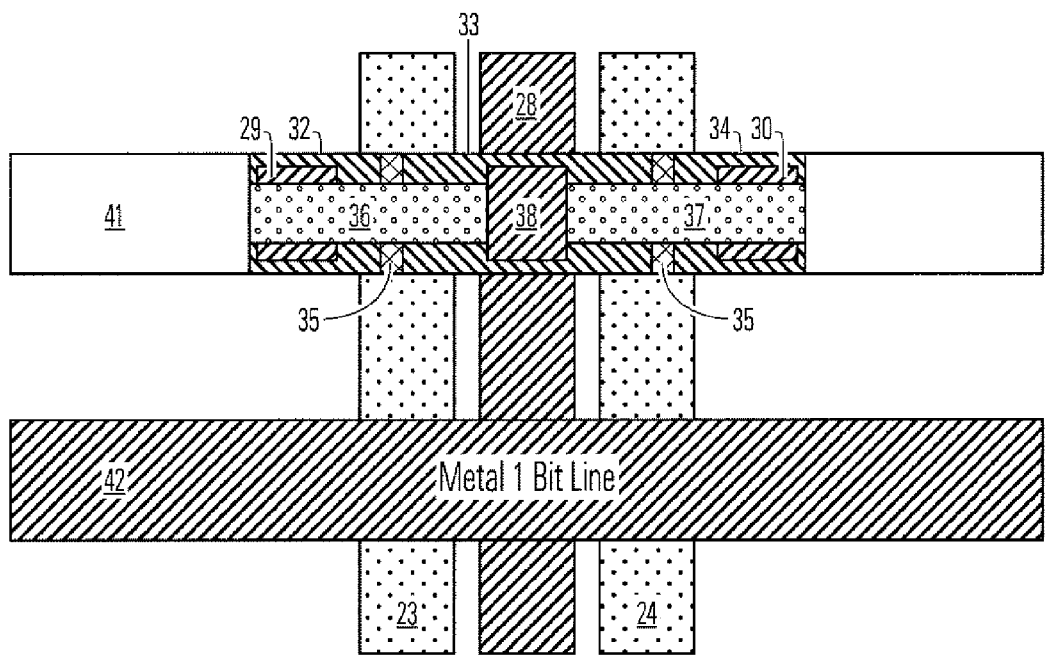
FIG. 6 shows a layout or plan view for the structure illustrated in FIG. 5.

FIG. 6 shows the structure above the semiconductor substrate layer 20 of FIG. 5 in layout view. Thus, the word lines 23 and 24 are laid out substantially parallel to the common source line 28, along those in an array of memory cells. Plugs 29 and 30 contact terminals of access transistors in the semiconductor substrate and the underside of electrode members 32 and 34 respectively. Thin film bridges 36 and 37 of memory material overlie the electrode members 32, 33 and 34, and the insulating fences 35a, 35b separating the electrode members. Plug 38 contacts the electrode member 33 between the bridges 36 and 37 and the underside of a metal bit line 41 (transparent in FIG. 6) in the patterned conductive layer 40. Metal bit line 42 (not transparent) is also illustrated in FIG. 6 to emphasize the array layout of the structure.

In operation, access to the memory cell corresponding with bridge 36 is accomplished by applying a control signal to the word line 23, which couples the common source line 28 via terminal 25, plug 29, and electrode member 32 to the thin-film bridge 36. Electrode member 33 is coupled via the contact plug 38 to a bit line in the patterned conductive layer 40. Likewise, access to the memory cell corresponding with bridge 37 is accomplished by applying a control signal to the word line 24.

It will be understood that a wide variety of materials can be utilized in implementation of the structure illustrated in FIGS. 5 and 6. For example, copper metallization can be used. Other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the electrodes may be TiAlN or TaAlN, or may comprise, for further examples, one or more elements selected from the group consisting of Ti, W, Mo, Al, Ta, Cu, Pt, Ir, La, Ni, and Ru and alloys thereof. The inter-electrode fence members 35a, 35b may be silicon oxide, silicon oxynitride, silicon nitride, $Al_2O_3$, or other low K dielectrics. Alternatively, the inter-electrode insulating layer may comprise one or more elements selected from the group consisting of Si, Ti, Al, Ta, N, O, and C.

Figure 7:
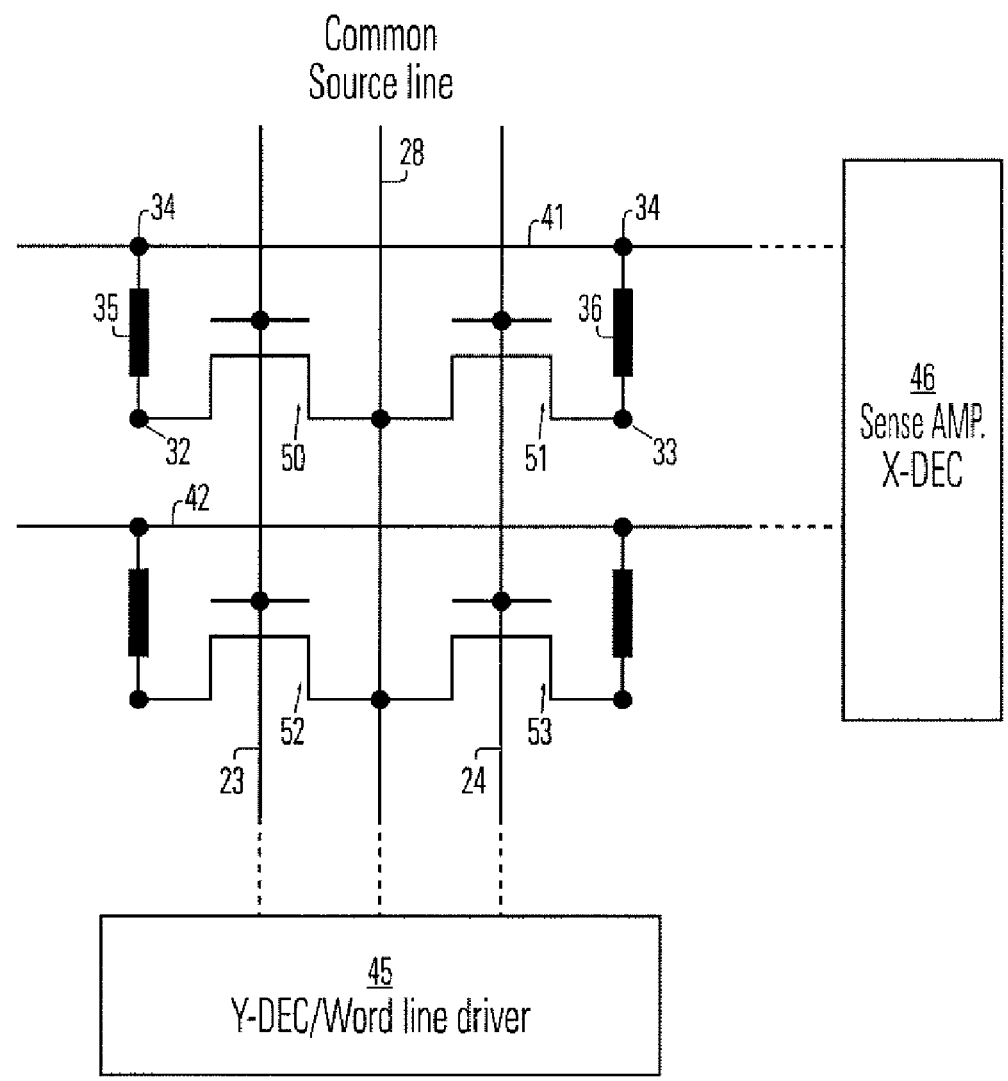
FIG. 7 is a schematic diagram for a memory array comprising phase change memory elements.

FIG. 7 is a schematic illustration of a memory array, which can be implemented as described with reference to FIGS. 5 and 6. Thus, reference numerals for elements of FIG. 7 match corresponding elements in the structure of FIGS. 5 and 6. It will be understood that the array structure illustrated in FIG.

7 can be implemented using other cell structures. In a schematic illustration of FIG. 7, the common source line 28, the word line 23 and the word line 24 are arranged generally parallel in the Y-direction. Bit lines 41 and 42 are arranged generally parallel in the X-direction. Thus, a Y-decoder and a word line driver in block 45 are coupled to the word lines 23, 24. An X-decoder and set of sense amplifiers in block 46 are coupled to the bit lines 41 and 42. The common source line 28 is coupled to the source terminals of access transistors 50, 51, 52 and 53. The gate of access transistor 50 is coupled to the word line 23. The gate of access transistor 51 is coupled to the word line 24. The gate of access transistor 52 is coupled to the word line 23. The gate of access transistor 53 is coupled to the word line 24. The drain of access transistor 50 is coupled to the electrode member 32 for bridge 36, which is in turn coupled to electrode member 34. Likewise, the drain of access transistor 51 is coupled to the electrode member 33 for bridge 36, which is in turn coupled to the electrode member 34. The electrode member 34 is coupled to the bit line 41. For schematic purposes, the electrode member 34 is illustrated at separate locations on the bit line 41. It will be appreciated that separate electrode members can be utilized for the separate memory cell bridges in other embodiments. Access transistors 52 and 53 are coupled to corresponding memory cells as well on line 42. It can be seen that the common source line 28 is shared by two rows of memory cells, where a row is arranged in the Y-direction in the illustrated schematic. Likewise, the electrode member 34 is shared by two memory cells in a column in the array, where a column is arranged in the X-direction in the illustrated schematic.

Figure 8:
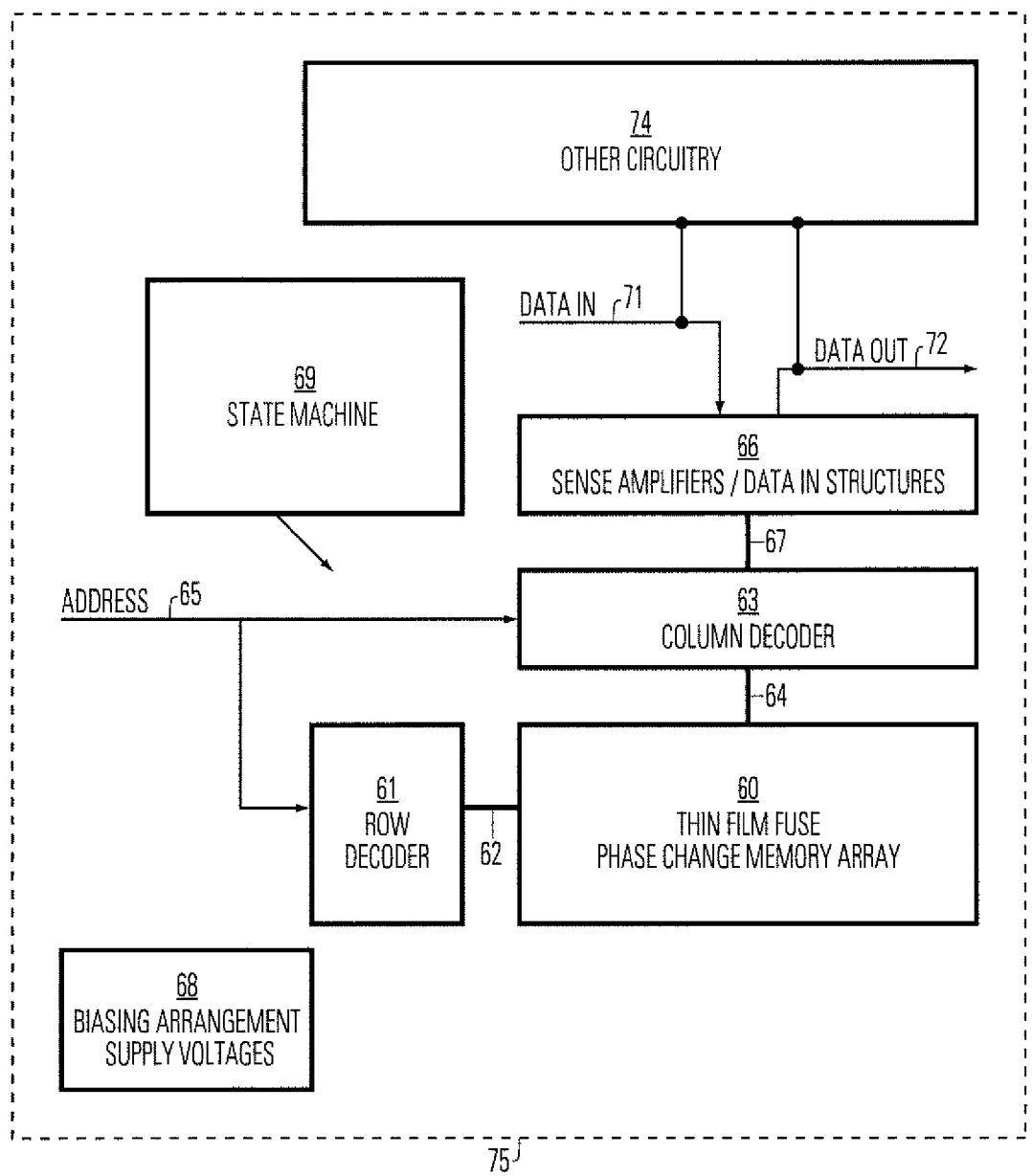
FIG. 8 is a block diagram of an integrated circuit device including a thin film fuse phase change memory array and other circuitry.

FIG. 8 is a simplified block diagram of an integrated circuit according to an embodiment of the present invention. The integrated circuit 75 includes a memory array 60 implemented using thin film fuse phase change memory cells, on a semiconductor substrate. A row decoder 61 is coupled to a plurality of word lines 62, and arranged along rows in the memory array 60. A column decoder 63 is coupled to a plurality of bit lines 64 arranged along columns in the memory array 60 for reading and programming data from the thin film fuse phase change memory cells in the array 60. Addresses are supplied on bus 65 to column decoder 63 and row decoder 61. Sense amplifiers and data-in structures in block 66 are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry 74 is included on the integrated circuit, such as a general purpose processor or special purpose application circuitry, or a combination of modules providing system-on-a-chip functionality supported by the thin film fuse phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 9:
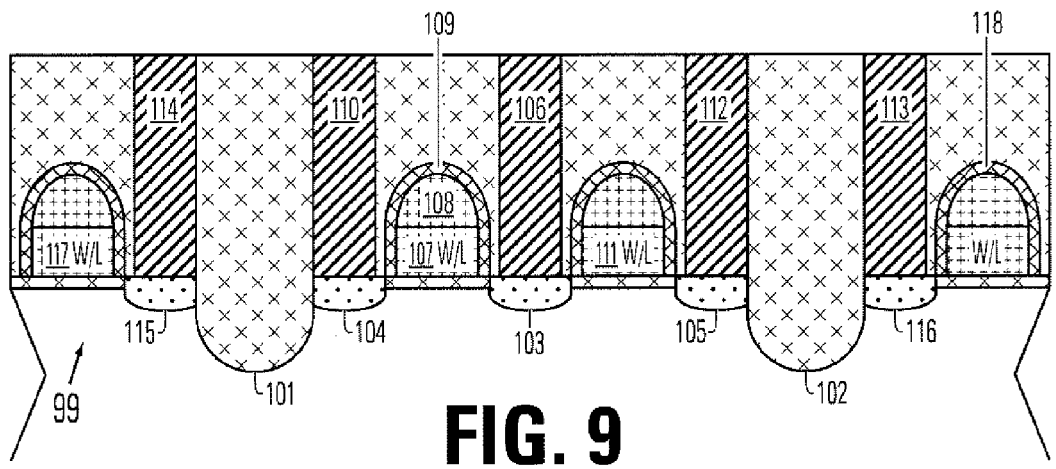
FIG. 9 is a cross-section of a substrate that includes access circuitry formed by front-end-of-line processes, made in a process for manufacturing a phase change memory device based on the structure shown in FIG. 5.

FIG. 9 illustrates a structure 99 after front-end-of-line processing, forming the standard CMOS components in the illustrated embodiment corresponding to the word lines, the source line, and the access transistors in the array shown in FIG. 7. In FIG. 9, source line 106 overlies doped region 103 in the semiconductor substrate, where the doped region 103 corresponds with the source terminal of a first access transistor on the left in the figure, and of a second access transistor on the right in the figure. In this embodiment, the source line 106 extends to the top surface of the structure 99. In other embodiments the source line does not extend all the way to the surface. Doped region 104 corresponds with the drain terminal of the first access transistor. A word line including polysilicon 107, and silicide cap 108, acts as the gate of the first access transistor. Dielectric layer 109 overlies the polysilicon 107 and silicide cap 108. Plug 110 contacts doped region 104, and provides a conductive path to the surface of the structure 99 for contact to a memory cell electrode as described below. The drain terminal of the second access transistor is provided by doped region 105. A word line including polysilicon line 111, and the silicide cap (not labeled) acts as the gate for the second access transistor. Plug 112 contacts doped region 105 and provides a conductive path to the top surface of the structure 99 for contact to a memory cell electrode as described below. Isolation trenches 101 and 102 separate the two-transistor structure coupled to the plugs 110 and 112, from adjacent two-transistor structures. On the left doped region 115, word line polysilicon 117 and plug 114 are shown. On the right doped region 116, word line polysilicon 118 and plug 113 are shown. The structure 99 illustrated in FIG. 9 provides a substrate for formation of memory cell components, including the first and second electrodes, and the bridge of memory material, as described in more detail below.

Figure 10:
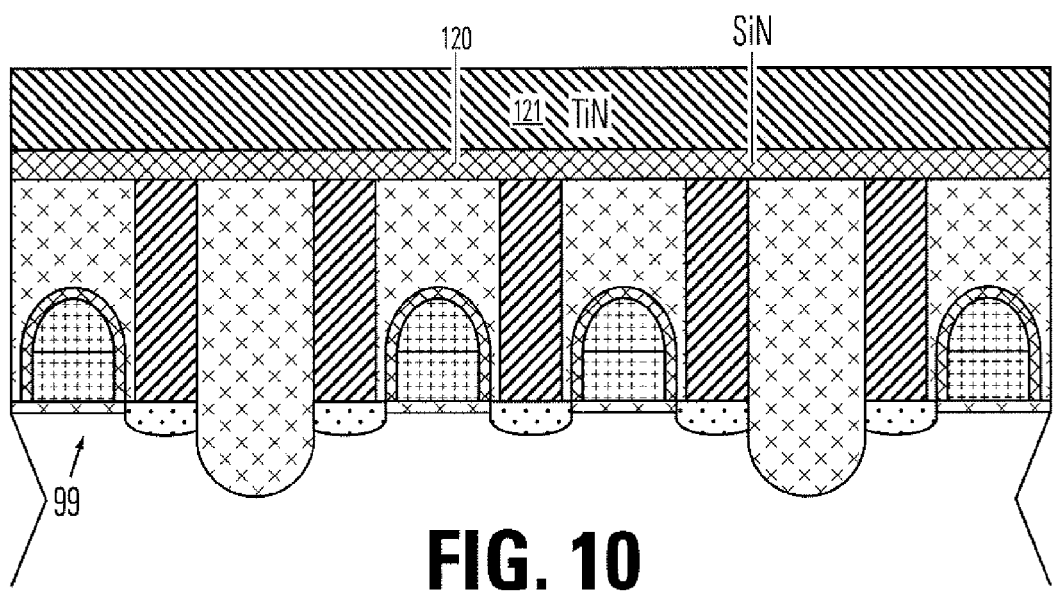
FIG. 10 is a cross-section showing initial steps in formation of an electrode layer for the structure shown in FIG. 5.

FIG. 10 illustrates a next stage in the process, in which a thin dielectric layer 120 comprising silicon nitride SiN or other material, is formed on the surface of the structure 99. Then a layer 121 of conductive electrode material such as titanium nitride TiN is formed on the dielectric layer 120.

Figure 11A:
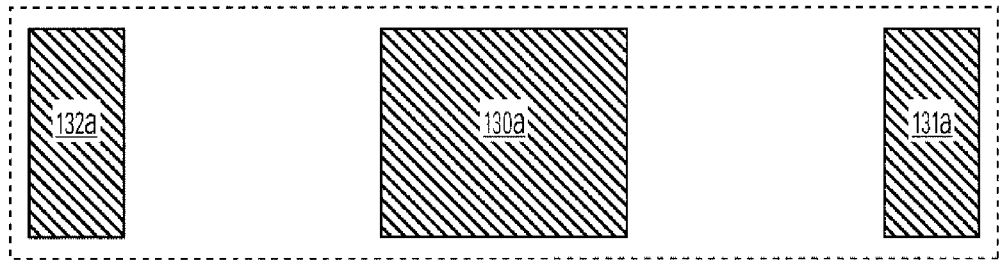
FIGS. 11A and 11B show layout and cross-sectional views for patterning the structure of FIG. 105 forming electrode stacks in the electrode layer for the structure shown in FIG. 5.
Figure 11B:
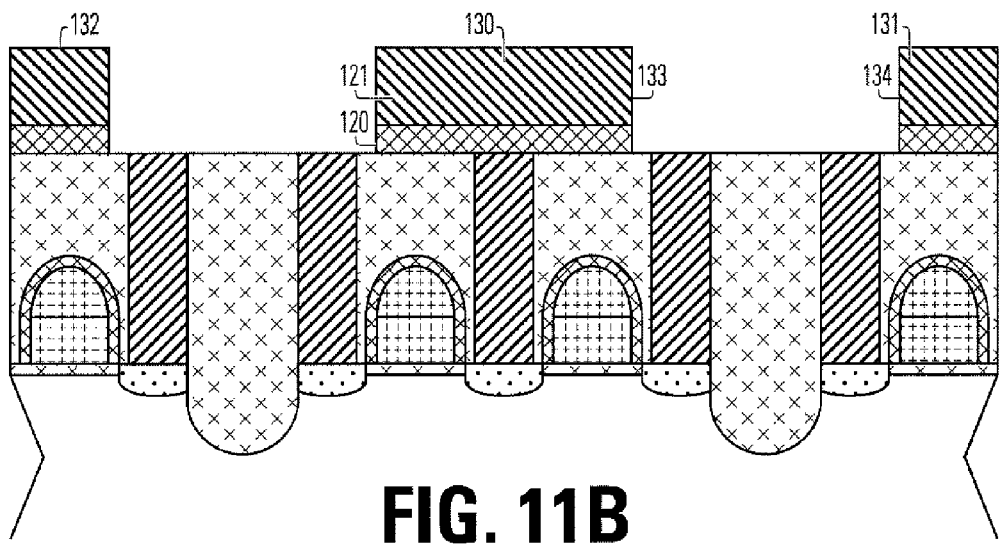

FIGS. 11A and 11B illustrate a next stage in the process, in which the conductive electrode layer 121 and the dielectric layer 120 are patterned to define electrode stacks 130, 131 and 132 on the surface of the structure 99 (130a, 131a, 132a in FIG. 11A). In an embodiment, the electrode stacks are defined by a mask lithographic step that produces a patterned layer of photoresist, followed by dimension measurement and verification steps known in the art, and then etching of the TiN and SiN used for formation of the layers 121 and 120. The stacks have sidewalls 133 and 134.

Figure 12:
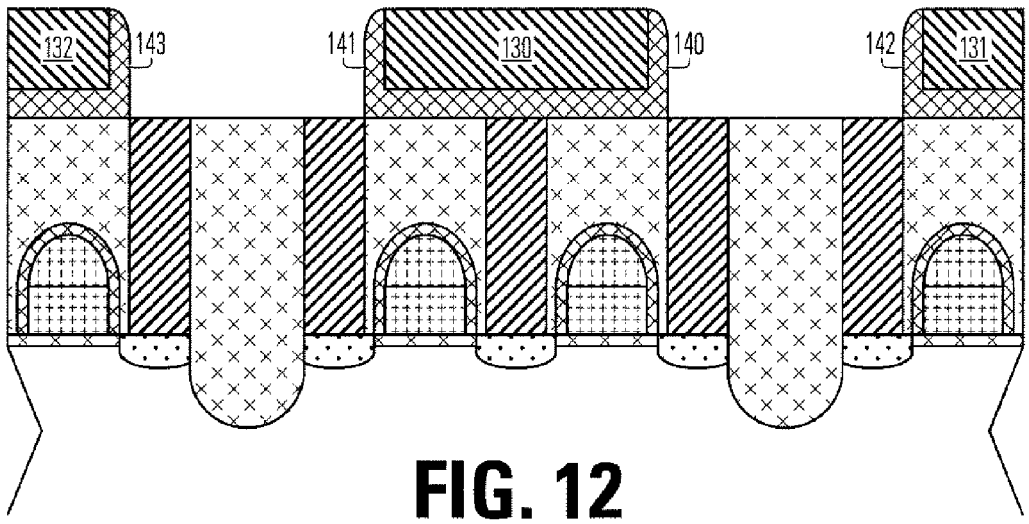
FIG. 12 shows a cross-sectional view corresponding to steps for formation of sidewall insulators on the electrode stacks of FIG. 11B.

FIG. 12 illustrates a next stage in the process, in which dielectric sidewalls 140, 141, 142 and 143 are formed on the sidewalls of the stacks 130, 131, 132, by forming a thin film dielectric layer (not shown) that is conformal with the stacks and the sidewalls of the stacks, and then anisotropically etching the thin film dielectric to remove it from the regions between the stacks and on the surfaces of the stacks, while remaining on the sidewalls. In embodiments of the process, the material used for formation of the sidewalls 140, 141, 142 and 143 comprises SiN or other dielectric material, such as silicon dioxide, silicon oxynitride, aluminum oxide, and the like.

Figure 13:
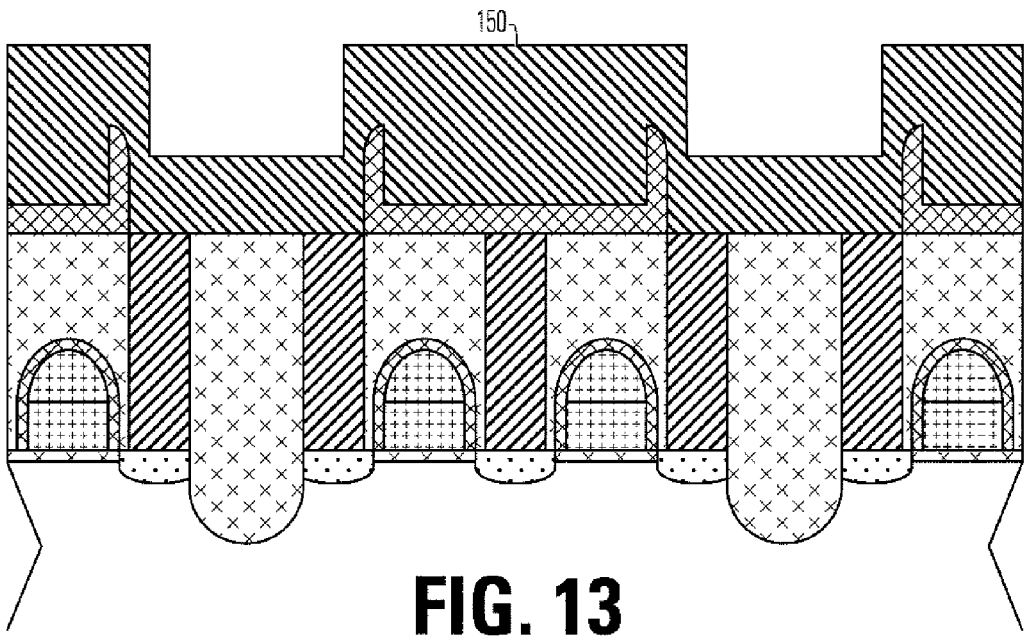
FIG. 13 shows a cross-sectional view corresponding to steps for formation of a layer of conductor material over the structure of FIG. 12.

FIG. 13 illustrates a next stage in the process, in which a second electrode material layer 150 is formed over the stacks 130, 131 132 and the sidewalls 140, 141, 142, 143. The electrode material layer 150 comprises TiN or other suitable conductive material, such as TaN, aluminum alloys, copper alloys, doped polysilicon, etc.

Figure 14:
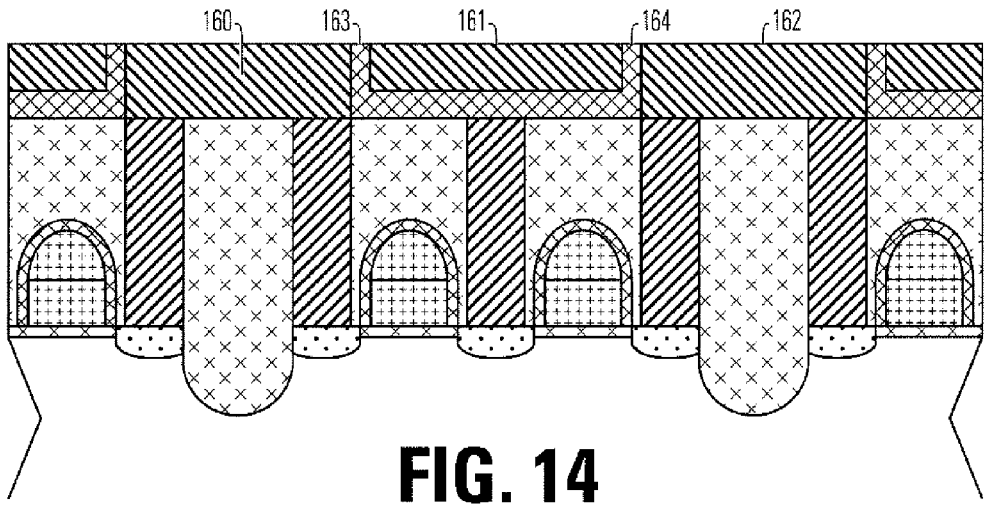
FIG. 14 shows a cross-sectional view corresponding to steps for polishing the conductive material and sidewall insulators in the structure of FIG. 13.

FIG. 14 illustrates a next stage in the process, in which the second electrode material layer 150, the sidewalls 140, 141, 142, 143 and the stacks 130, 131, 132 are etched and planarized to define an electrode layer over the substrate provided by structure 99. Embodiments of the process for polishing include a chemical mechanical polishing process, followed by brush clean and liquid and or gas clean procedures, as known in the art. The electrode layer includes electrode members 160, 161, 162, and insulating members 163 and 164 in between them. The electrode layer in the illustrated embodiment has a substantially planar top surface. In the embodiment shown, the insulating members 163 and 164 comprise portions of a structure which also extends beneath electrode member 161, isolating it from the source line. Other example structures may use different materials for the electrode members and insulating members.

Figure 15:
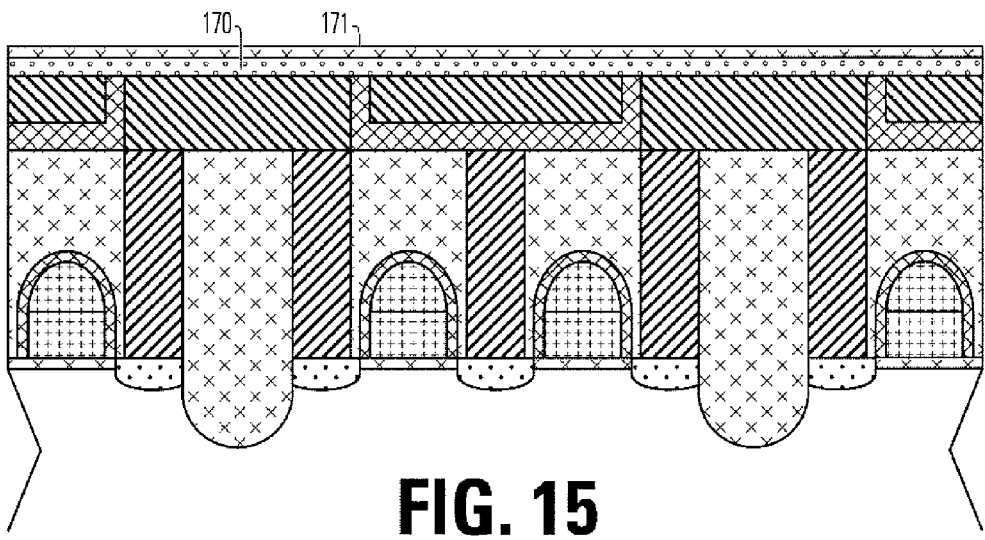
FIG. 15 shows a cross-sectional view corresponding to steps for forming a thin film layer of phase change material and a protective cap layer on the structure of FIG. 14.

FIG. 15 illustrates a next stage in the process, in which a thin film layer 170 of a phase change based memory material is formed on the substantially planar top surface of the electrode layer. The memory material is deposited using sputtering without collimation at about 250 degrees C. This results in a thin film having a thickness of about 60 nanometers or less, when using $Ge_2Sb_2Te_5$ as the phase change memory material. Embodiments involve sputtering the entire wafer to thickness of about 40 nanometers on the flat surfaces. The thin film layer 170 has a thickness less than 100 nm in some embodiments, and more preferably 40 nm or less. In embodiments of the memory device, the thin film layer 170 has a thickness of less than 20 nm, such as 10 nm. After forming the thin film layer 170, a protective cap layer 171 is formed. The protective cap layer 171 comprises a low-temperature deposited silicon dioxide or other dielectric material formed over the thin film layer 170. The protective cap layer 171 is preferably a good electrical insulator and a good thermal insulator, and protects the memory material from exposure in subsequent steps, such as photoresist stripping steps which can damage the material. The process involves formation of a low-temperature liner dielectric, such as a silicon nitride layer or silicon oxide layer, using a process temperature less than about 200 degrees C. One suitable process is to apply silicon dioxide using PECVD. After formation of the protective cap layer 171, a dielectric fill over the memory material can be implemented using a higher temperature process such as high-density plasma HDP CVD.

Figure 16A:
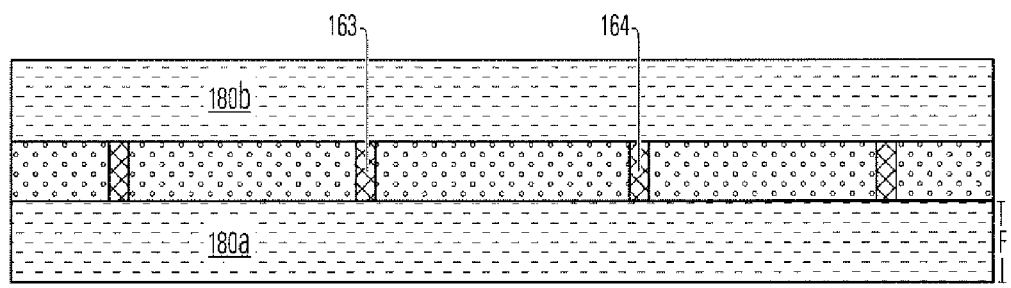
FIGS. 16A and 16B show layout and cross-sectional views for patterning the thin film layer of phase change material of FIG. 15, forming strips of photoresist on the phase change material.
Figure 16B:
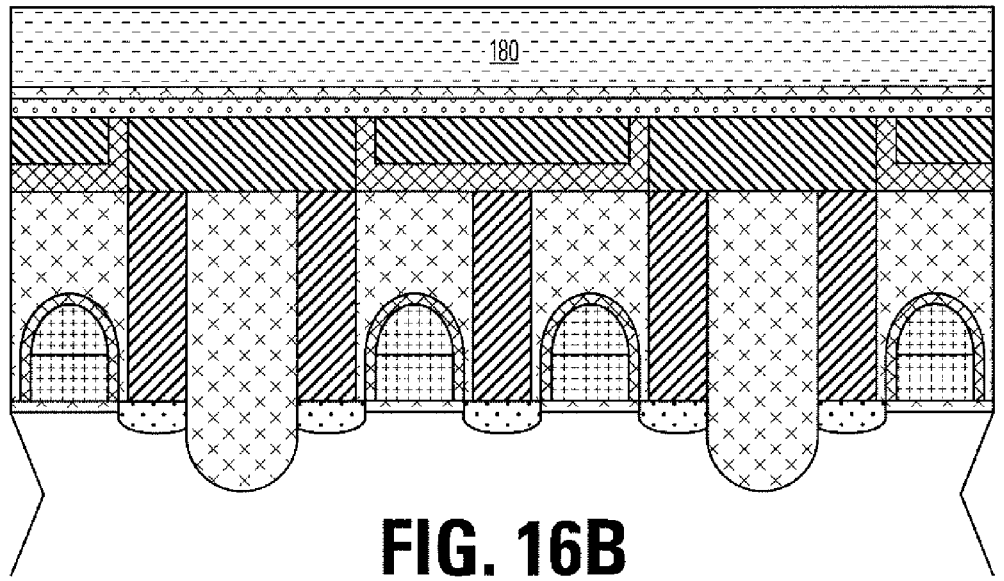

FIGS. 16A and 16B illustrate a next stage in the process, in which a photoresist layer 180 is formed and patterned in a mask lithographic process to define strips 180a, 180b over the thin film layer 170 and protective cap layer 171. As seen in FIG. 16A, the insulating members 163 and 164 are exposed between the strips 180a, 180b of photoresist. The strips of photoresist are made as narrow as possible according to the lithographic process applied. For example, the strips have a width equal to the minimum feature size F for the lithographic process used, where the minimum feature size for a process may be on the order of 0.2 microns (200 nm), 0.14 microns, or 0.09 microns in current mask lithographic processes. Obviously, embodiments of the process can be adapted to narrower minimum feature sizes as lithographic processes advance.

Figure 17A:
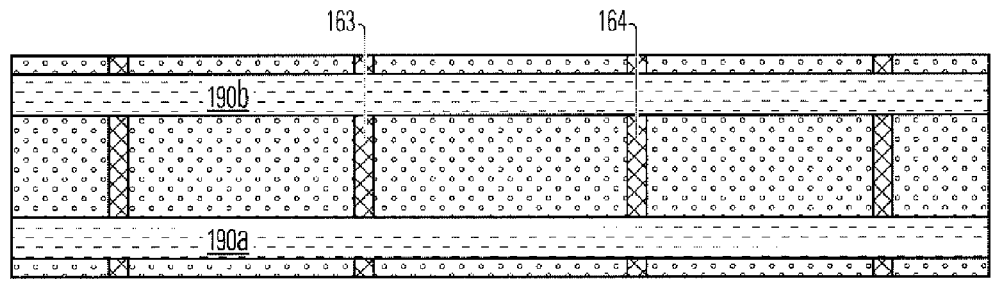
FIGS. 17A and 17B show layout and cross-sectional views for patterning the thin film layer of phase change material of FIG. 15, after etching the strips of photoresist of FIGS. 16A and 16B to form narrow strips of photoresist.
Figure 17B:
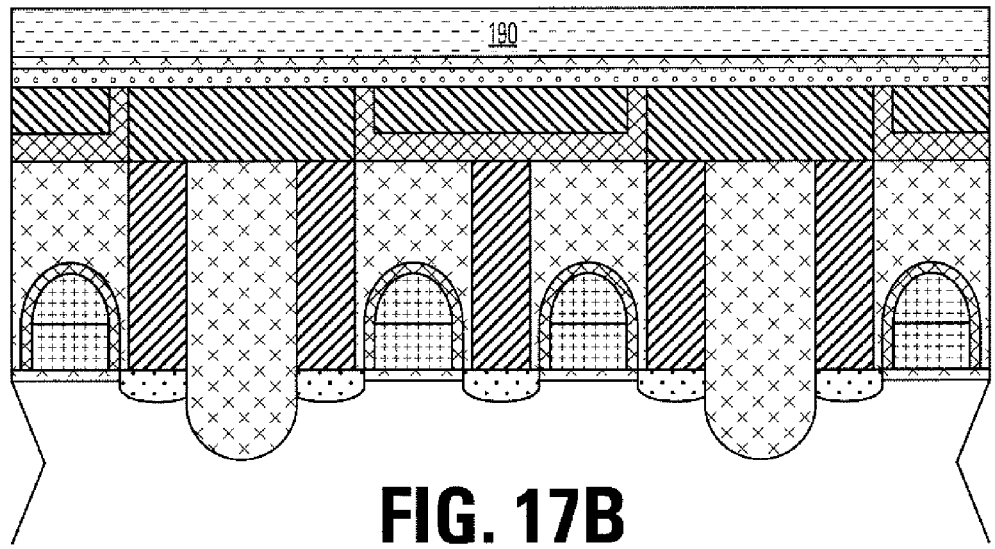

FIGS. 17A and 17B illustrate a next stage in the process, in which the photoresist strips 180a, 180b of FIG. 16A are trimmed to form more narrow photoresist strips 190a, 190b. As shown in FIG. 17B, the trimmed photoresist 190 is also thinner than the photoresist layer 180 of FIG. 16B. In one embodiment, the photoresist strips are trimmed by isotropic etching using a reactive ion etch process or otherwise. The etching trims the photoresist strips to more narrow line widths. Embodiments of the more narrow photoresist strips 190a, 190b are less than 100 nm wide. In other embodiments the more narrow photoresist strips 190a, 190b are about 40 nm or less wide. Photoresist trimming is applied using an oxide plasma to isotropically etch the photoresist, which trims its width and thickness down to a width of for example about 40 nanometers in a 0.09 micron (90 nanometer) minimum feature size lithographic process environment. In an alternative, a hard mask layer, such as a low temperature deposited layer of SiN or $SiO_2$ can be put on the bottom of the photoresist pattern to prevent etching damage of the memory material during the photoresist stripping process.

Figure 18A:
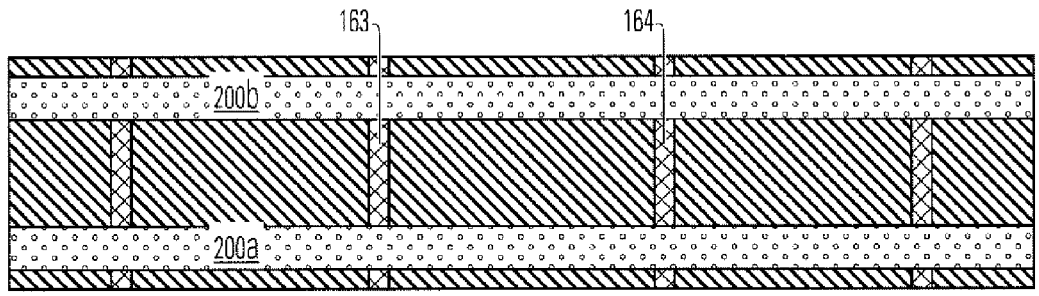
FIGS. 18A and 18B show layout and cross-sectional views of the strips of phase change material after etching the thin film layer of phase change material according to the pattern of photoresist shown in FIGS. 17A and 17B.
Figure 18B:
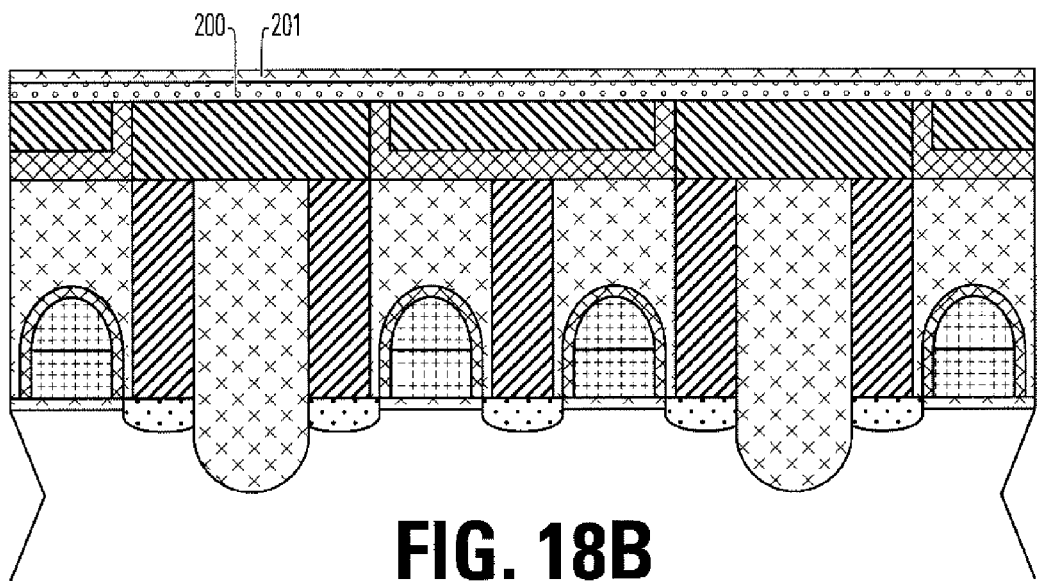

FIGS. 18A and 18B illustrate a next stage in the process, in which the more narrow photoresist strips 190a, 190b are used for an etch mask, and the thin film layer 200 of memory material is etched to lithographically define strips 200a, 200b of memory material, with or without the protective cap layer 201. As shown, the strips 200a, 200b span across the insulating members 163, 164, and the electrode members in the electrode layer. In embodiments of the process the memory material comprises a GST chalcogenide based material, and is etched using for example, a chlorine-based or fluorine-based, reactive ion etching process.

Figure 19A:
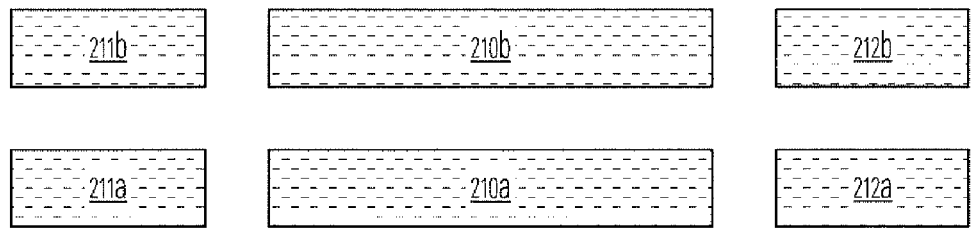
FIGS. 19A and 19B show layout and cross-sectional views for patterning the strips of phase change material of FIGS. 18A and 18B, used to form bridges of phase change material on the electrode layer.
Figure 19B:
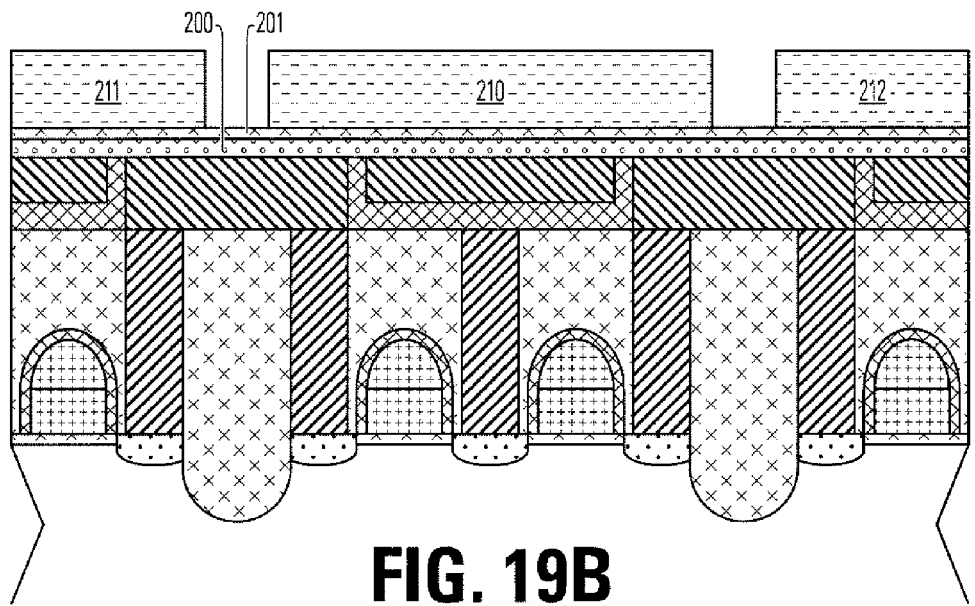

FIGS. 19A and 19B illustrate a next stage in the process, in which another photoresist layer 210, 211, 212 is formed and patterned to define photoresist structures 210a, 210b, 211a, 211b, 212a and 212b. The cell structures correspond with pairs of memory cells as described below. The cell structures are wider than the strips 200a, 200b of memory material because they have a width equal to the width achieved using the lithographic process applied in the manufacturing process, such as a photomask based lithographic process, without trimming. Thus, the width in some embodiments is equal to the minimum feature size F for the lithographic process applied in forming the layer.

Figure 20A:
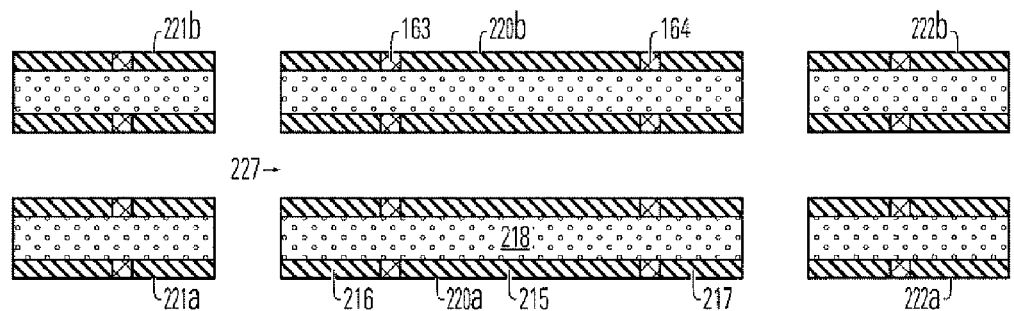
FIGS. 20A and 20B show layout and cross-sectional views of the bridges of phase change material after etching according to the pattern of FIGS. 19A and 19B.
Figure 20B:
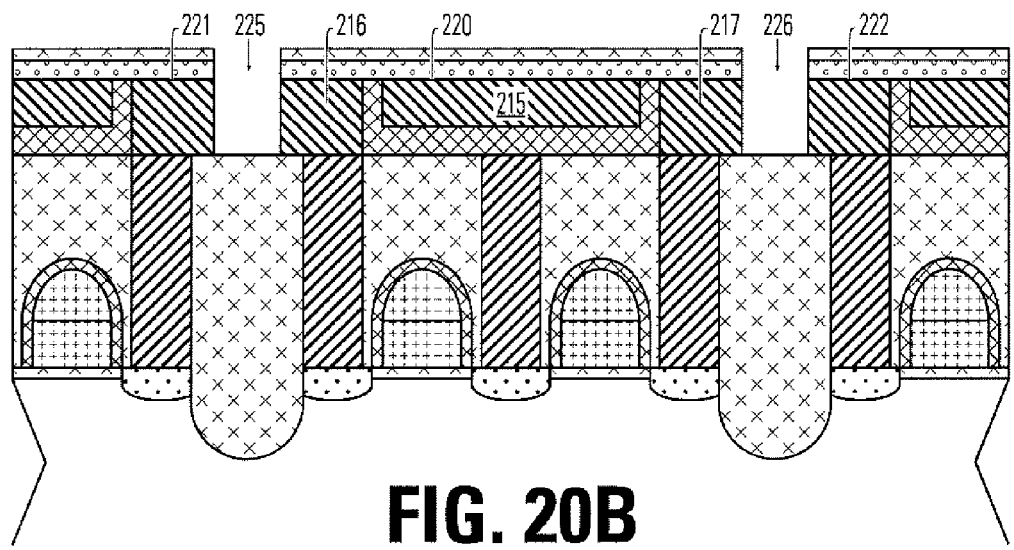

FIGS. 20A and 20B illustrate a next stage in the process, in which the photoresist structures 210a, 210b, 211a, 211b, 212a and 212b are used as etch masks to define cell structures (220a, 220b, 221a, 221b, 222a and 222b, in FIG. 20A, 220, 2221, 222, in FIG. 20B) by etching trenches 225, 226 to the isolation dielectric structures in the structure 99, and the trenches 227 between columns of cells orthogonal to the word lines. The cell structure 200a includes a first electrode member 215, a second electrode member 216 and a third electrode member 217. Insulating member 163 separates the first electrode member 215 from the second electrode member 216. Insulating member 164 separates the first electrode member 215 from the third electrode member 217. A bridge 218 of memory material overlies the electrode members 215, 216 and 217 and the insulating members 163, 164 to establish two memory cells on the structure 220.

Figure 21:
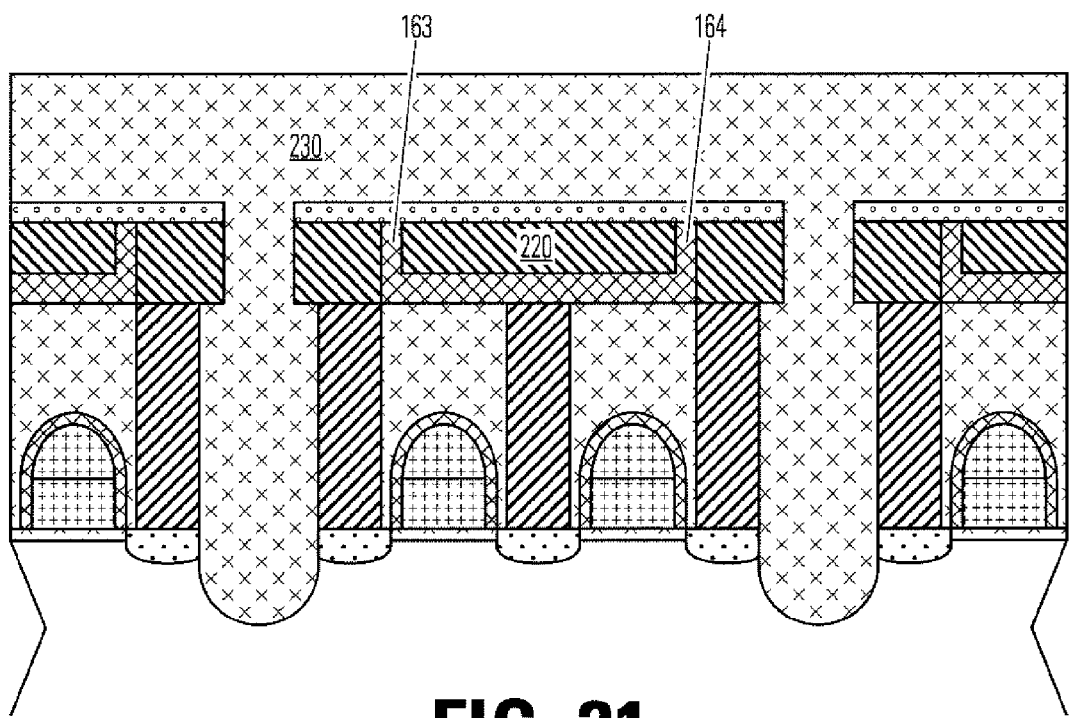
FIG. 21 shows a cross-sectional view corresponding to steps for forming a dielectric fill layer over the structure shown in FIGS. 20A and 20B, including the electrode layer and the bridges of phase change material.

FIG. 21 illustrates a next stage in the process, in which a dielectric fill layer 230 with a planar top surface is formed over the electrode structures and fills the gaps and trenches between them. In an embodiment of the process, the fill layer 230 is formed by high-density plasma HDP chemical vapor deposition CVD, followed by chemical mechanical polishing and cleaning. The dielectric fill may comprise silicon oxides, silicon nitrides, and other insulating materials, preferably having good thermal as well as electrical insulating properties.

In some embodiments a structure for thermally insulating the bridges is provided, in addition to or instead of the dielectric fill layer. In one example, the thermally insulating structure is formed by providing a cap layer of thermally insulating material over the bridges (218) and optionally over the electrode layer, before applying the dielectric fill. In one example, the thermally insulating structure is formed by providing a cap layer of thermally insulating material over the bridges (218) and optionally over the electrode layer, before applying the dielectric fill. Representative materials for the layer of thermally insulating material include materials that are a combination of the elements silicon Si, carbon C, oxygen O, fluorine F, and hydrogen H. Examples of thermally insulating materials which are candidates for use for the thermally insulating cap layer include $SiO_2$, SiCOH, polyimide, polyamide, and fluorocarbon polymers, selected so that the material has a lower thermal conductivity that the dielectric fill layer to be deposited over it. When the overlying material is $SiO_2$, the thermally insulating material should have a thermal conductivity less than that of $SiO_2$, or less than about 0.014 J/cm*degK*sec. Many low-K materials, where low-K materials have permitivity less that that of $SiO_2$, are suitable thermal insulators. Examples of materials which are candidates for use for the thermally insulating cap layer include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void in the dielectric fill formed over the bridge for thermal insulation. A single layer or combination of layers can provide thermal and electrical insulation.

Figure 22A:
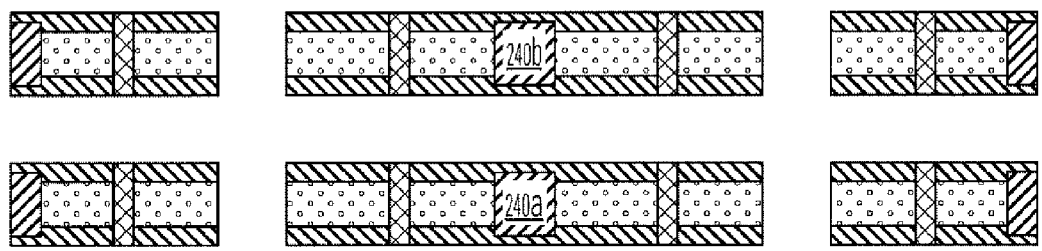
FIGS. 22A and 22B show layout and cross-sectional views after formation of conductive plugs in the dielectric fill layer contacting the bridges of phase change material in the structure shown in FIG. 21.
Figure 22B:
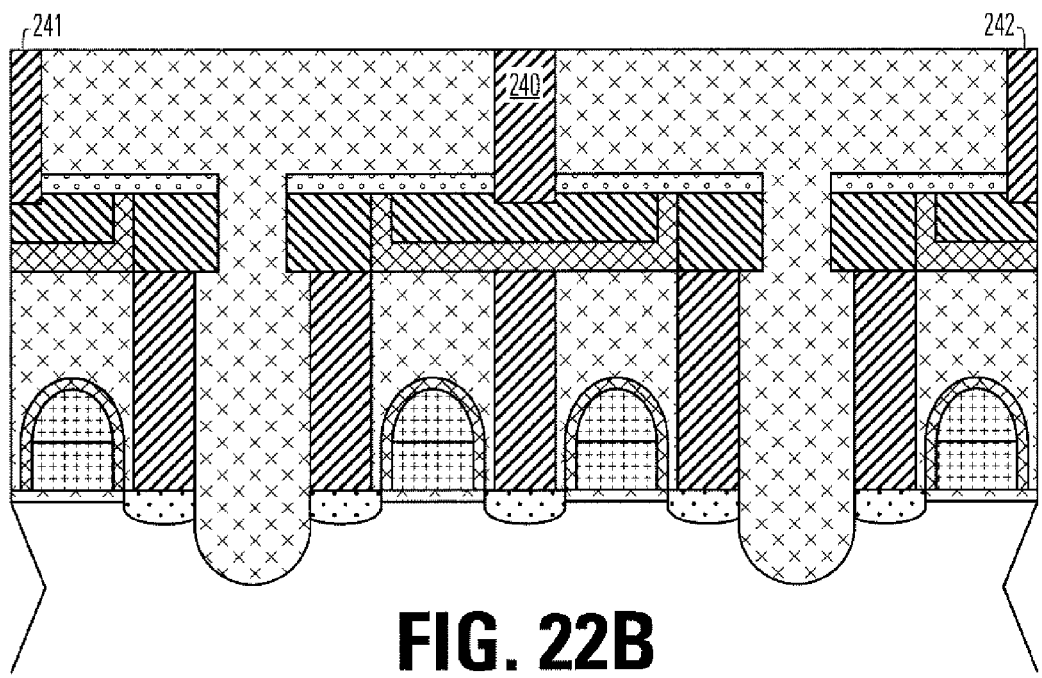

FIGS. 22A and 22B illustrate a next stage in the process, in which vias (not shown) are etched in the fill layer 230 to the electrode material, through the memory material and the fill. The via etch process may be a single anisotropic etch for both the fill and the memory material, or a two step process first etching the fill material with a first etch chemistry, and second etching the memory material with a second etch chemistry. After forming the vias, the vias are filled with tungsten or other conductive material, to form plugs 240 (240a, 240b in FIG. 22A), 241 and 242 contacting the first electrode member (e.g. member 215) in the electrode structures, for electrical communication with circuitry above the electrode layer. In embodiments of the process, the vias are lined with a diffusion barrier layer and/or an adhesion layer, as known in the art, and filled with tungsten or other suitable conductive material. The structure is then planarized by chemical mechanical polishing and cleaned. Finally a "clean up" etch is applied and the resulting structure is cleaned.

Figure 23:
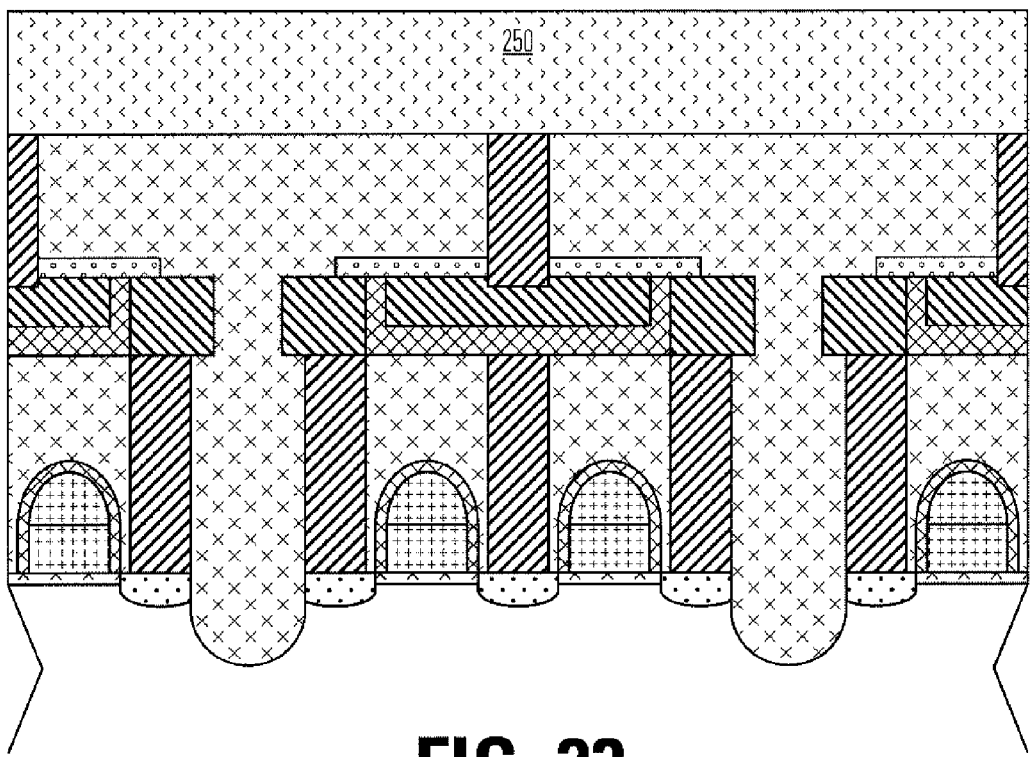
FIG. 23 shows a cross-sectional view corresponding to steps for forming a patterned conductive layer structure over the structure shown in FIGS. 22A and 22B.

FIG. 23 illustrates a next stage in the process, in which a patterned conductive layer 250 is formed in contact with the plugs over the fill layer, providing bit lines and other conductors for the memory device, yielding the structure shown and described above with respect to FIG. 5. In embodiments of the process, a copper alloy damascene metallization process is used in which the patterned conductive layer is formed depositing fluorosilicate glass (FSG) on the exposed surface, and then forming a photoresist pattern in the pattern desired. An etch is applied removing exposed FSG, and then liner and seed layers are deposited in the pattern. Then, copper plating is applied to fill the pattern. After plating, an anneal step is applied, followed by a polishing process. Other embodiments can use standard Al—Cu processes, or other metallization processes known in the art.

Figure 24A:
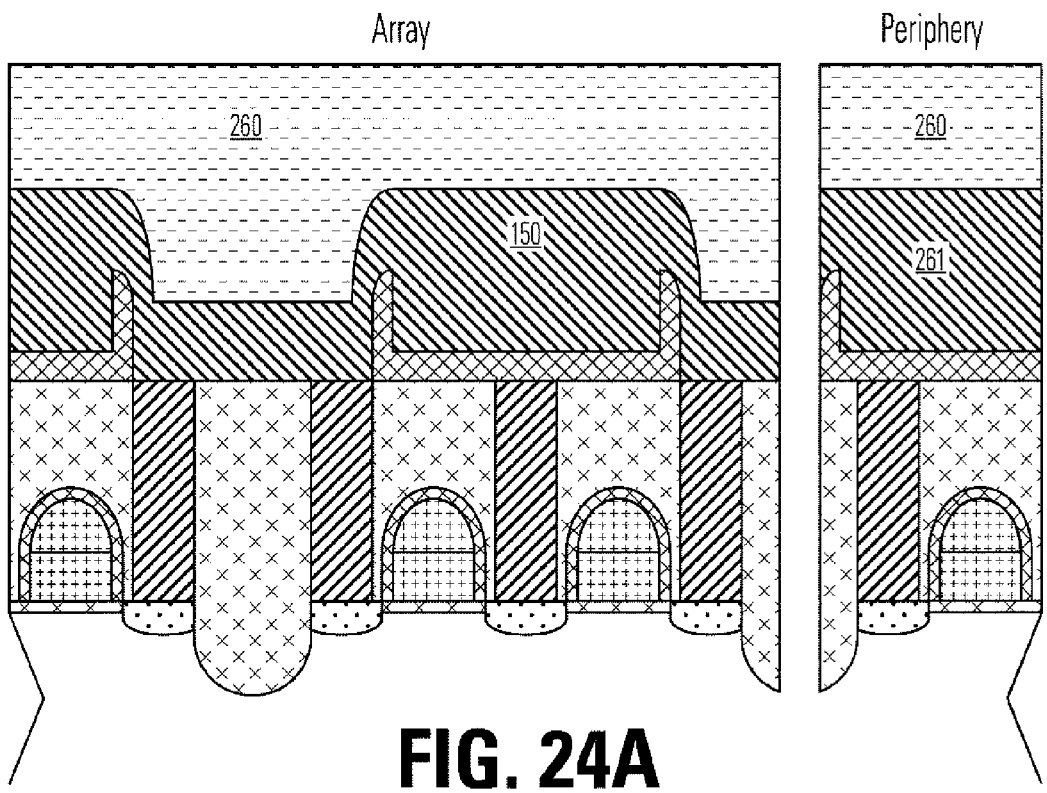
FIGS. 24A-24E illustrate an alternative process for polishing the electrode layer, corresponding with the process illustrated with reference to FIG. 14.

FIGS. 24A-24E illustrate an alternative procedure for polishing the structure of FIG. 13 to yield the structure of FIG. 14. As illustrated in FIG. 24A, the structure of FIG. 13 is covered with a fill layer 260, such as photoresist or polysilicon, which covers the second electrode material layer 150. FIG. 24A also shows the effect of the process on peripheral circuitry outside the memory array. In particular, the first electrode material layer 261 covers the peripheral circuits along with any sidewall structures over the peripheral circuits. Likewise, the fill layer 260 overlies the layer 261.

Figure 24B:
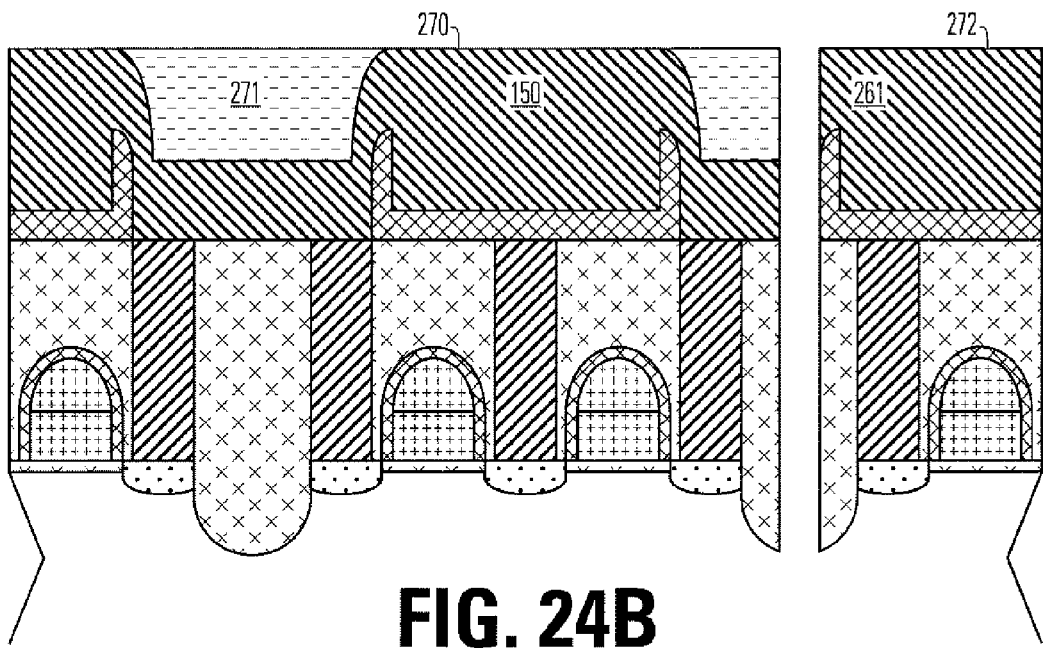

FIG. 24B illustrates a next stage in the process, in which the fill layer 260 is etched and planarized by chemical mechanical polishing or otherwise, to the tops 270, 272 of the second electrode material layer 150 across both the array and the peripheral circuits, leaving fill members 271 between the raised portions of the second electrode material layer 150.

Figure 24C:
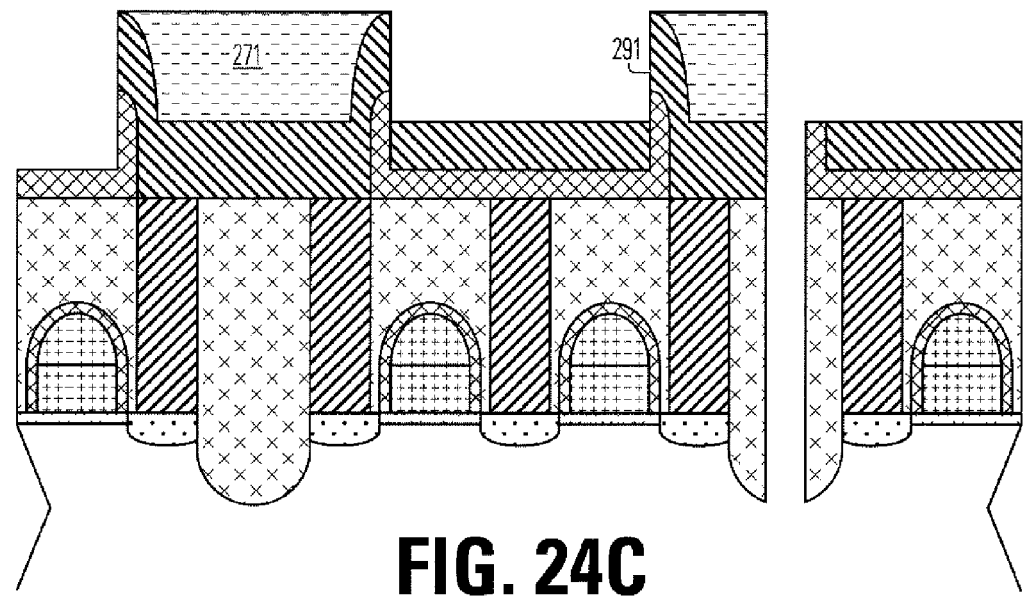
Figure 24D:
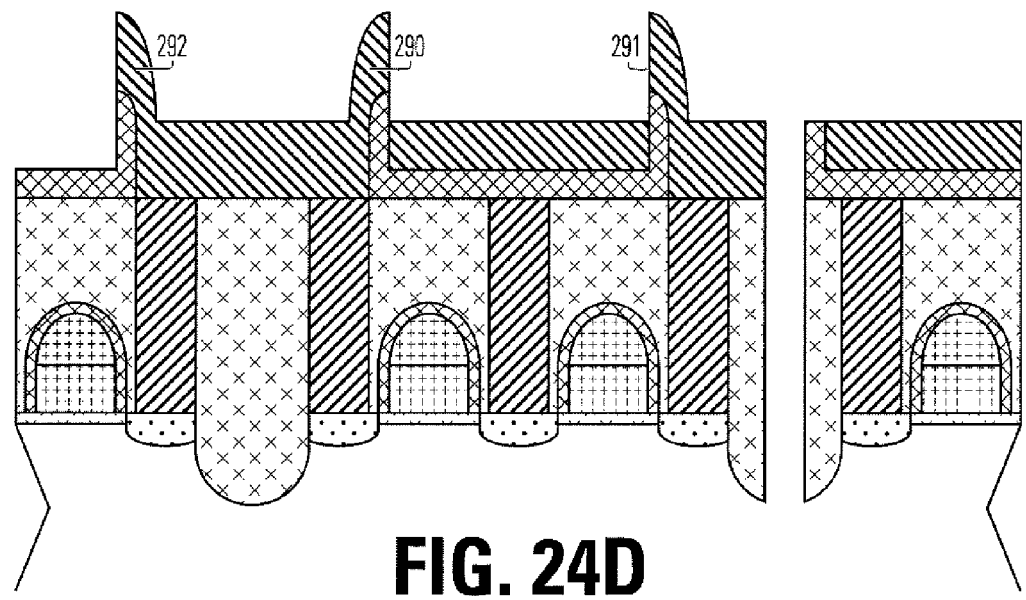

FIG. 24C illustrates a next stage in the process, in which the second electrode material layer (TiN for example) is selectively anisotropically etched back to about the level of the desired surface of the electrode layer, leaving the fill members 271 and burrs of electrode material on the sides of the fill members and over the insulating members. Next, as shown in FIG. 24D, the fill members are selectively etched, leaving burrs 290, 291 292 in the second electrode material.

Figure 24E:
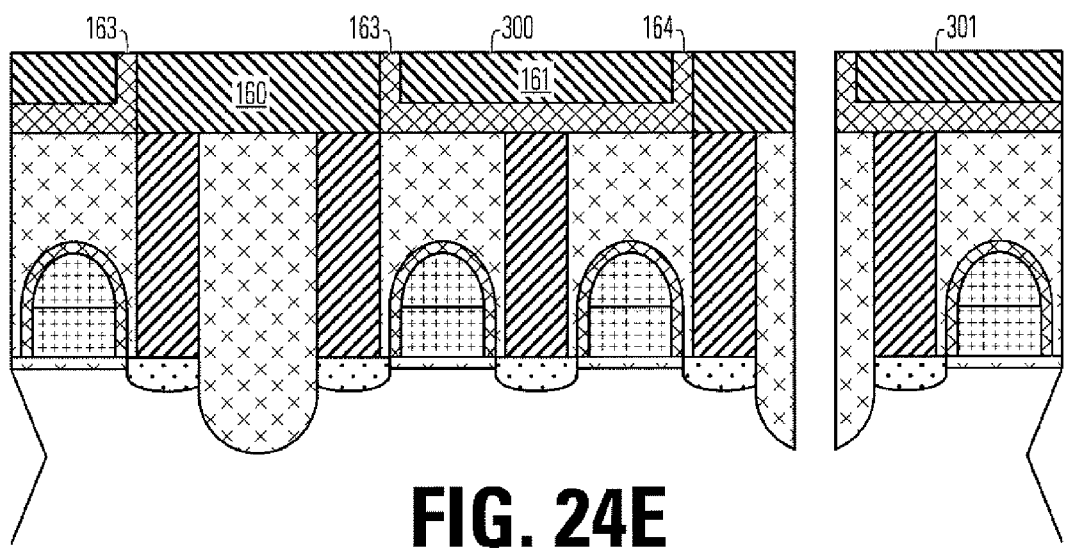

FIG. 24E illustrates a last stage in the process, in which a chemical mechanical polishing step is applied to planarize the structure, leaving a substantially planar surface 300 in the array area and substantially planar surface 301 in the peripheral area, for the structure of FIG. 14. Reference numerals used in FIG. 14 for like structures are included in FIG. 24E for reference, but not described again.

An alternative to the technique described with reference to FIGS. 16A-16B through 20A-20B, for forming the electrode structures and the bridges of memory material is illustrated in FIGS. 25A-25B and FIGS. 26A-26B. The structure shown in FIG. 25B contains the front-end-of-line access circuit components including the drain regions 104, 105 in the semiconductor substrate, a common source region 103 in the semiconductor substrate, the word lines 107, 111 overlying channel regions in the semiconductor substrate, the metal source line 106 which contacts the common source region 103, and the contact plugs 110, 112 which extend between the drain terminals 104, 105 and the second electrodes of the memory cells in the electrode layer, as described in detail above. According to the illustrated process, electrodes are patterned in the electrode layer and the bridges of memory material are patterned in a self-aligned process. Thus, in preparation for the step of FIGS. 25A-25B, the electrode layer is formed as described above with respect to FIG. 14, or otherwise. The electrode layer at this stage includes a first electrode member 400 extending in a stripe along the substrate perpendicular to the page, which is arranged over the bottom 401 of the insulating member, and between the insulating fences 402, 403. Also, the electrode layer at this stage includes two second electrode members 404, 405 extending in parallel stripes along the substrate perpendicular to the page, outside of the insulating fences 402, 403, which separate the first and second electrode members. After formation of the electrode layer, a layer of memory material 406, and a protective cap layer 407 are formed, as discussed with respect FIG. 15. Next, as illustrated a layer of photoresist 408 is deposited and patterned to define the pattern (FIG. 25A) for a two memory cell set comprising a first electrode in the center, formed from the member 400, and a second electrode on the left formed from the member 404, and a second electrode on the right formed from the member 405. Using the pattern shown in FIG. 25A, the cap layer 407, the layer of memory material 408, and the electrode layer are etched to define stacks, in which the remaining portions of the electrode layer (404, 400, 405) and of the layer of memory material 406 are aligned.

Figure 25A:
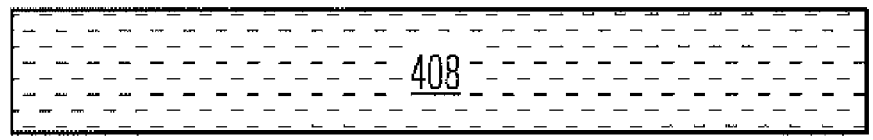
FIGS. 25A-25B illustrate a first step in a set of steps for manufacturing a self-aligned memory bridge and electrode structure based on mask trimming.
Figure 25B:
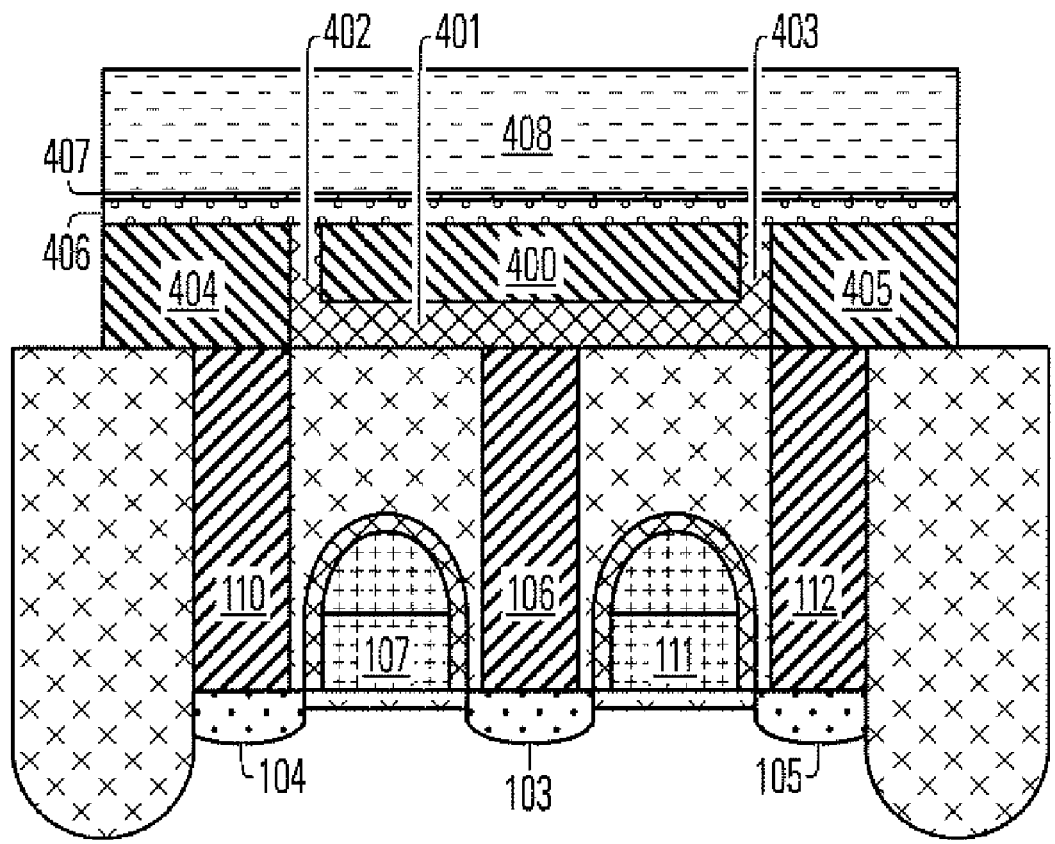
Figure 26A:
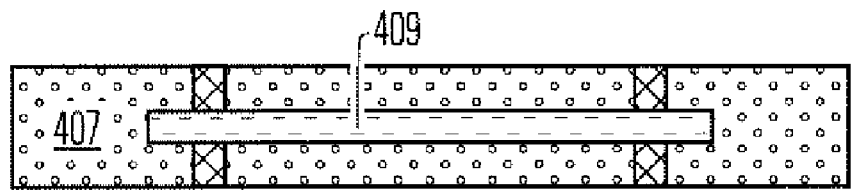
FIGS. 26A-26B illustrate a second step in a set of steps for manufacturing a self-aligned memory bridge and electrode structure based on mask trimming.
Figure 26B:
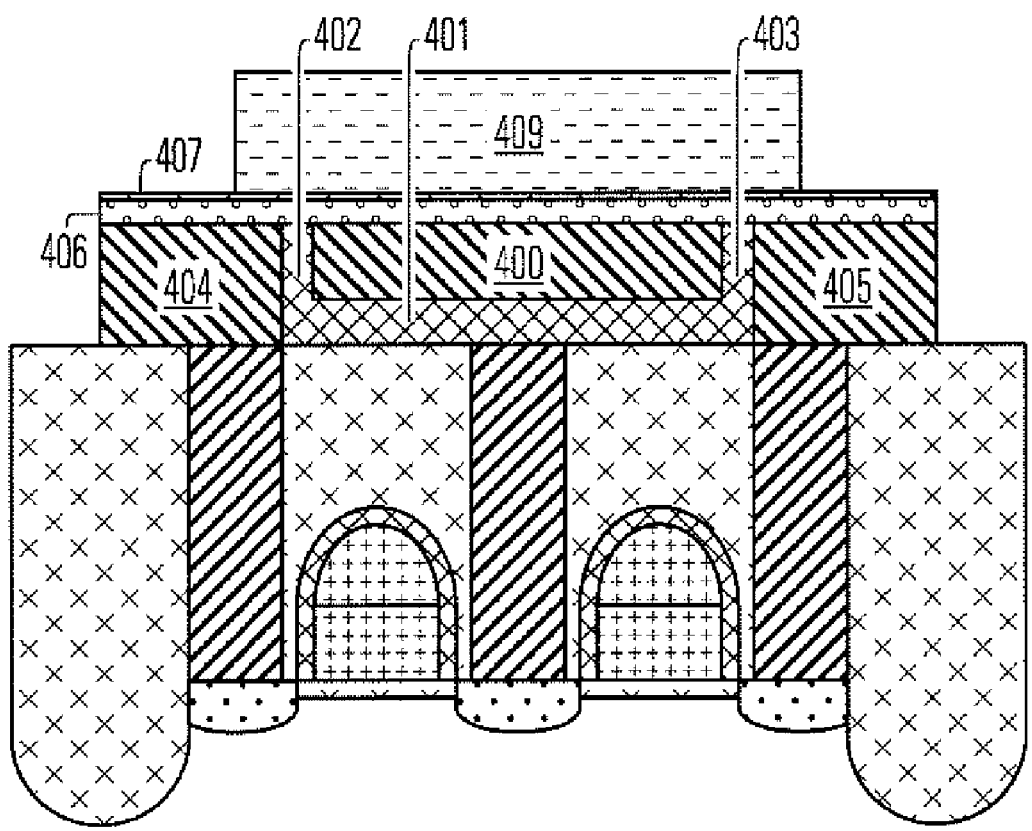

In a next step as illustrated in FIGS. 26A-26B, a photoresist trimming process is applied, which isotropically etches the photoresist 408 of FIG. 25A to form a more narrow etch mask 409 over the layer of memory material and protective cap layer 407.

Figure 27A:
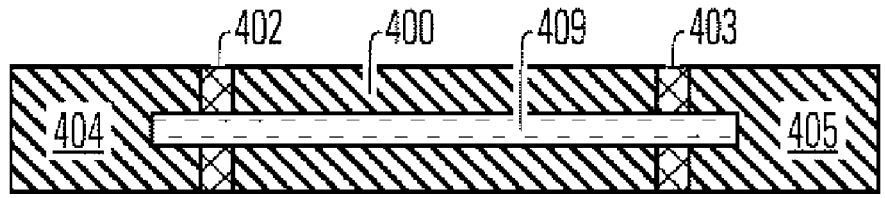
FIGS. 27A-27B illustrate a third step in a set of steps for manufacturing a self-aligned memory bridge and electrode structure based on mask trimming.
Figure 27B:
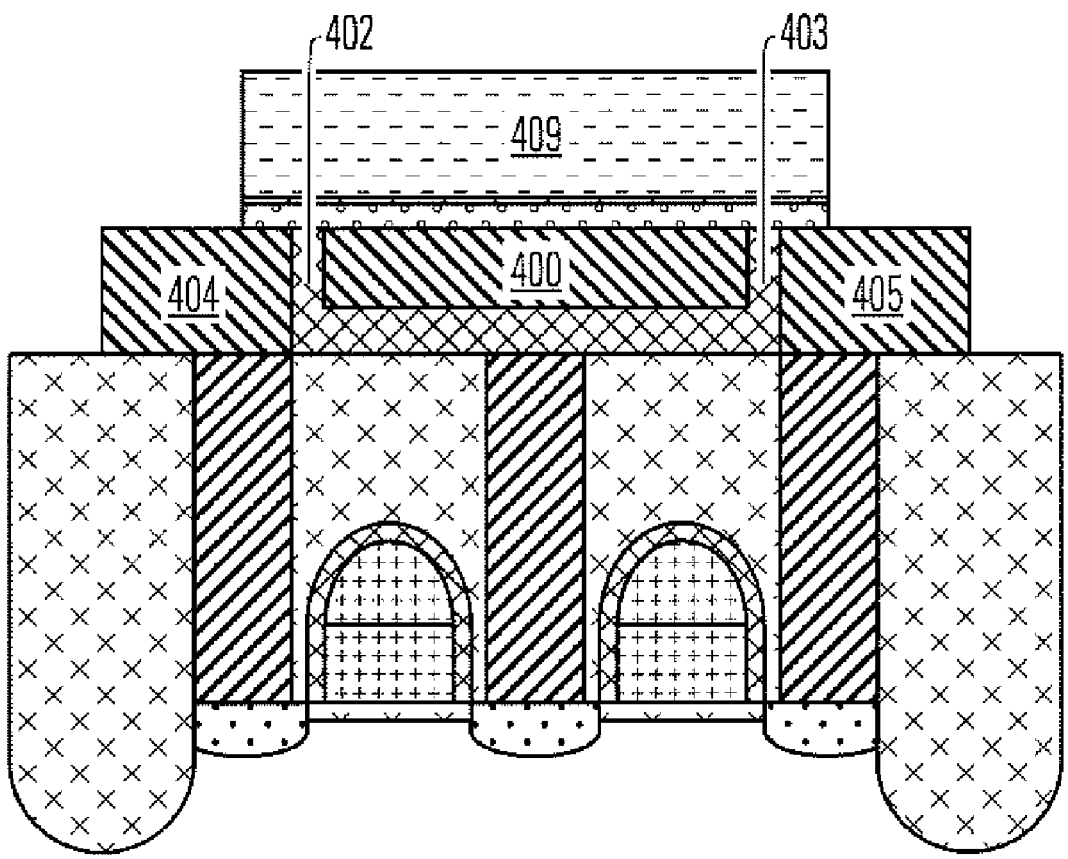

In the next step as illustrated in FIGS. 27A-27B, the cap layer 407 and layer 406 of memory material are etched according to the more narrow etch mask 409. Then the photoresist is stripped, leaving a narrow bridge of memory material, having a sub-lithographic width, and self-aligned with the electrode members 400, 404, 405.

The procedure illustrated in FIGS. 25A-B through 27A-B, can be applied to make self-aligned narrow line structures in other contexts.

Figure 28A:
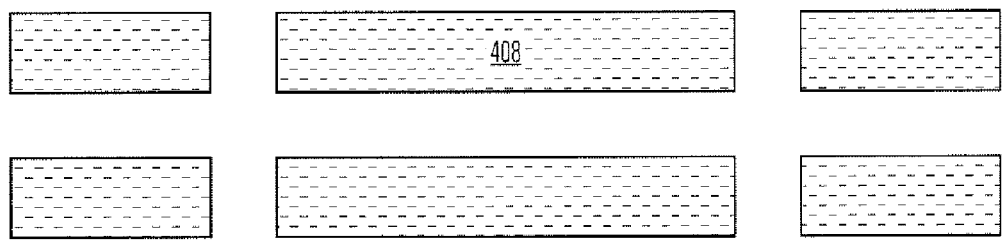
FIGS. 28A-28B illustrate a first step in a set of steps for manufacturing a self-aligned memory bridge and electrode structure based on a bridge sidewall mask.
Figure 28B:
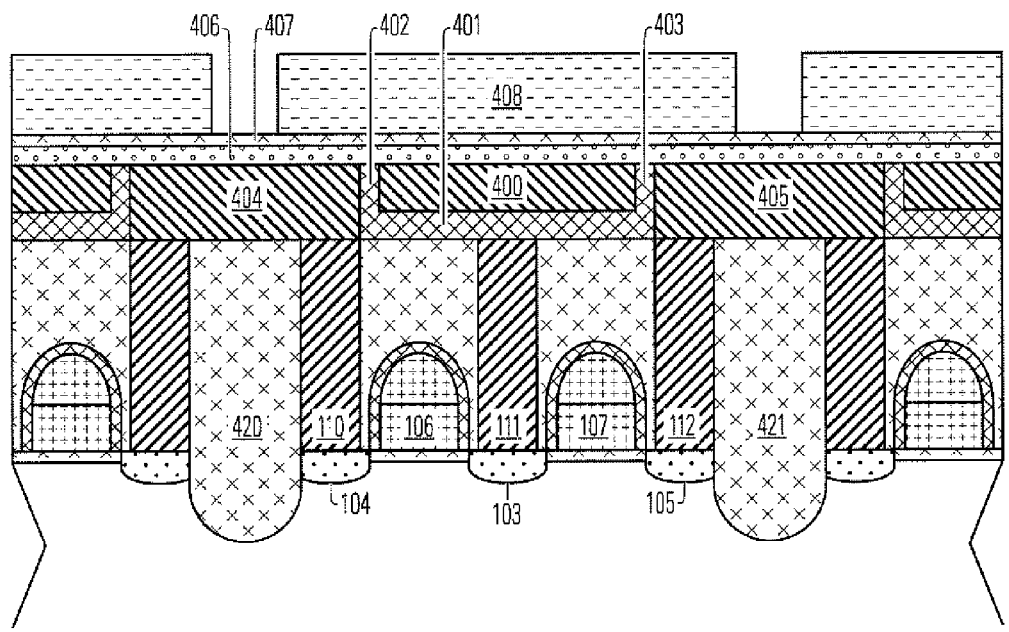
Figure 33:
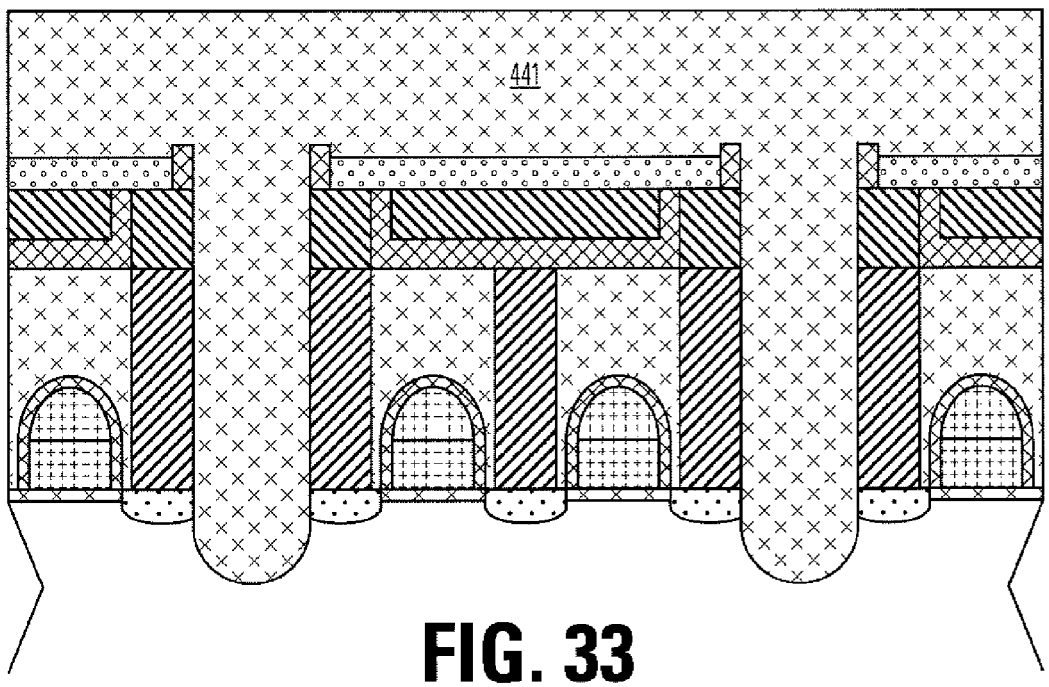
FIG. 33 illustrates a sixth step in a set of steps for manufacturing a self-aligned memory bridge and electrode structure based on a bridge sidewall mask.

In yet another alternative technique, self-aligned, sub-lithographic bridges can be implemented as illustrated in all FIGS. 28A-28B through FIG. 33. FIGS. 28A-28B illustrate the first step in the process, and are like the step illustrated in FIGS. 25A and 25B. The same reference numerals are utilized, and the components are not described again. In FIGS. 28A-28B, the perspective is expanded to show isolation members 420, 421 between the memory cell pairs, and to illustrate a number of the patterns 408 in the photoresist. Thus, as can be seen, the photoresist layer is patterned using a lithographic process to define the positions of the bridges of memory material over the electrode layer.

Figure 29A:
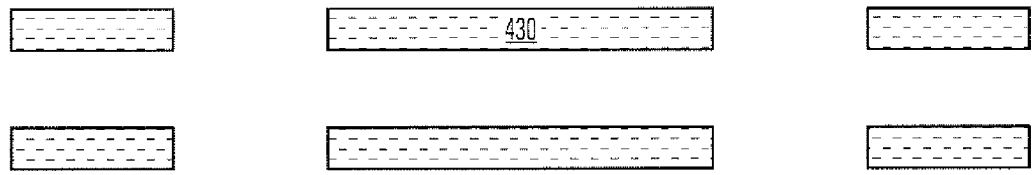
FIGS. 29A-29B illustrate a second step in a set of steps for manufacturing a self-aligned memory bridge and electrode structure based on a bridge sidewall mask.
Figure 29B:
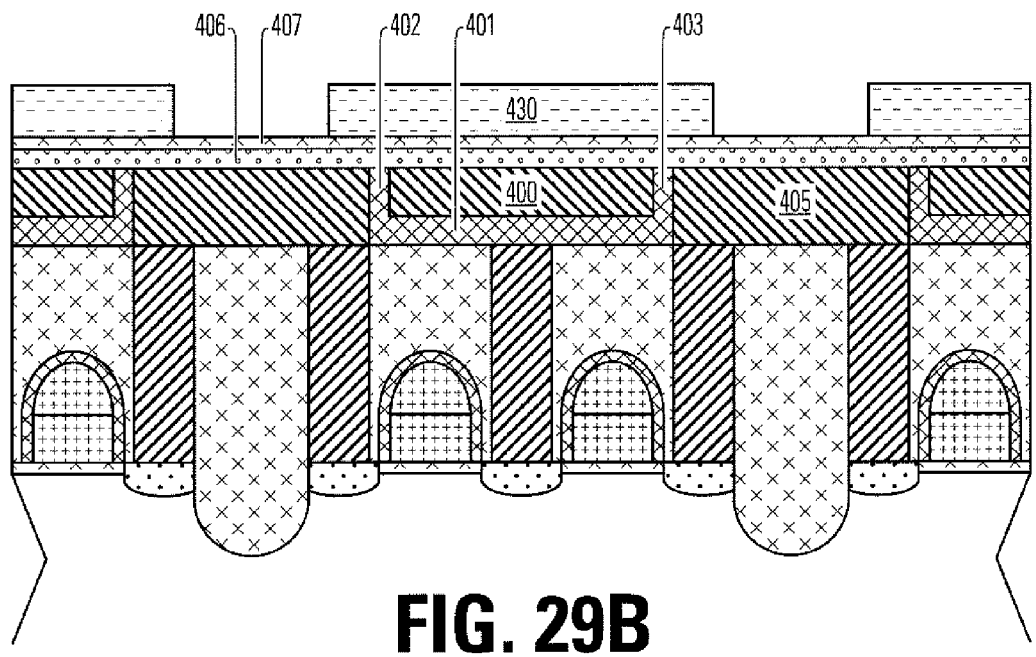

In the next step, as shown in FIGS. 29A-29B, the photoresist patterns 408 are subjected to isotropic etching to trim their width to form a more narrow patterns 430. Next, the layer of memory material 406 and the cap layer 407 are etched while being protected with the more narrow etch masks defined by the patterns 430, and the photoresist is stripped, leaving the structure shown in FIGS. 30A-30B.

Figure 30A:
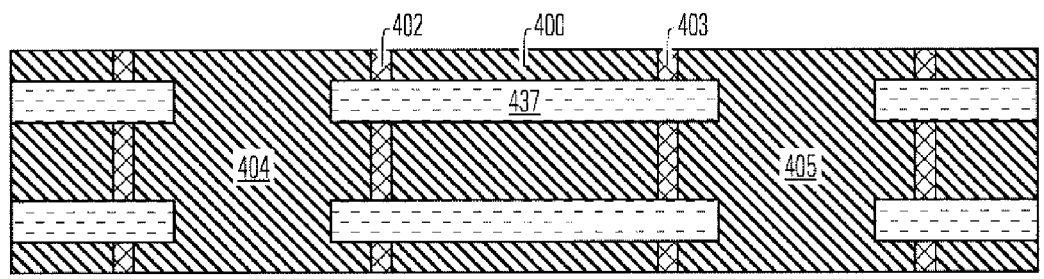
FIGS. 30A-30B illustrate a third step in a set of steps for manufacturing a self-aligned memory bridge and electrode structure based on a bridge sidewall mask.
Figure 30B:
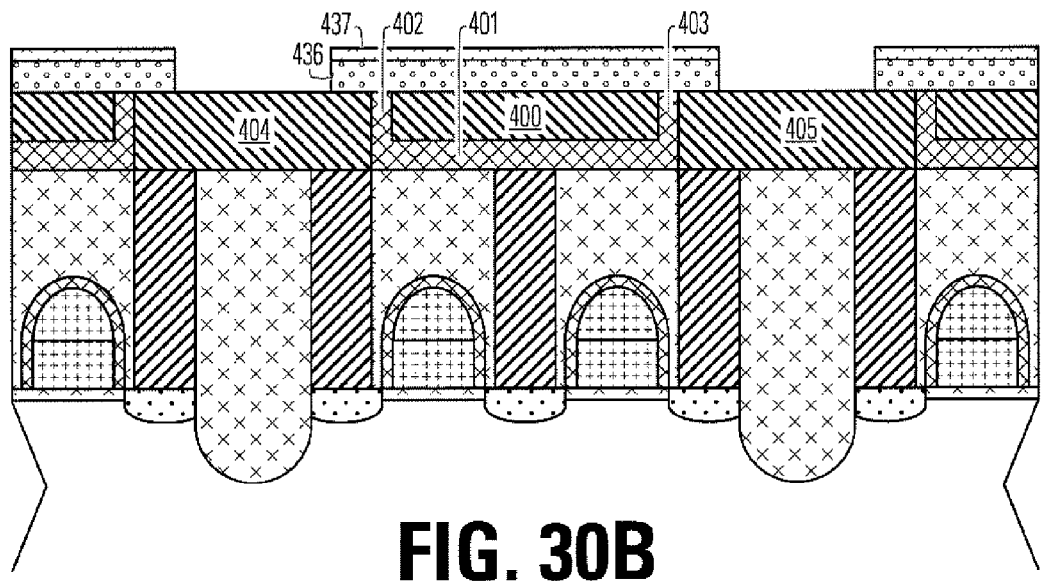

As shown in FIGS. 30A-30B, narrow bridges that comprise a stack of the memory material 436 and the cap layer 437 are positioned over the first electrode member 400, and the second electrode member 404 on the left, and the second electrode member 405 on the right. The bridges extend across the insulating members 402 and 403.

Figure 31A:
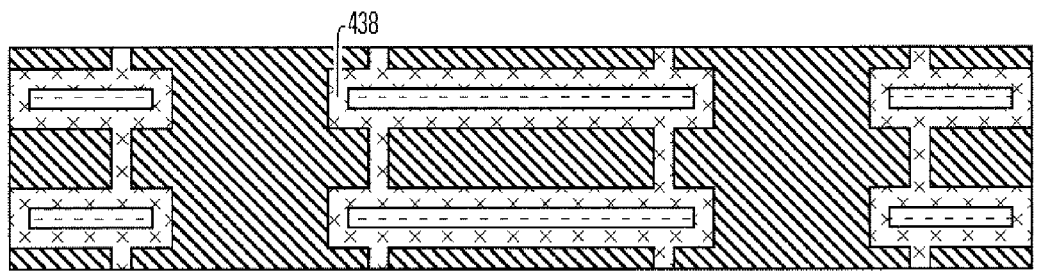
FIGS. 31A-31B illustrate a fourth step in a set of steps for manufacturing a self-aligned memory bridge and electrode structure based on a bridge sidewall mask.
Figure 31B:
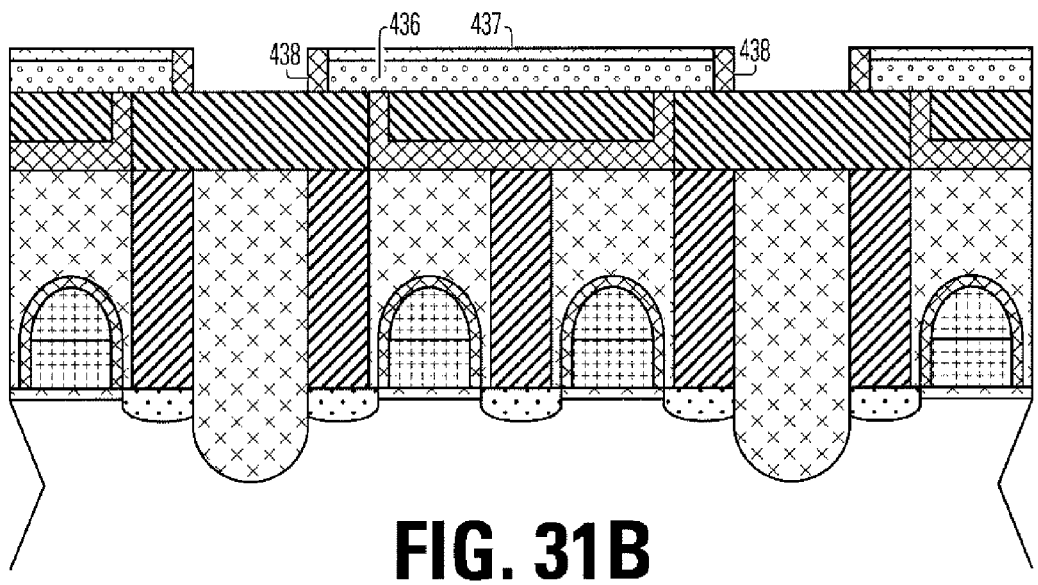

In the next step, as illustrated in FIGS. 31A and 31B, sidewall structure 438 is formed on the stack of the memory material 436 and the cap layer 437, by depositing a layer of material such as silicon nitride over the structure, and then anisotropically etching the layer, leaving the side walls 438. The combination of the stacks of memory material 436 and the cap layer 437 with the sidewalls 438 form a new etch mask for the electrode layer that is a wider than, and self-aligned with, the bridges.

Figure 32A:
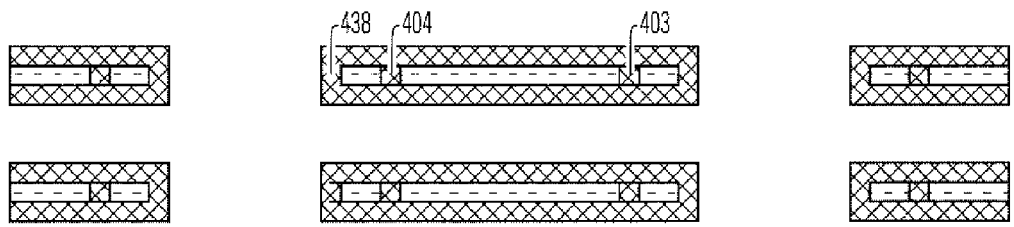
Figure 32B:
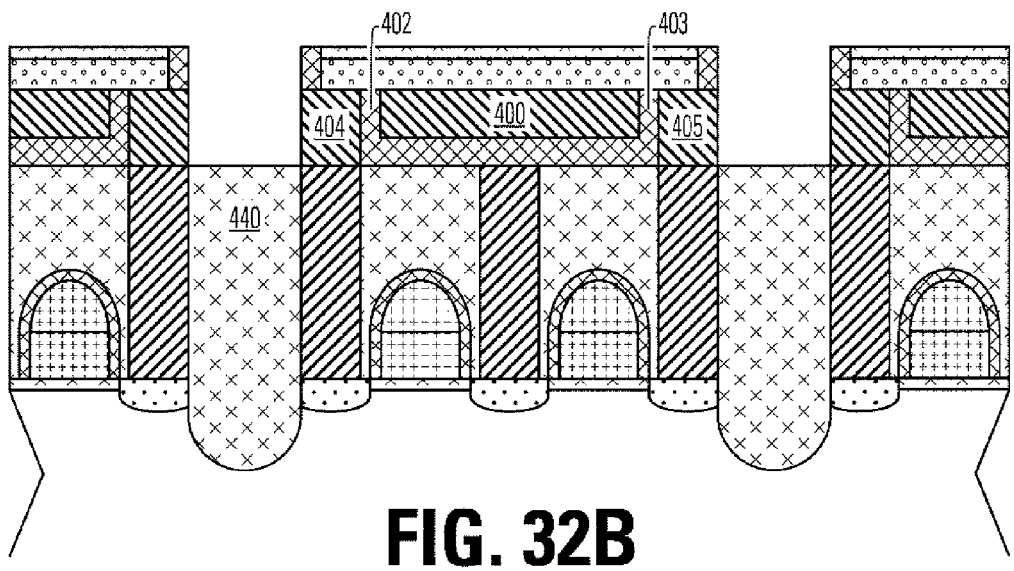

As illustrated in FIG. 32A-32B, the electrode layer is etched using the sidewall etch mask, removing material down to the dielectric fill layer 440, and leaving the electrode structures for the electrode layer which are self-aligned with the narrow bridges of memory material, and the insulating members 402 and 403.

As shown in FIG. 33, a dielectric fill 441 is applied over the structure filling the trenches between the electrode structures and the bridges of memory material. The resulting structure is ready for processes used to form vias and plugs for contacting the electrode layer, and for metallization.

Figure 34A:
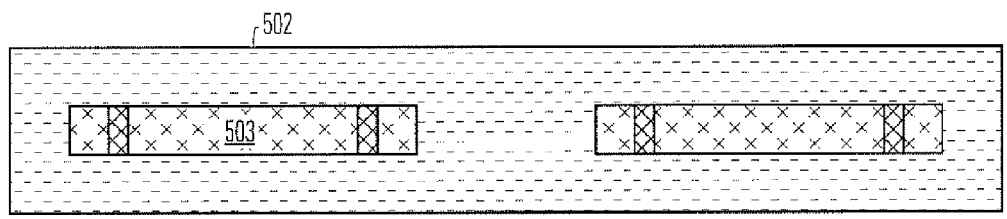
FIGS. 34A-34B illustrate a first step in a set of steps for manufacturing a bridge of memory material using a damascene procedure.
Figure 34B:
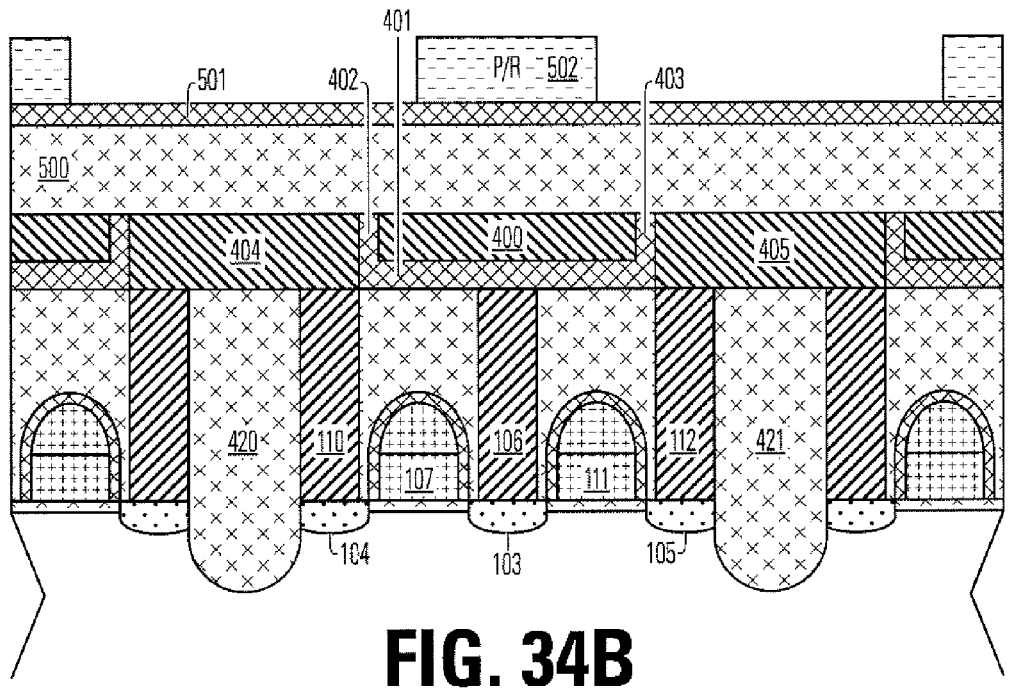
Figure 46:
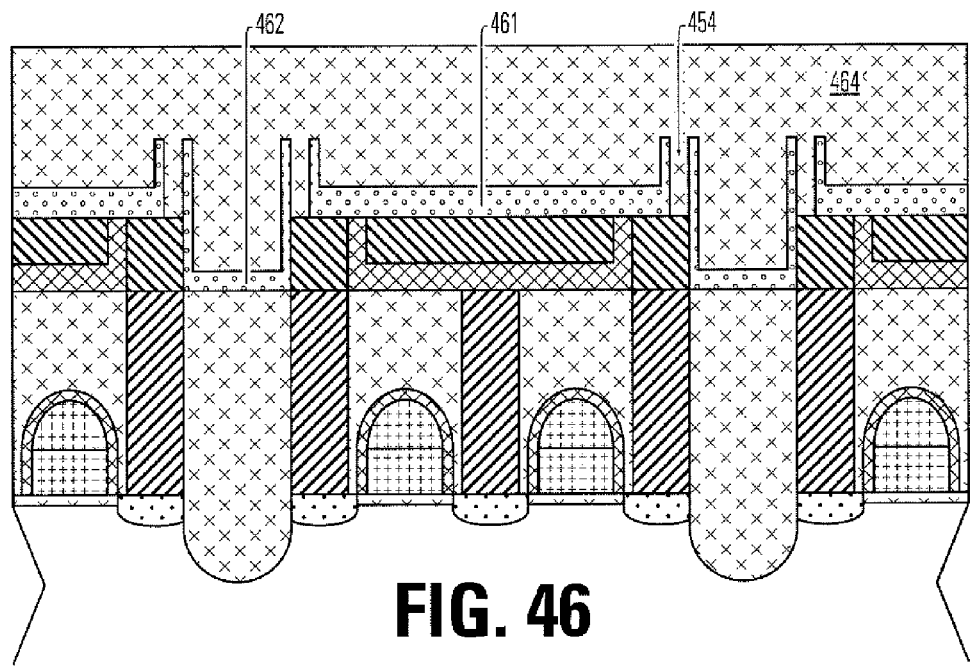
FIG. 46 illustrates a seventh step in a set of steps for manufacturing a bridge of memory material using an alternative damascene procedure.

FIGS. 34A-34B through FIG. 46 illustrate alternative procedures for implementing the bridge of memory material over the electrode layer, which are based on damascene techniques, that can prevent exposure of the memory material to photoresist and photoresist stripping processes. A first damascene technique is illustrated with the procedure beginning at FIGS. 34A-34B. FIGS. 34A-34B show the structure of FIG. 14, which comprises the front-end-of-line structures (103-107, 110-112, 420, 421 are labeled) and the electrode layer including a first electrode member 400, the second electrode member 404 on the left, and the second electrode member 405 on the right, which extend in stripes along the substrate perpendicular to the page, as described in detail above. According to a first embodiment of the damascene technique, a layer 500 of dielectric such as silicon dioxide is formed over the electrode layer, and cap layer 501 such as silicon nitride covers the layer 500. Photoresist 502 is applied and patterned to define locations 503 for trenches to be etched in the layers 500, 501, exposing the surface of the cap layer 501 and crossing the insulating fences 402, 403 for memory cells.

Figure 35A:
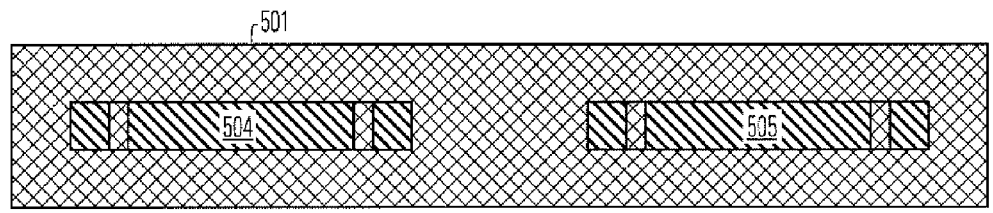
FIGS. 35A-35B illustrate a second step in a set of steps for manufacturing a bridge of memory material using a damascene procedure.
Figure 35B:
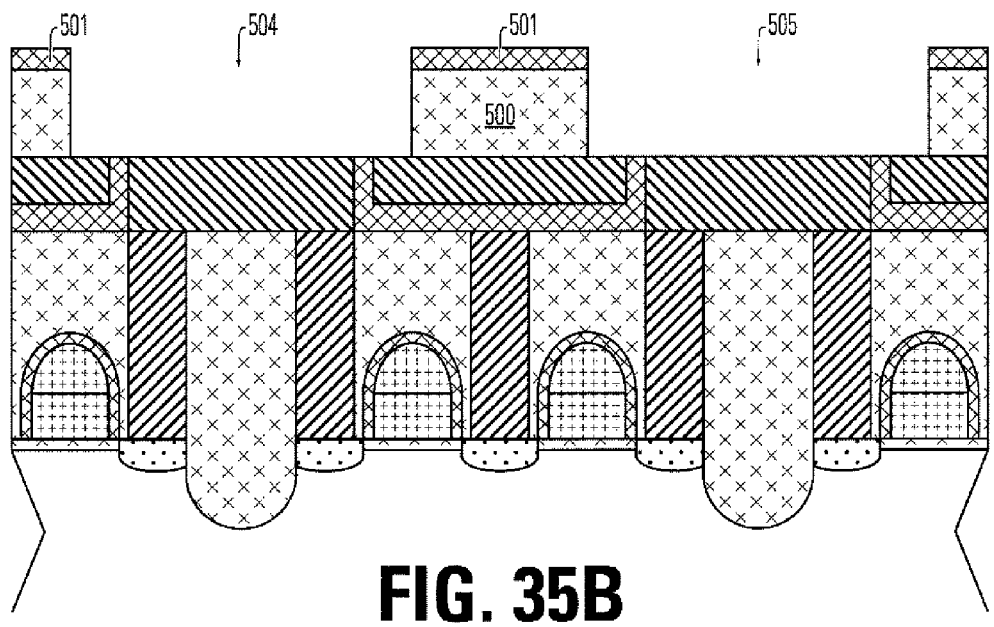

In the next step illustrated by FIGS. 35A-35B, the layers 500 and 501 are etched and the photoresist is stripped, leaving trenches 504, 505 in the layers 500 and 501, extending to the surface of the electrode layer.

Figure 36:
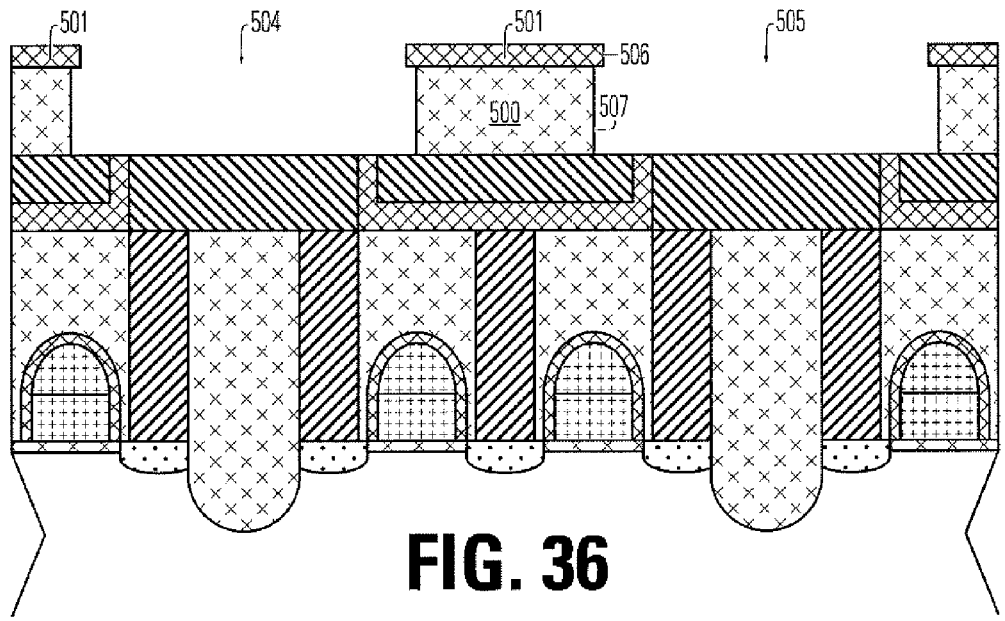
FIG. 36 illustrates a third step in a set of steps for manufacturing a bridge of memory material using a damascene procedure.
Figure 37:
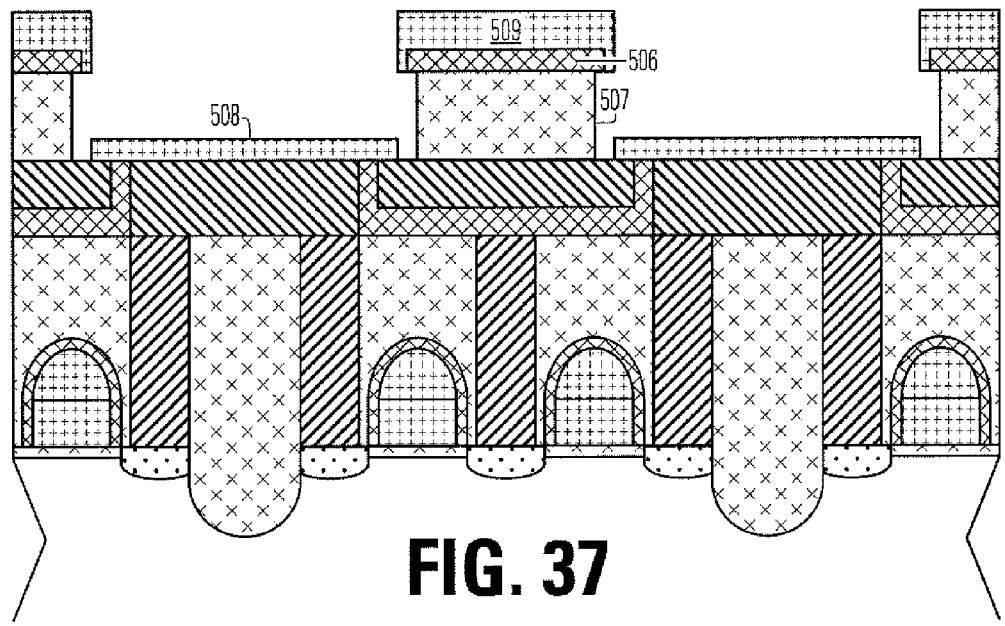
FIG. 37 illustrates a fourth step in a set of steps for manufacturing a bridge of memory material using a damascene procedure.

Next, as shown in FIG. 36, the structure of FIG. 35B is etched in a manner that is selective to the dielectric layer 500, leaving overhangs 506 of the cap layer 501, over sidewalls 507 in the dielectric layer 500. The selective etch for silicon dioxide layer 500 with a silicon nitride layer 501 can comprise dipping in a solution of dilute or buffered HF, for example. Next, as shown in FIG. 37, a layer of memory material is deposited over the structure, leaving strips 508 in the bottom of the trenches, with layer 509 on the top of the cap layer 501. The layer of memory material does not form on the side walls 507 because of the overhang 506.

In a next set of steps, the portions 509 of memory material on top of the cap layer 501, and the cap layer 501 are removed, and the trenches are filled covering the strips 508 of memory material with dielectric, and the structure is planarized to form a layer of dielectric 512, as shown in FIG. 38. FIGS. 39A-39B illustrate a next step, in which photoresist is applied over the dielectric layer 512, and patterned to define the layout of the first electrodes 514, the second electrodes 515, 516 and bridges 511, 513 of memory material. The dielectric layer 512, the memory material and the electrode metal layers are etched to the underlying dielectric fill 420 according to the pattern of the photoresist mask 520. Subsequent processes are applied to fill the resulting trenches 510 around the electrodes, form contacts to the first electrode 514, and apply bit lines overlying the structure, like the processes of FIGS. 21-23.

FIG. 40 illustrates a beginning step of an alternative damascene technique for forming the bridges of memory material. The process starts after formation of the front-end-of-line structures (103-107, 110-112, 420, 421 are labeled) and the electrode layer including a first electrode member 400, the second electrode member 404 on the left, and the second electrode member 405 on the right, which extend in stripes along the substrate perpendicular to the page, as described in detail above. In this alternative technique, a sacrificial layer 450 of polysilicon or other material is deposited over the electrode layer.

Figure 43A:
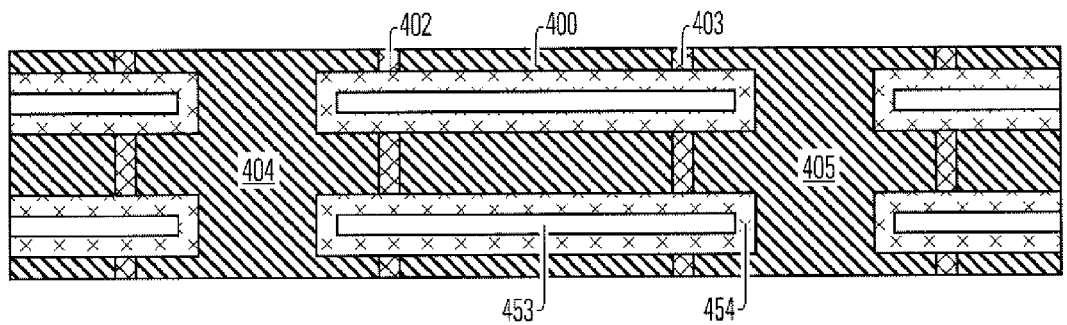
FIGS. 43A-43B illustrate a fourth step in a set of steps for manufacturing a bridge of memory material using an alternative damascene procedure.
Figure 43B:
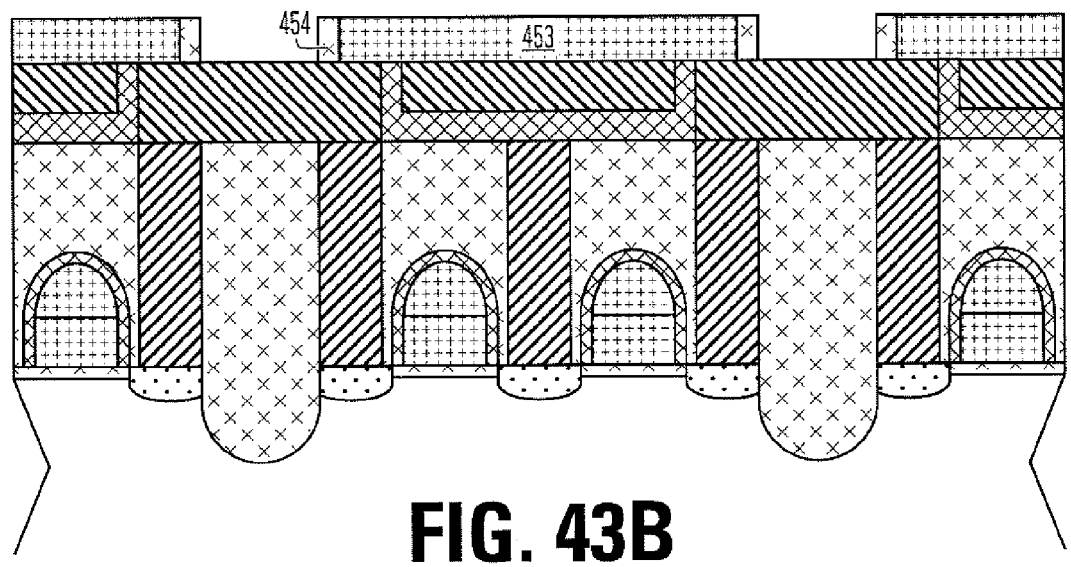

As shown in FIGS. 41A-41B, a layer of photoresist is applied and patterned to define masks 451, which overlie the positions of the electrode structures to be formed from the electrode members 400, 404, 405. The layer of photoresist is then isotopically etched to form more narrow mask structures 452, as illustrated in FIGS. 42A-42B. The more narrow mask structures 452 are then used as an etch mask to define narrow sacrificial bridges 453 of the sacrificial material over the electrode layer, as shown in FIGS. 43A-43B.

Then, a side wall structure 454 is applied to the sacrificial bridges 453, which acts as an etch mask for the electrode structures in the electrode layer, that includes the electrode members 400, 404, 405, with the insulating members 402, 403.

Figure 44A:
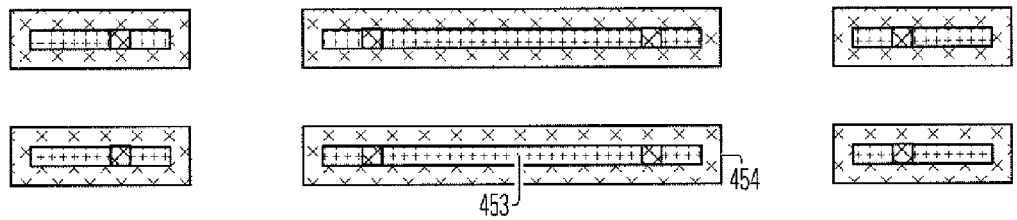
FIGS. 44A-44B illustrate a fifth step in a set of steps for manufacturing a bridge of memory material using an alternative damascene procedure.
Figure 44B:
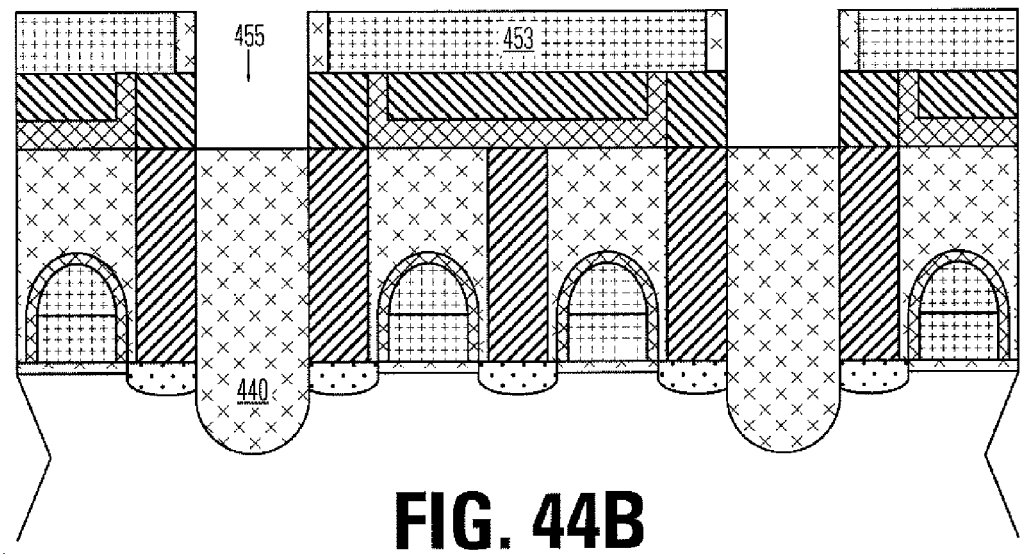
Figure 45:
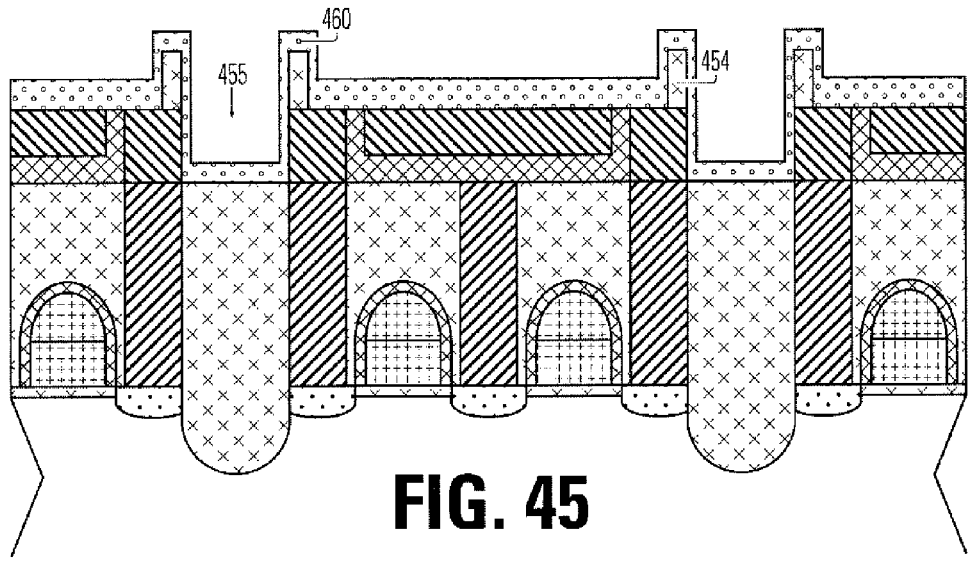
FIG. 45 illustrates a sixth step in a set of steps for manufacturing a bridge of memory material using an alternative damascene procedure.

FIGS. 44A-44B showed a result of etching the electrode layer using the etch masks formed by the sacrificial bridges 453 and side walls 454, resulting in trenches 455 down to the dielectric fill 440, and isolating the electrode structures. Following the etch, the bridges 453 of sacrificial material are removed, leaving the side wall structures 454, and a layer 460 of memory material is formed, covering the side wall structures 454 and in the trenches 455 in this technique, as shown in FIG. 45.

As shown in FIG. 46, the resulting structure is polished to remove the top portions of the layer 460, leaving portions 461 over the electrode structures and portions 462 within the trenches 455. A dielectric fill 464 is applied and planarized to form a structure shown in FIG. 46, which is ready for procedures to form vias, contact plugs and metallization as described above.

Figure 47:
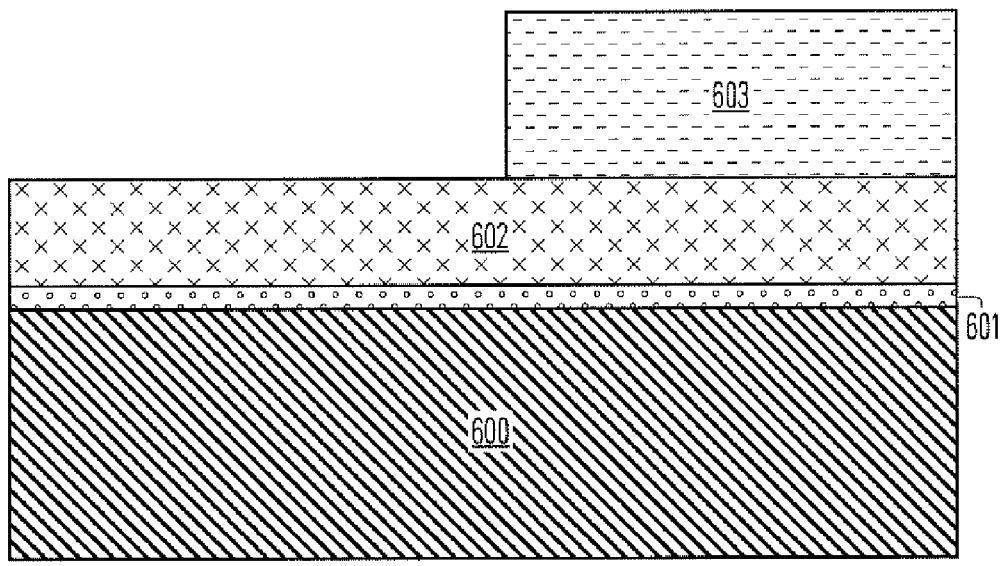
FIG. 47 illustrates a first step in a procedure for forming a narrow bridge of material, based on a two-sided, side wall mask procedure.
Figure 48:
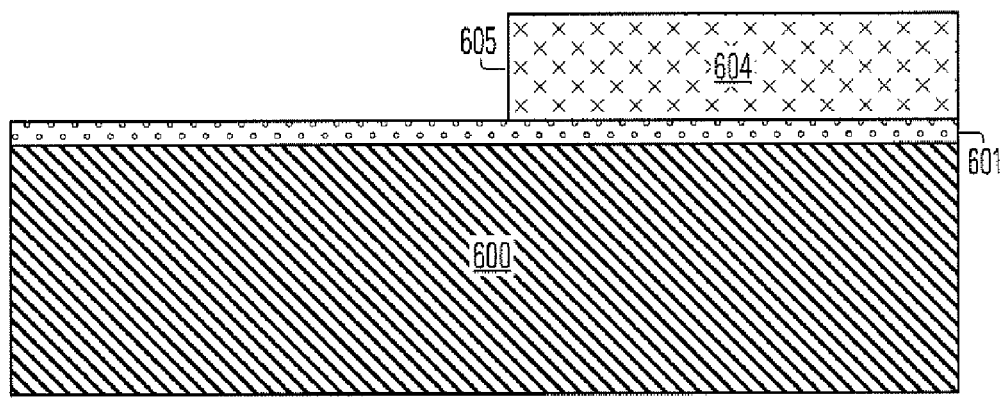
FIG. 48 illustrates a second step in a procedure for forming a narrow bridge of material, based on a two-sided, side wall mask procedure.

FIGS. 47 through 54A-54B illustrate another alternative technique for making narrow lines of material on a substrate, which can be applied to manufacturing the bridges of memory material over an electrode layer as described herein. As shown in FIG. 47, the process begins with providing a substrate 600 with a layer of material 601, such as the memory material described above. A protective cap layer may be included with the layer 601. A sacrificial layer 602 of material, such as silicon dioxide, silicon nitride, polysilicon or the like is formed over the layer 601. A layer of photoresist is applied and patterned to provide an etch mask 603 over the sacrificial layer 602. In an embodiment making bridges of memory material as described above, the etch mask 603 can be defined with a width that is perpendicular to the page which is about equal to the length of the bridge material over the electrodes. The etch mask 603 is used during etching of the sacrificial layer 602, and then stripped, to form the structure shown in FIG. 48, in which the layer 601 has a sacrificial layer 604 with a pattern defined by the etch mask 603, including a ledge 605.

Figure 49:
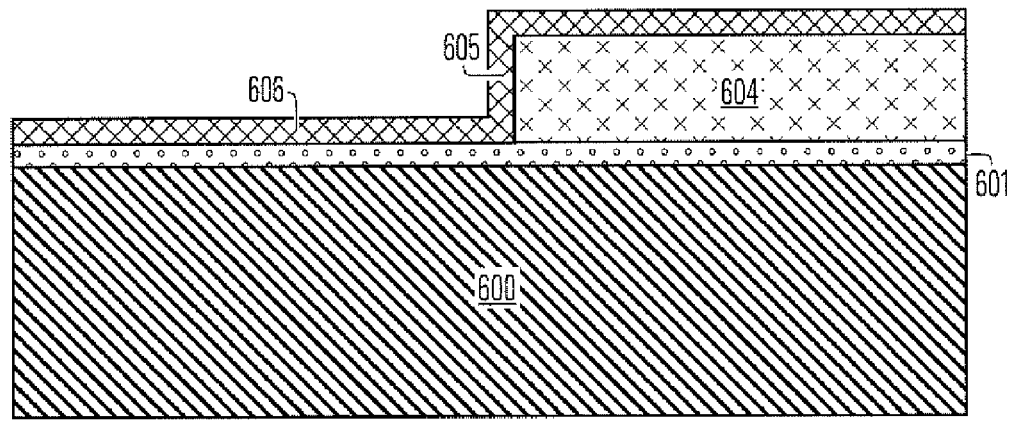
FIG. 49 illustrates a third step in a procedure for forming a narrow bridge of material, based on a two-sided, side wall mask procedure.
Figure 50:
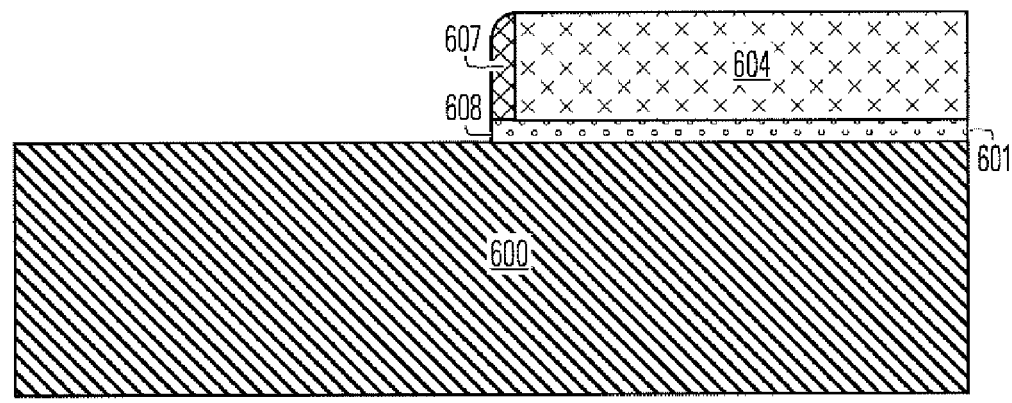
FIG. 50 illustrates a fourth step in a procedure for forming a narrow bridge of material, based on a two-sided, side wall mask procedure.

FIG. 49 shows a next step in which a layer 606 of sidewall material, such as a silicon nitride, silicon dioxide or polysilicon, is formed over the patterned sacrificial layer 604, and the layer 601. Next, as shown in FIG. 50, the sidewall material from layer 606 is etched anisotropically and selectively to form sidewall 607. The layer 601 is then etched, using the same etch step as applied for the sidewall etch, or using another etch exposure with an etch chemistry selective for the layer 601 and the cap layer, if any, stopping on the substrate 600, so that the end 608 of the layer 601 is beneath the sidewall structure 607, extending beyond the ledge 605 in the patterned sacrificial layer 604.

Figure 51:
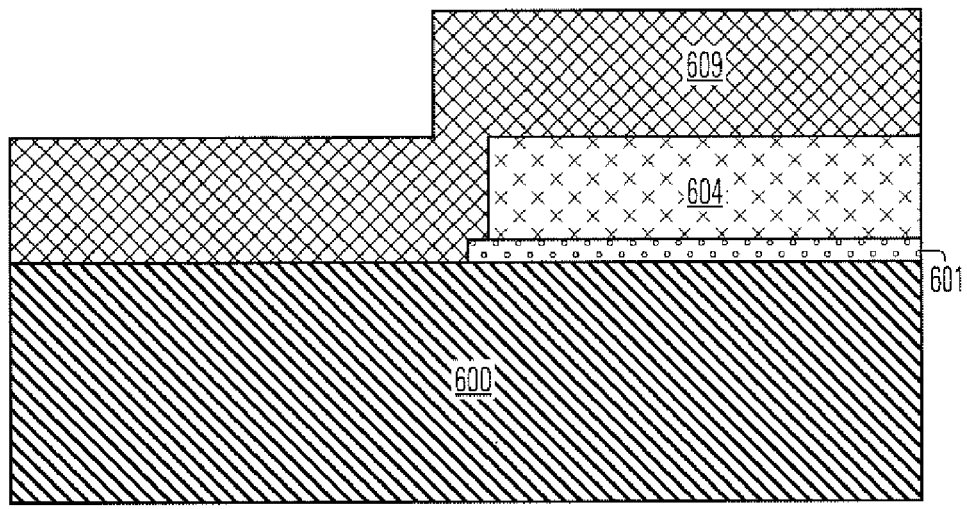
FIG. 51 illustrates a fifth step in a procedure for forming a narrow bridge of material, based on a two-sided, side wall mask procedure.
Figure 52:
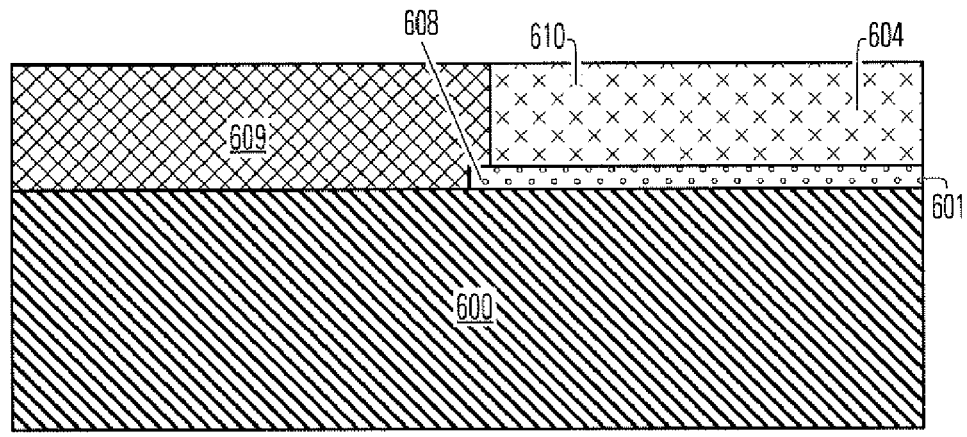
FIG. 52 illustrates a sixth step in a procedure for forming a narrow bridge of material, based on a two-sided, side wall mask procedure.

FIG. 51 shows the next step, in which a layer 609 of material, such as the material used to form the sidewall structure 607, is formed over the resulting structure. Next, a planarization technique is applied to remove the portions of the layer 609 that are over the sacrificial layer 604, exposing in the surface 610 of the sacrificial layer 604, as illustrated in FIG. 52, to subsequent etch processes. As can be seen, the end 608 of the layer 601 is beneath the still present sidewall, which in the case of layer 609 comprising the same material essentially merges with the remaining portions of layer 609. Optionally, the steps of depositing and planarizing the layer 609 can be skipped, and the sidewall structure 607 is left as a mask after removal of the sacrificial layer 604, as mentioned with respect to FIG. 53.

Figure 53:
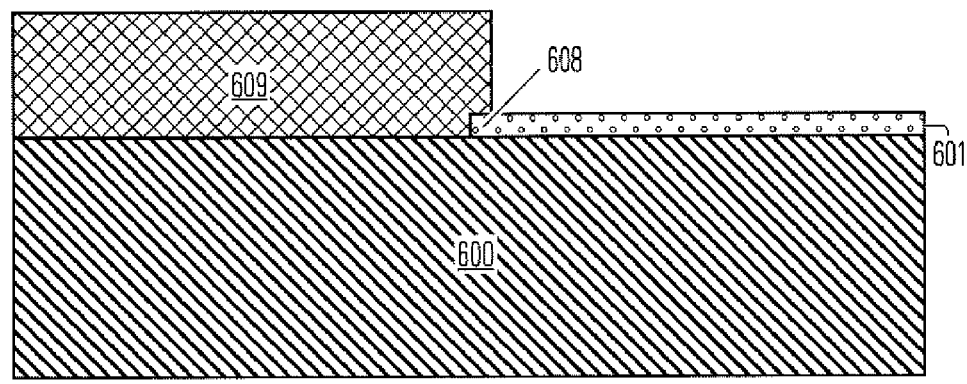
FIG. 53 illustrates a seventh step in a procedure for forming a narrow bridge of material, based on a two-sided, side wall mask procedure.

FIG. 53 shows the results of selectively etching the sacrificial layer 604, leaving the side wall structure 607 and (optionally) remaining portions of the layer 609, and the layer 601 extending beneath the side wall on the edge of the remaining portions of the layer 609.

Figure 54A:
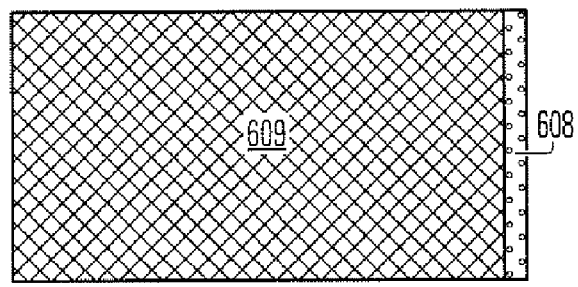
FIGS. 54A-54B illustrate an eighth step in a procedure for forming a narrow bridge of material, based on a two-sided, side wall mask procedure.
Figure 54B:
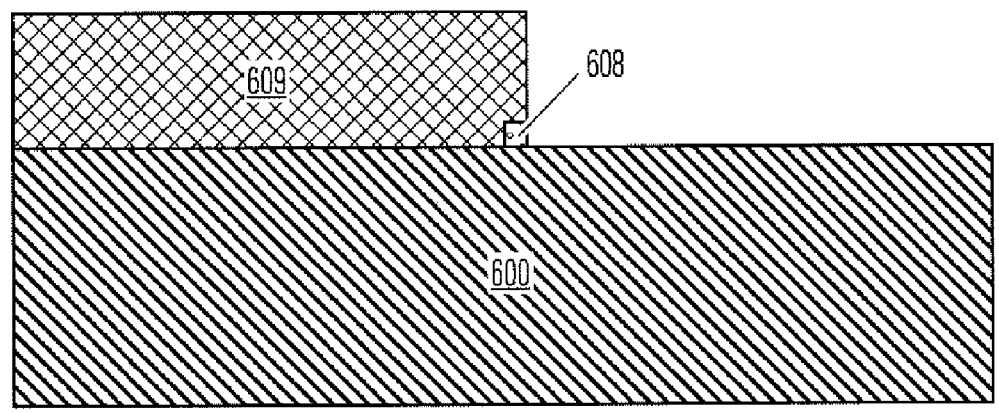

FIGS. 54A-54B illustrate a next step in the formation of the narrow line at the end 608 of material by a sidewall masking technique. In FIG. 54A, a top view of the layer 609 with the thin line at the end 608 of material from layer 601 underneath the edge shown (it is actually beneath the edge of the layer 609 as shown in FIG. 54B), after removal of the portions of layer 601 not protected by the material 609.

FIG. 54B illustrates a side view, in which the end 608 of the layer 601 is protected by the material 609 over the substrate 600. This manner, a narrow line of material is formed, such as a narrow line of memory material used for the bridges in the memory cell structure described above, which has a sub-lithographic width and a sub-lithographic thickness, both of which can be defined by thin film thicknesses.

FIGS. 55-65 illustrate a structure and process based on use of dual-damascene structures for the electrode layer. In a dual-damascene (DD) structure, a dielectric layer is formed in a two level ("dual") pattern where a first level of the pattern defines trenches for conductor lines and a second level defines vias for connection to underlying structure. A single metal deposition step can be used to simultaneously form conductor lines and deposit material in the vias for connecting the conductor lines to underlying structure. The vias and trenches can be defined by using two lithography steps. Trenches are typically etched to a first depth, and the vias are etched to a second depth making openings for contact to underlying structure. After the vias and trenches are etched, a deposition step fills both the vias and the trenches with metal or other conductive material. After filling, the excess material deposited outside the trench can removed by a CMP process, and a planar, dual-damascene structure with conductor inlays is achieved.

Figure 55:
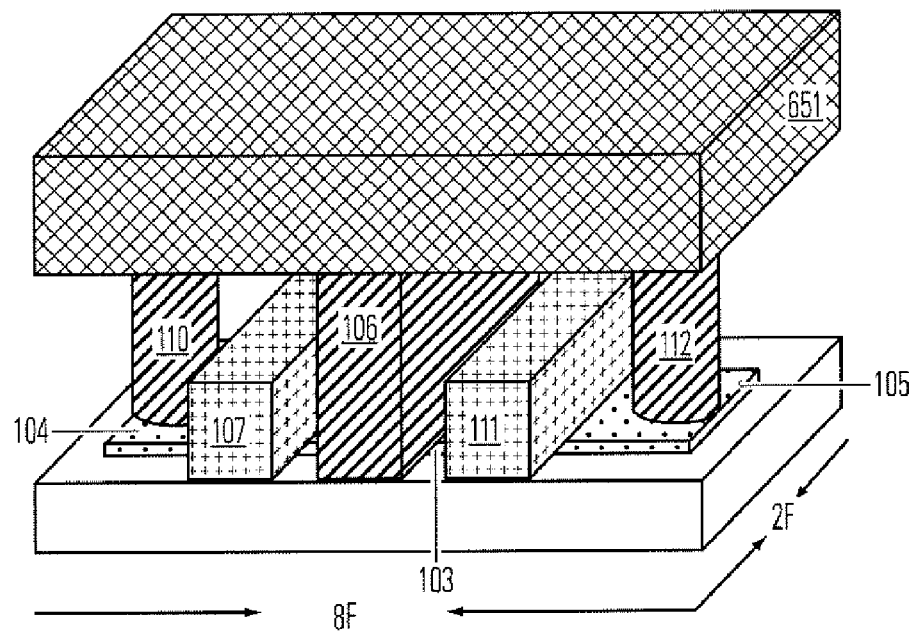
FIG. 55 illustrates a first step in a dual damascene procedure used to form the electrode layer for a memory device as described herein.
Figure 56:
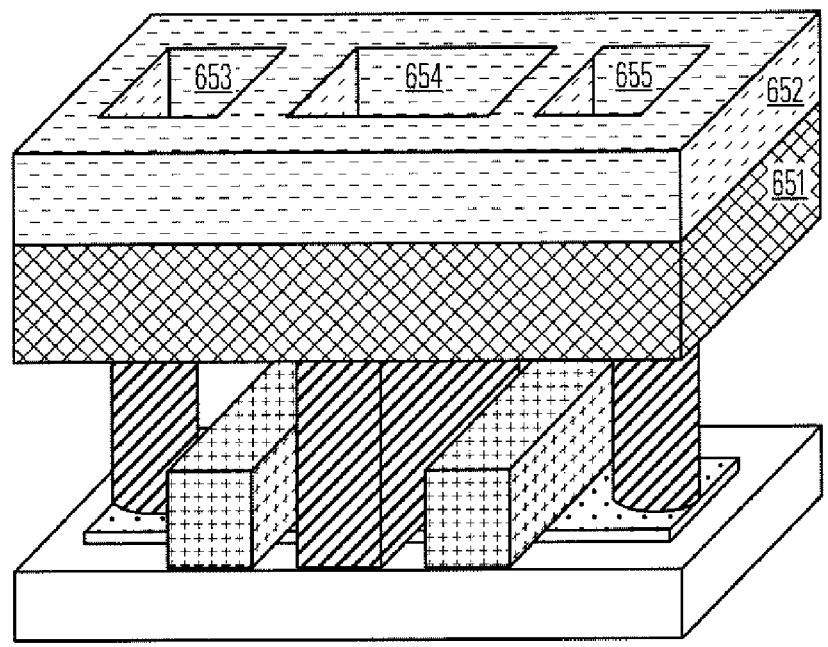
FIG. 56 illustrates a second step in a dual damascene procedure used to form the electrode layer for a memory device as described herein.

As shown in FIG. 55, in the dual-damascene process, a layer 651 of material, usually a dielectric, is formed over the front-end-of-line structures, and acts as a layer in which damascene electrodes are inlaid. The damascene process includes a first patterned photoresist layer 652 which overlies the layer 651, as shown in all FIG. 56. The first patterned photoresist layer 652 defines the positions 653, 654, 655 of trenches to be etched in the layer 651, which correspond to the electrode members in the damascene electrode structure.

Figure 57:
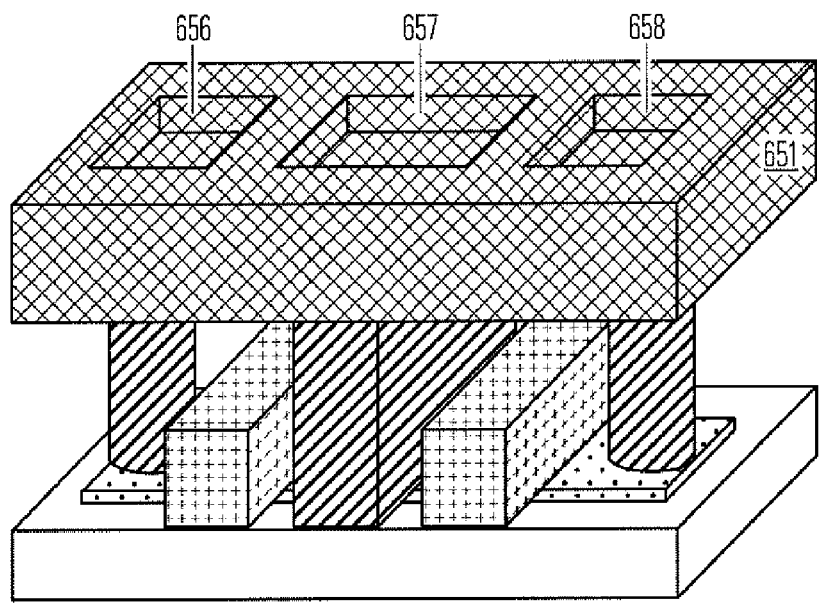
FIG. 57 illustrates a third step in a dual damascene procedure used to form the electrode layer for a memory device as described herein.
Figure 58:
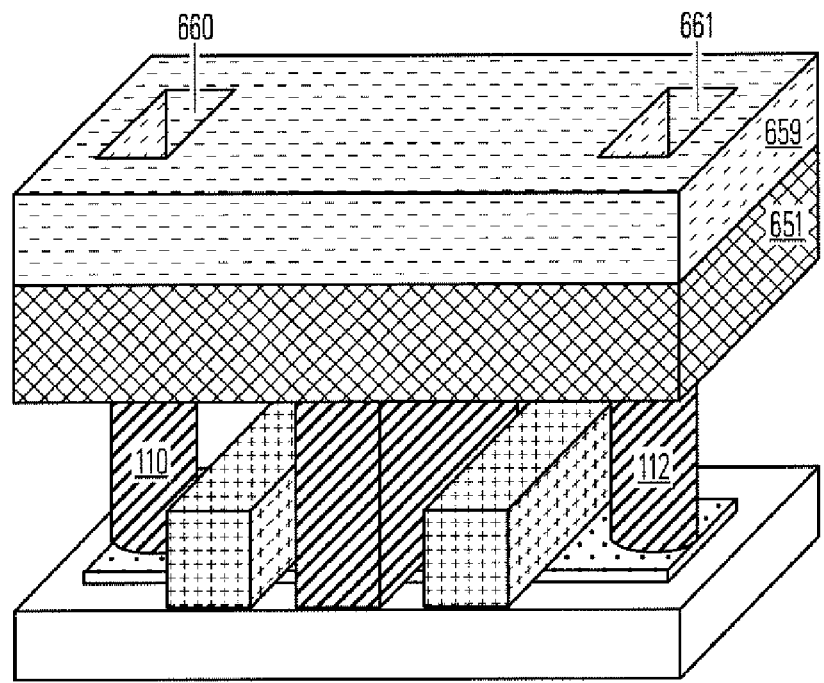
FIG. 58 illustrates a fourth step in a dual damascene procedure used to form the electrode layer for a memory device as described herein.
Figure 59:
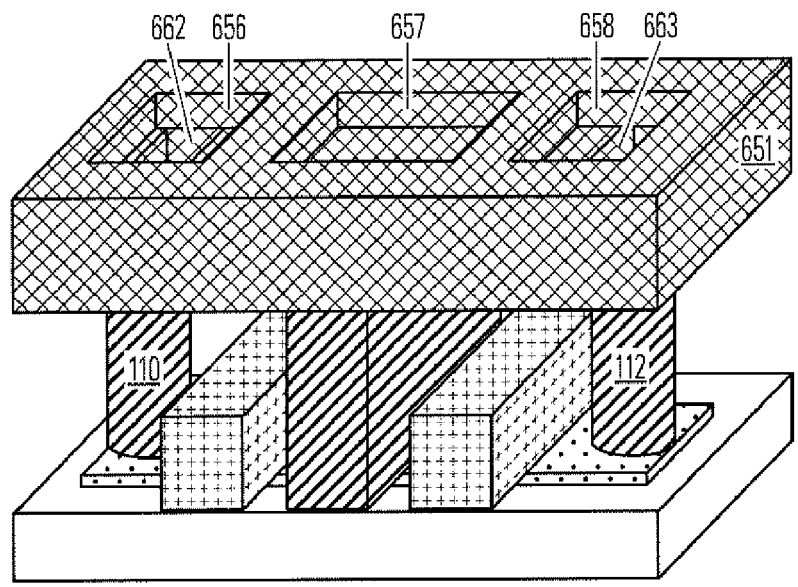
FIG. 59 illustrates a fifth step in a dual damascene procedure used to form the electrode layer for a memory device as described herein.

Using the patterned photoresist layer 652 as a mask, the layer 651 is etched to a first depth to that is not completely through the layer 651 to form more shallow trenches 656, 657, 658 as shown in FIG. 57. Next, a second patterned photoresist layer 659 is formed over the layer 651. The second patterned photoresist layer 659 defines the positions 660, 661 for contact to the plugs 110, 112 by the electrode members. Using the second patterned photoresist layer 659 as a mask, the layer 651 is etched completely through to the plugs 110, 112, to form deeper trenches 662, 663 within the more shallow trenches 656, 657, 658, as shown in FIG. 59.

Figure 60:
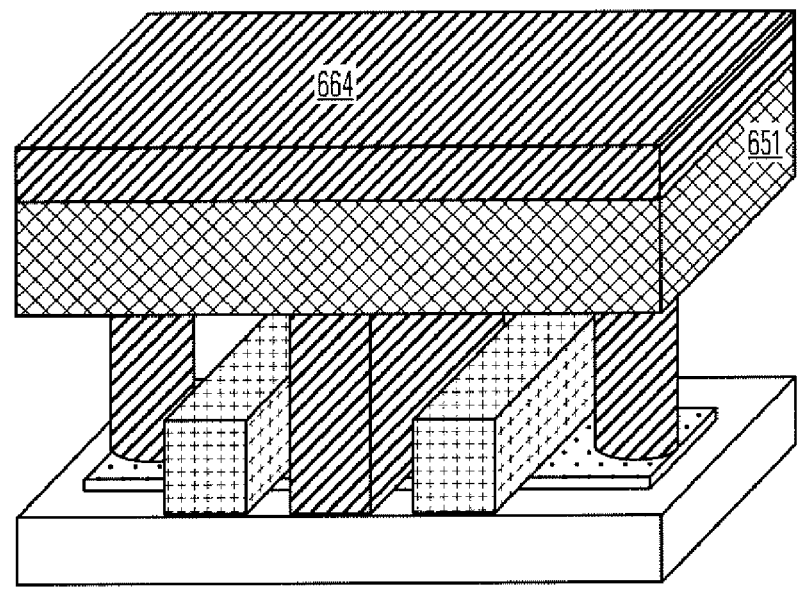
FIG. 60 illustrates a sixth step in a dual damascene procedure used to form the electrode layer for a memory device as described herein.
Figure 61:
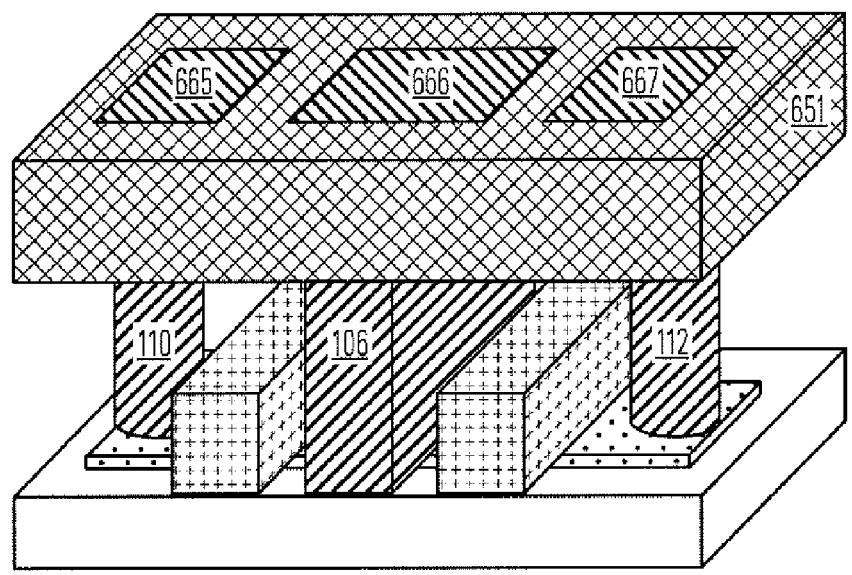
FIG. 61 illustrates a seventh step in a dual damascene procedure used to form the electrode layer for a memory device as described herein.

The resulting dual-trenched layer 651 is filled by a metal, such as copper, or a copper alloy, with appropriate adhesion and barrier layers as known in the art to form the layer 664 illustrated in FIG. 60. As shown in FIG. 61, chemical mechanical polishing or another step is applied to remove the portions of the metal layer 664 down to the dielectric 651, resulting in an electrode layer having a dual-damascene structure, with the electrode structures 665, 666, 667. The electrode structures 665 and 667 have contacts extending down to the plugs 110 and 112, while electrode structure 666 is isolated from the source line 106.

Figure 62:
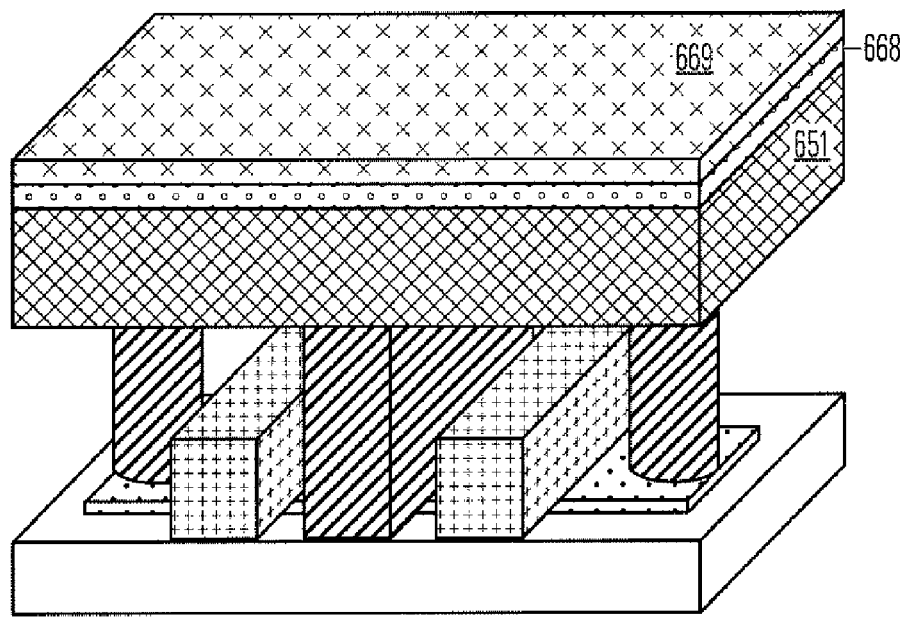
FIG. 62 illustrates a eighth step in a dual damascene procedure used to form the electrode layer for a memory device as described herein.
Figure 63:
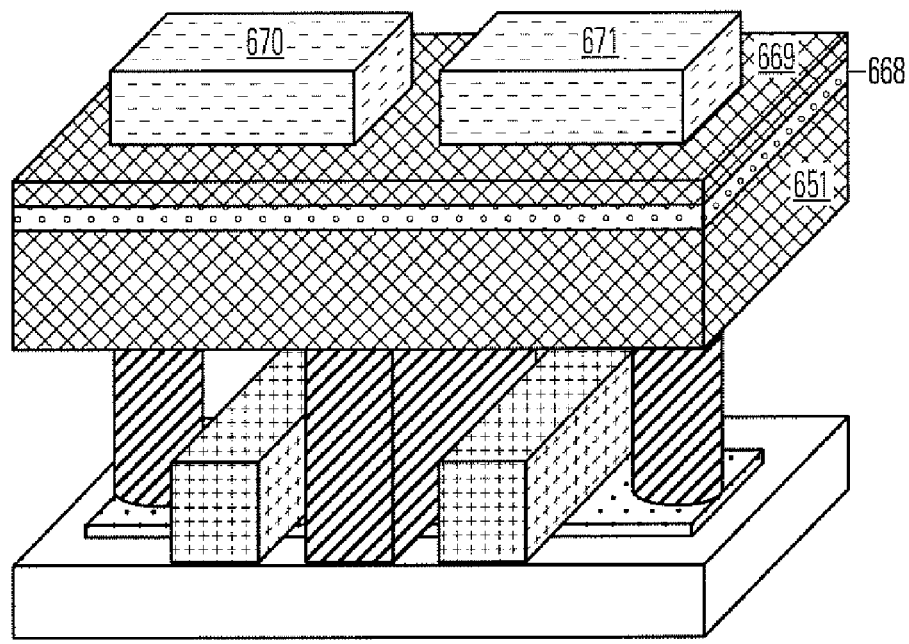
FIG. 63 illustrates a ninth step in a dual damascene procedure used to form the electrode layer for a memory device as described herein.
Figure 64:
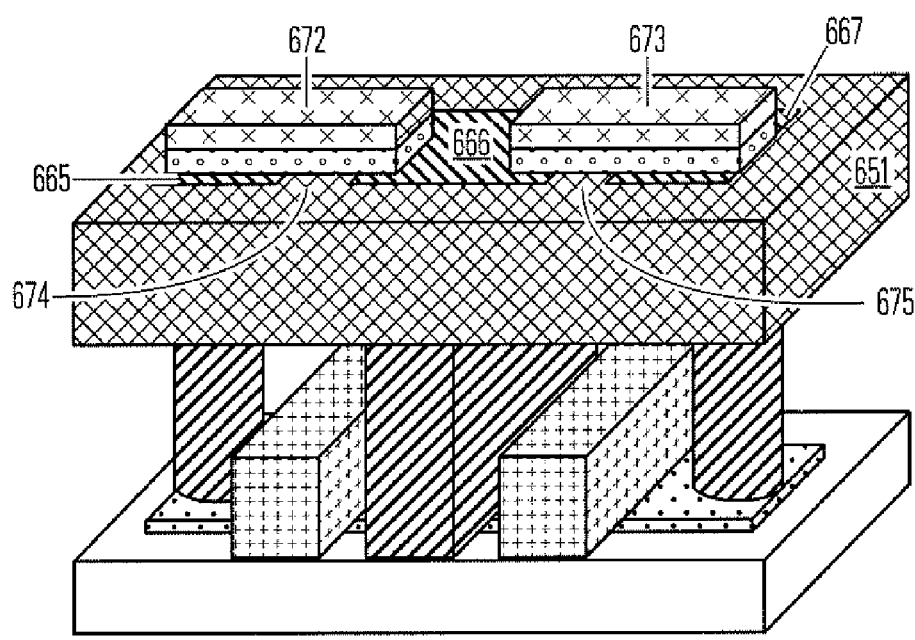
FIG. 64 illustrates a tenth step in a dual damascene procedure used to form the electrode layer for a memory device as described herein.

In the next step, shown by FIG. 62, a layer of memory material 668 and a protective cap layer 669 are formed over the electrode layer 651. The patterned photoresist layer including masks 670 and 671 is formed over the layer 669, as illustrated in FIG. 63. The masks 670 and 671 define the positions of the bridges of memory material for the memory cells. Then, an etch step is applied to remove the layer 669 and the layer of memory material 668 in the regions uncovered by the masks 670 and 671, leaving bridges 672, 673 of memory material. The bridge 672 extends from the electrode structure 665 to the electrode structure 666 across an insulating member 674. The width of the insulating member 674 defines the length of the inter-electrode path through the bridge 672 of memory material. The bridge 673 extends from the electrode structure 667 to the electrode structure 666 across an insulating member 675. The width of the insulating member 675 defines the length of the inter-electrode path through the bridge 673 of memory material.

Figure 65:
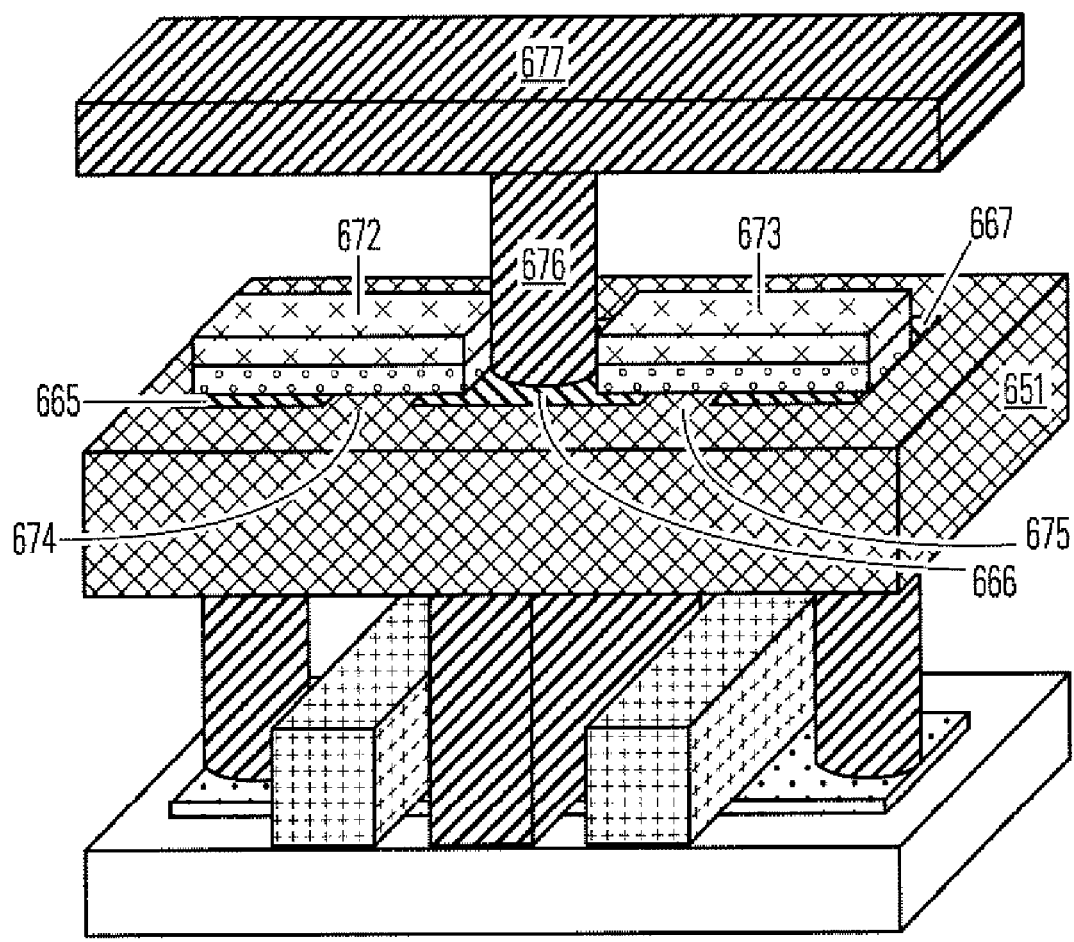
FIG. 65 illustrates an eleventh step in a dual damascene procedure used to form the electrode layer for a memory device as described herein.

As illustrated in FIG. 65, after defining the bridges 672, 673, the dielectric fill (not shown) is applied and planarized. Then vias are etched in the dielectric fill over the electrode member 666. The vias are filled with a plug, such as tungsten, to form conductive plug 676. A metal layer is patterned to define bit line 677 which contact the plug 676, and is arranged along columns of memory cell pairs having a structure illustrated in FIG. 65.

Figure 66:
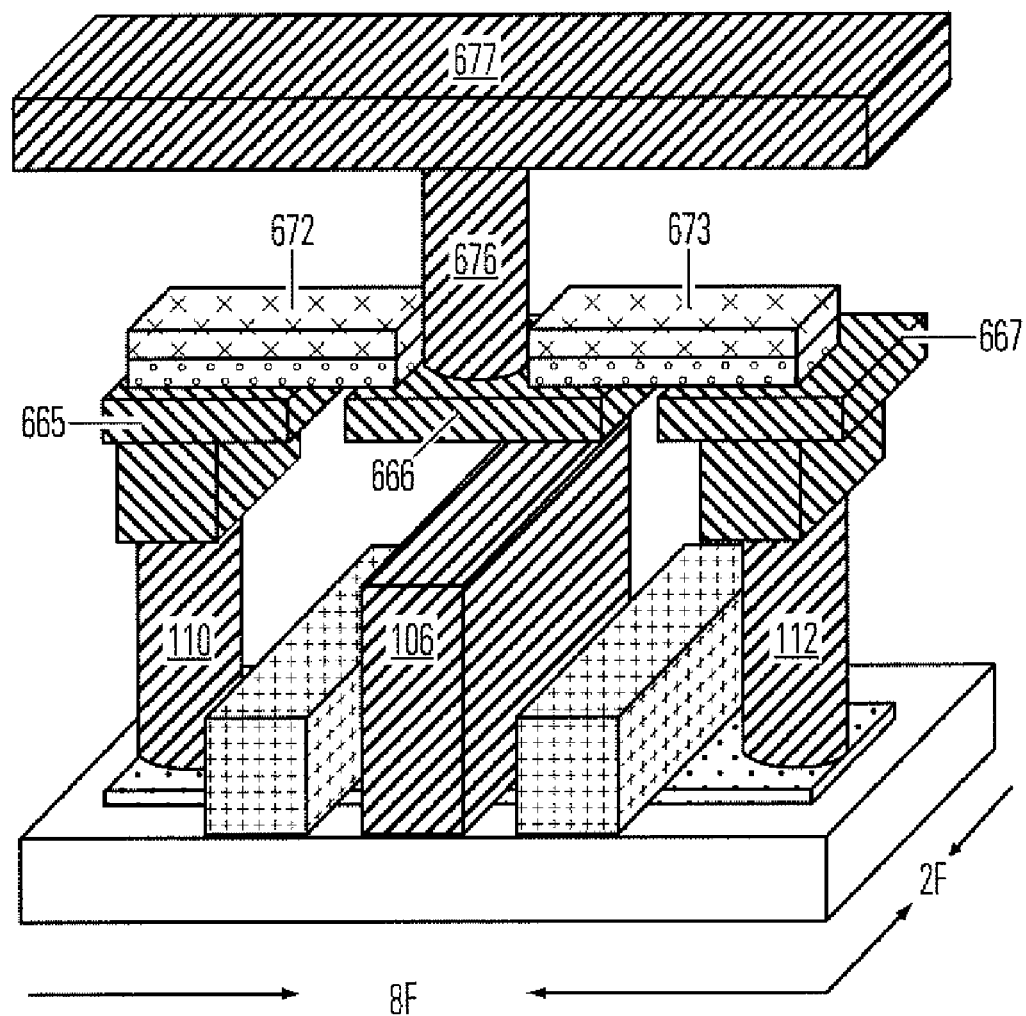
FIG. 66 provides an alternative perspective of the structure shown in FIG. 65.

FIG. 66 illustrates the resulting structure from the dual-damascene electrode layer process, with the dielectric material from the electrode layer 651, shown in FIG. 65 removed for perspective. As can be seen, the electrode structures 665 and 657 extend down to contact the tungsten plugs 110, 112, while the electrode structure 666 is isolated from the source line 106. Also illustrated in FIG. 66 are dimensions for the layout of the cell. The basic two memory cell structure can be laid out according to this manufacturing process in an area that is about 8F by about 2F, where F is the minimum feature size for the lithographic process, transferring a pattern lithographically from a mask to the device being manufactured, and used to manufacture the device, and defines the limits of the thickness of the insulating member between the electrodes and the width of the bridges across the electrodes. A significant portion of the 8F length of the layout is consumed by the need to provide for alignment tolerances for manufacturing of the plugs 110, 112.

Figure 67:
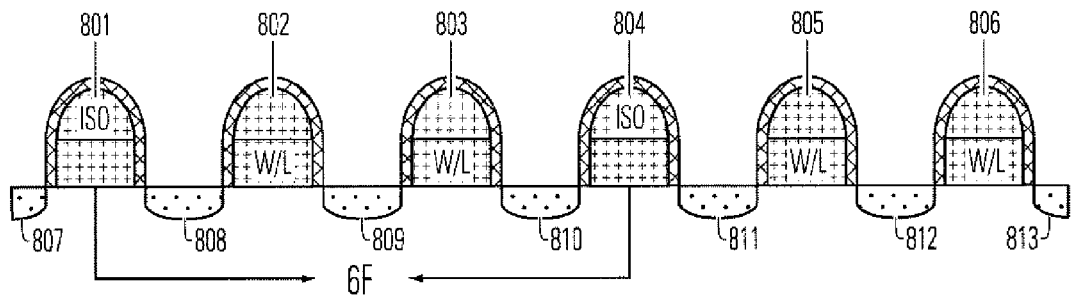
FIG. 67 illustrates a first step of the front-end-of-line processes forming self-aligned contacts with an implementation of a memory architecture described herein.

FIGS. 67-72 illustrate an alternative approach to manufacturing the front-end-of-line structures with self-aligned contact vias for connection to the electrode layer, allowing for smaller footprints in the memory cell layout. The process includes laying out a plurality of parallel conductive lines, manufactured for example using polysilicon with silicide caps, and forming implants to provide source and drain terminals between the parallel conductive lines. A cross-section of the structure resulting from these steps is shown in FIG. 67, in which the parallel conductive lines 801-806 overlying a semiconductor substrate having doped regions 807-813 which define source and drain terminals between the conductive lines 801-806. In the illustrated embodiment, the conductive lines 802, 803 and 805, 806 act as a word lines for access transistors. The conductive lines 801 and 804 act as bias lines used to prevent inversion between the source and drain terminals 807, 809, and 811, 812 respectively. Thus, the conductive lines 801, 804 are isolation lines for isolation transistors, replacing the isolation trenches in the embodiments described previously. Thus, as illustrated, the length of the layout for a basic two memory cell structure can be reduced to about 6F, using a self-aligned contact structure process which is shown in FIGS. 68-71.

Figure 68:
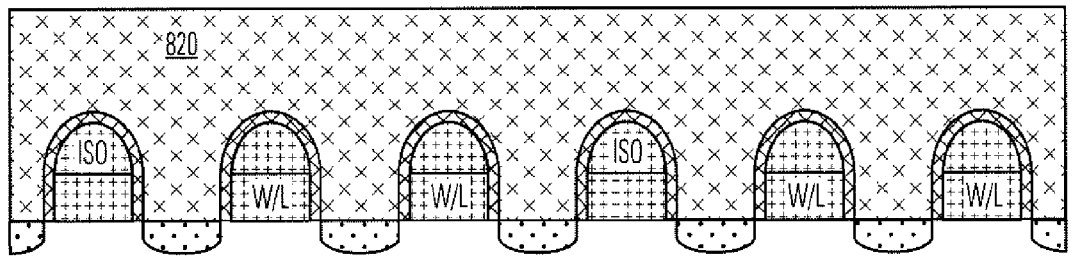
FIG. 68 illustrates a second step of the front-end-of-line processes forming self-aligned contacts with an implementation of a memory architecture described herein.
Figure 69:
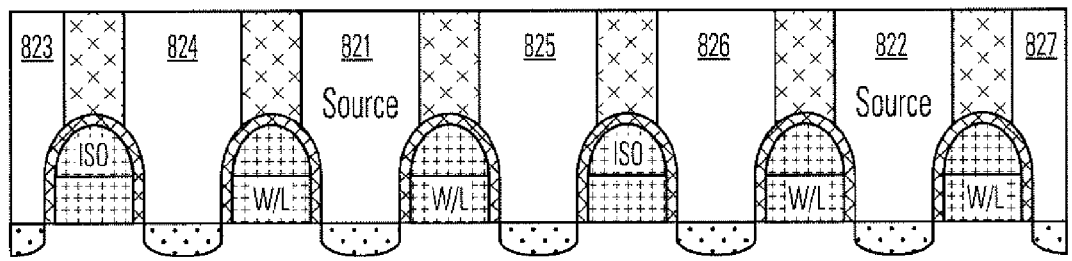
FIG. 69 illustrates a third step of the front-end-of-line processes forming self-aligned contacts with an implementation of a memory architecture described herein.
Figure 70:
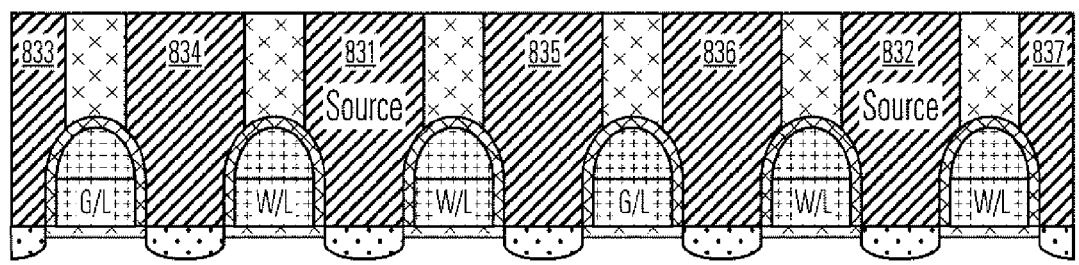
FIG. 70 illustrates a fourth step of the front-end-of-line processes forming self-aligned contacts with an implementation of a memory architecture described herein.

A first step in the illustrated embodiment of the self-aligned contact structure process is to form a fill layer 820 over the parallel conductive lines 801-806, as shown in FIG. 68. Next, the fill layer 820 is etched using a lithographic process to define the position for source lines 821, 822 and for the plugs 823, 824, 825, 826, 827. Any misalignment tolerances of the lithographic process are compensated for by relying on the parallel conductive lines as self-aligned etch masks as known in the art. The trenches in the dielectric fill layer 820 are filled with a conductive material, such as a tungsten plug material, to define the plugs 833-837 and source lines 831, 832 as illustrated in FIG. 70.

Figure 71:
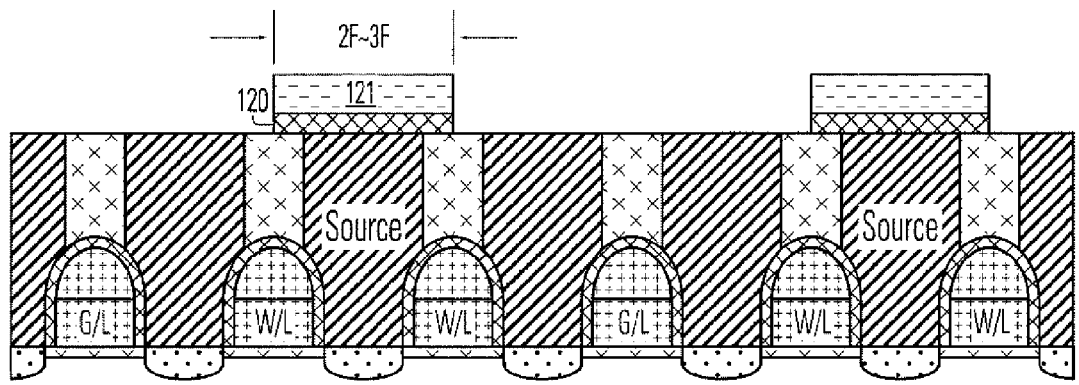
FIG. 71 illustrates a fifth step of the front-end-of-line processes forming self-aligned contacts with an implementation of a memory architecture described herein.

Next, as illustrated in FIG. 71, the electrode layer is formed using a process, like that starting at FIGS. 11A-11B above for example, forming patterned structures that comprise a layer of silicon nitride 120 with a layer of titanium nitride 121 on topped provide an electrode structure isolated from the source line 831. FIG. 71 illustrates that the dimension of the electrode structure comprised of layers 120 and 121 is between 2F and 3F, allowing for smaller layout of the memory cell structure. The balance of the procedure for forming the electrode layer and bridges of memory material is carried out according to procedures as described above.

Figure 72:
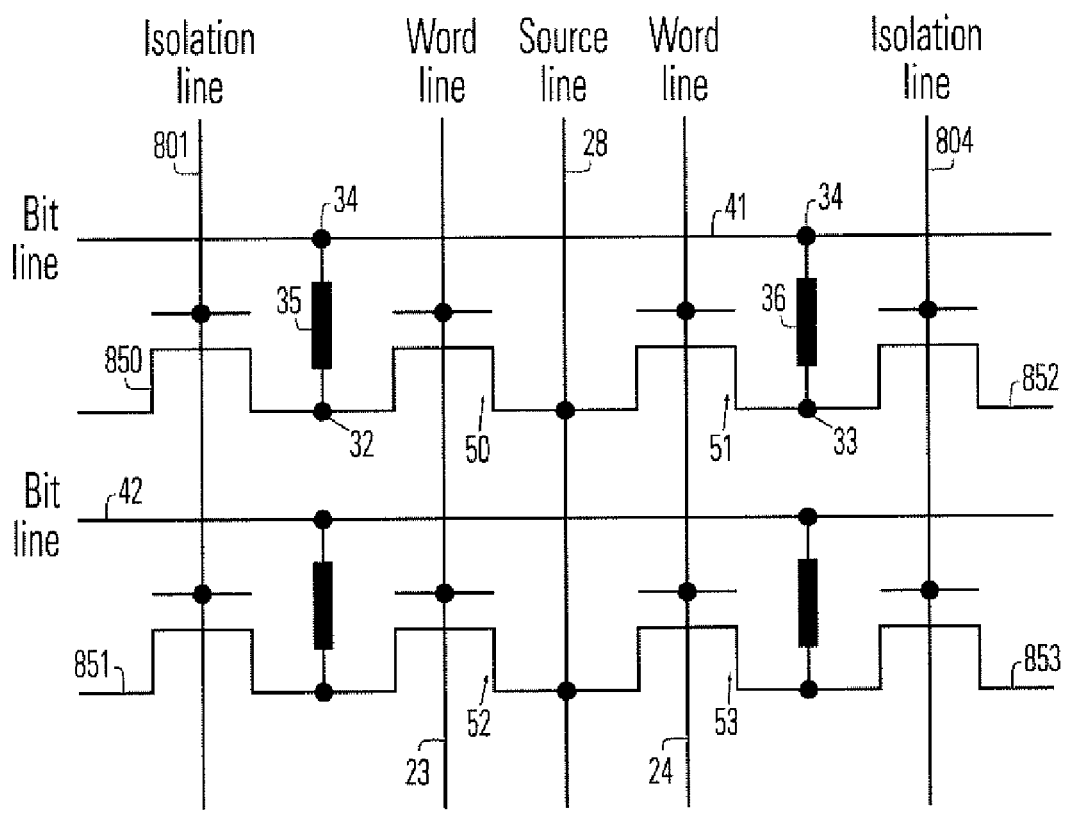
FIG. 72 shows an array architecture for a memory device using the structure of FIG. 71.

FIG. 72 is a schematic illustration of a memory array, like that of FIG. 7, with the addition of the isolation lines, which can be implemented as described with reference to FIGS. 5 and 6, modified by the self-aligned contact structure of FIG. 71. Thus, reference numerals for elements of FIG. 72 match corresponding elements in the structure of FIG. 7. It will be understood that the array structure illustrated in FIG. 72 can be implemented using other cell structures. In a schematic illustration of FIG. 72, the common source line 28, the word line 23 and the word line 24 are arranged generally parallel in the Y-direction. Isolation conductive lines 801 and 804 also lie parallel to the Y-direction. Bit lines 41 and 42 are arranged generally parallel in the X-direction. Thus, a Y-decoder and a word line driver are coupled to the word lines 23, 24. A bias source is coupled to the conductive lines 801, 804, which applies ground potential or other potential, to isolate the two-cell structures. An X-decoder and set of sense amplifiers are coupled to the bit lines 41 and 42. The common source line 28 is coupled to the source terminals of access transistors 50, 51, 52 and 53. The gate of access transistor 50 is coupled to the word line 23. The gate of access transistor 51 is coupled to the word line 24. The gate of access transistor 52 is coupled to the word line 23. The gate of access transistor 53 is coupled to the word line 24. The drain of access transistor 50 is coupled to the electrode member 32 for bridge 35, which is in turn coupled to electrode member 34. Likewise, the drain of access transistor 51 is coupled to the electrode member 33 for bridge 36, which is in turn coupled to the shared electrode member 34. The electrode member 34 is coupled to the bit line 41. For schematic purposes, the electrode member 34 is illustrated at separate locations on the bit line 41. It will be appreciated that separate electrode members can be utilized for the separate memory cell bridges in other embodiments. Access transistors 52 and 53 are coupled to corresponding memory cells as well on line 42. It can be seen that the common source line 28 is shared by two rows of memory cells, where a row is arranged in the Y-direction in the illustrated schematic. Likewise, the electrode member 34 is shared by two memory cells in a column in the array, where a column is arranged in the X-direction in the illustrated schematic. The isolation conductive lines 801, 804 bias the transistors 850, 851, 852, 853 in an off condition, preventing current flow between the drain terminals of adjacent memory cells.

Figure 73:
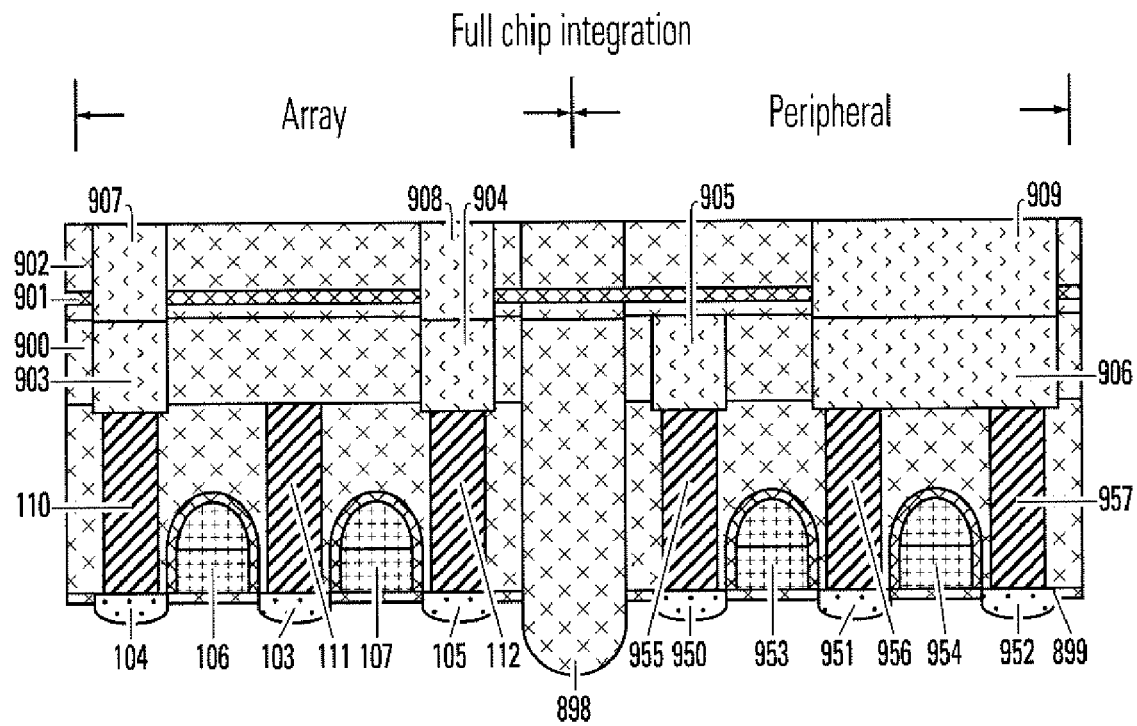
FIG. 73 illustrates a stage in manufacturing in an alternative embodiment for making an embedded memory with multiple conductor layers.

FIGS. 73-80 illustrate stages in manufacturing of another embodiment of a memory device based on phase change bridges. The embodiment described is suitable for making an embedded memory on an integrated circuit that includes multiple layers of metallization, or multiple layers of patterned conductors arranged for interconnecting components on the device. FIG. 73 shows a semiconductor substrate 899 having an array region and a peripheral region divided by an isolation structure 898, such as a dielectric filled trench. The substrate comprises integrated circuit components having terminals including doped regions in the semiconductor substrate. In the peripheral region, components of functional circuits adapted to process data are included. In the array region components of access circuits for an array of programmable memory cells are included. As shown in FIG. 73 in the array region, doped regions 103, 104, 105 are included which correspond to a common source terminal, and first and second drain regions, respectively, for access structures as described in detail above. Word lines 106 and 107 are used for coupling the terminals 103 and 104, or the terminals 103 and 105 to a common source line 111 as described above. Conductive plugs 110 and 112 are arranged for connecting the terminals 104 and 105 to patterned conductors 903, 904 respectively, in overlying layer including dielectric 900.

In the peripheral region, doped regions 950, 951, 952, and gates 953, 954 are configured as transistors for function circuitry. Conductive plugs 955, 956, 957 are arranged for connecting the terminals 950, 951, 952 to patterned conductors 905, 906 in overlying layer including dielectric 900.

In the embodiment shown, a second patterned conductor layer is included. The patterned conductor layer includes an interlayer dielectric fill 902 and an etch stop layer 901. For example, the interlayer dielectric 902 may comprise one or more layers of silicon dioxide or doped silicon dioxide, and the etch stop layer 901 may comprises silicon nitride. Patterned conductors are included within the interlayer dielectric fill, including conductors 907 and 908 in contact with conductors 903 and 904 in the array region, and conductor 909 in contact with conductor 906 in the peripheral region.

Figure 74:
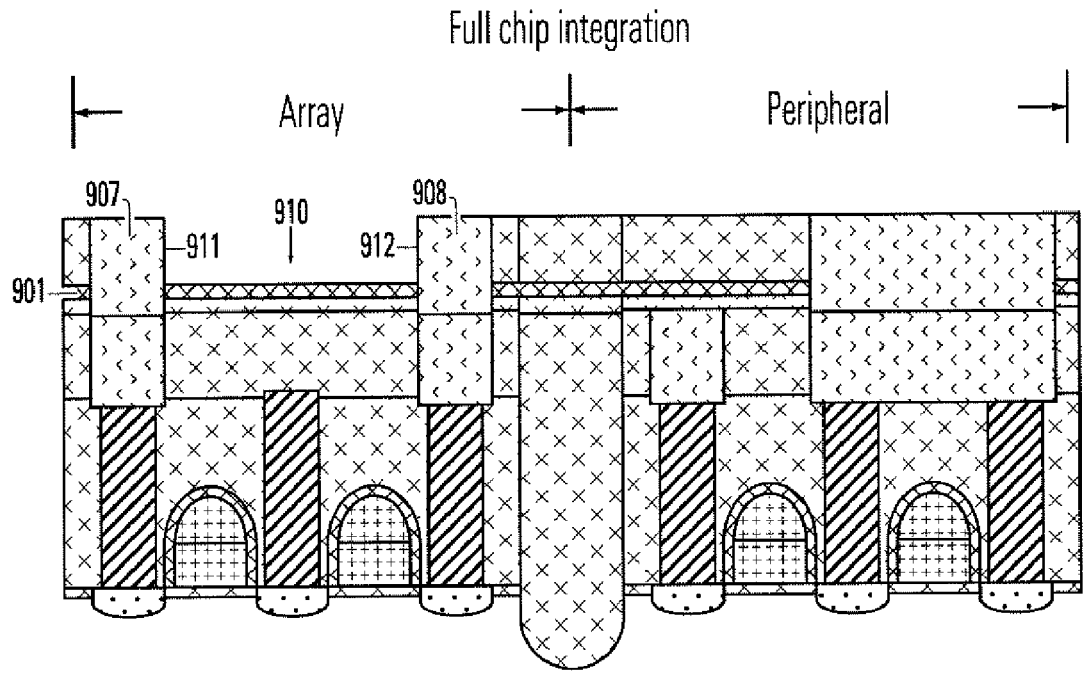
FIG. 74 illustrates a further stage in manufacturing the alternative embodiment for making an embedded memory including results of an electrode trench etch in an interlayer dielectric.

FIG. 74 illustrates the results of a patterned trench etch used to define trenches, such as trench 910 in the array region. The trenches extend between conductor members 907, 908, and expose the sidewalls 911, 912. The trenches are etched to stop on the etch stop layer 901. Although only one trench is illustrated in FIG. 74, in an array of memory devices, a large number of such trenches is etched. After etching, the photoresist used for defining the patterns is stripped.

Figure 75:
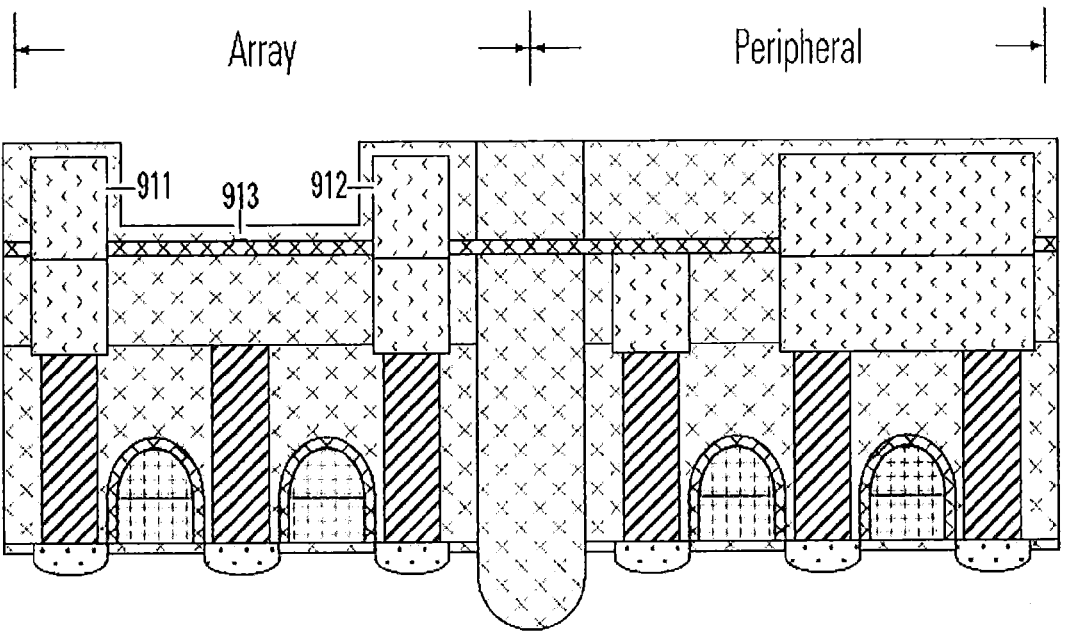
FIG. 75 illustrates a further stage in manufacturing the alternative embodiment for making an embedded memory including results of conformal deposition of an insulating film.

FIG. 75 illustrates results of a conformal deposition of an insulating layer 913. Insulating layer comprises silicon dioxide or another insulating material deposited using plasma enhanced chemical vapor deposition or other techniques known in the art. The thickness of the layer 913 is arranged so that the thickness of the material covering the sidewalls 911, 912 ranges from about 10 nanometers to about 30 nanometers in a representative embodiment.

Figure 76:
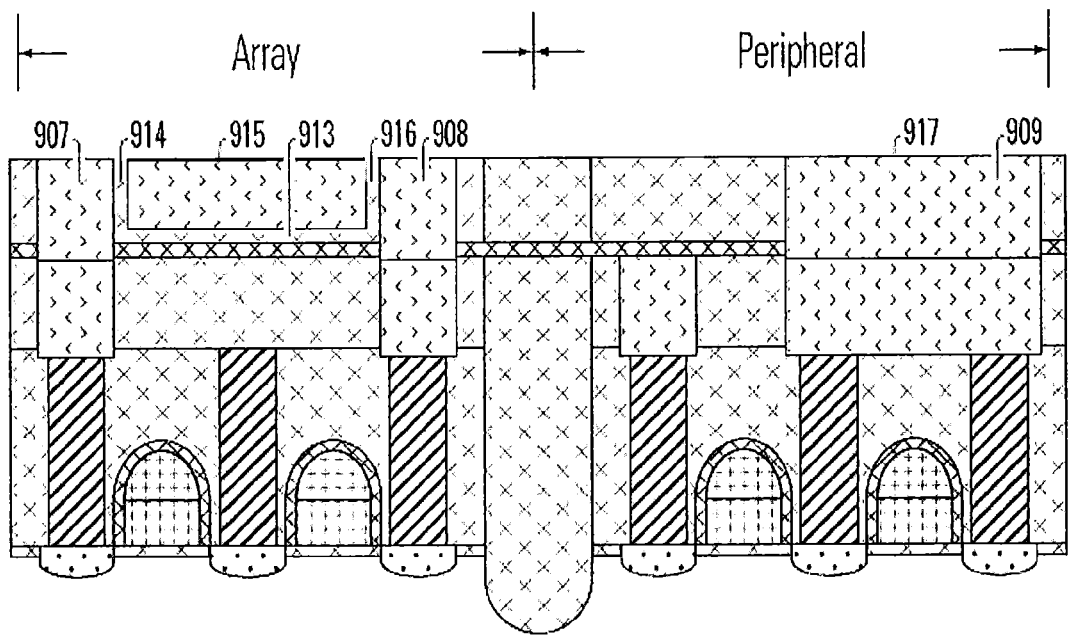
FIG. 76 illustrates a further stage in manufacturing the alternative embodiment for making an embedded memory including results of deposition and planarization of an electrode member in the interlayer dielectric.

FIG. 76 illustrates results of deposition of a metal, using a process such as a copper metallization, and etchback using chemical mechanical polishing or other techniques. The resulting structure exposes surfaces 914, 916 of the layer 913 on the sidewalls 911, 912 and an electrode member 915 having a surface which is coplanar with the surface of the conductor members 907, 908, and the surfaces 914, 916 of the insulating layer 913. Also, the surface 917 of the conductor member 909 is exposed after the etchback process. Other embodiments may use tungsten, aluminum, titanium nitride, tantalum nitride or other conductive materials for the electrode member 915.

Figure 77:
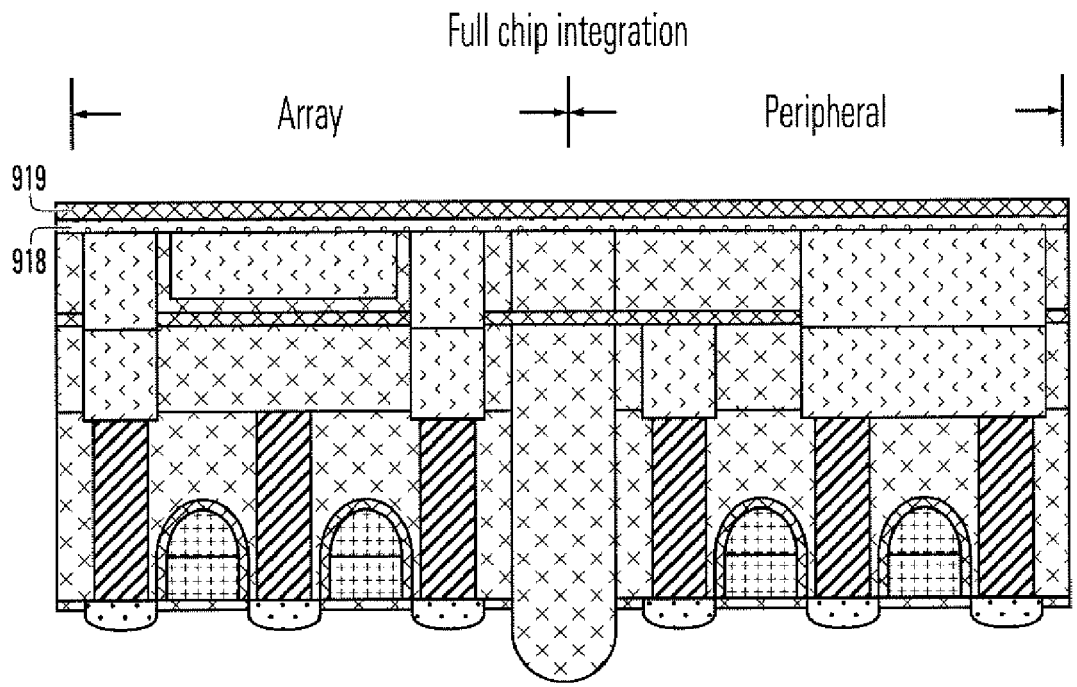
FIG. 77 illustrates a further stage in manufacturing the alternative embodiment for making an embedded memory including results of deposition of a layer of phase change material and a protective cap layer.

FIG. 77 illustrates the results of deposition of a layer phase change material 918 by techniques such as sputtering, and a layer of protective material 919, such as silicon nitride, silicon oxide, or other electrically insulating material formed by techniques such as a low-temperature CVD process. Also, the layer 919 may be thermally insulating in addition to electrically insulating, and may comprise a composite of electrically and thermally insulating materials.

Figure 78:
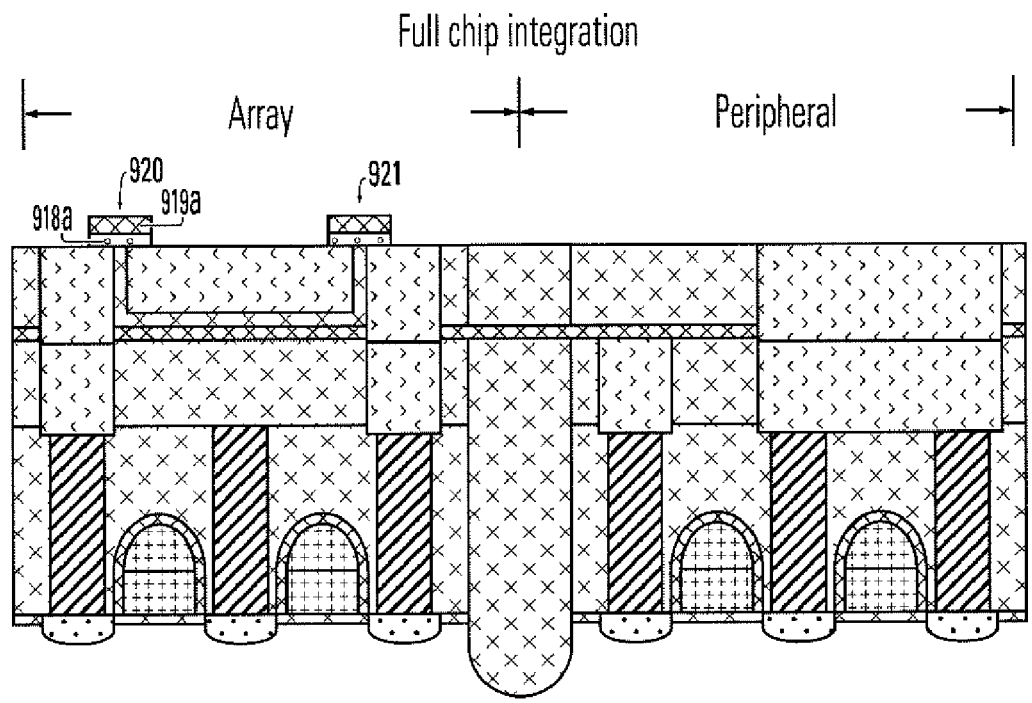
FIG. 78 illustrates a further stage in manufacturing the alternative embodiment for making an embedded memory including results of patterning the phase change layers to defined phase change bridges.

FIG. 78 illustrates the results of patterning the phase change material to defined phase change bridges 920, 921 which comprise the material 918*a* and 919*a* left after a patterned etch of the layer 918 of phase change material and layer 919 of protective material. The patterned etch may be executed using a photoresist mask, a hard mask or other technique, and may be trimmed or otherwise processed to make the width of the bridge sub-lithographic, as described in detail above with respect to other embodiments.

Figure 79:
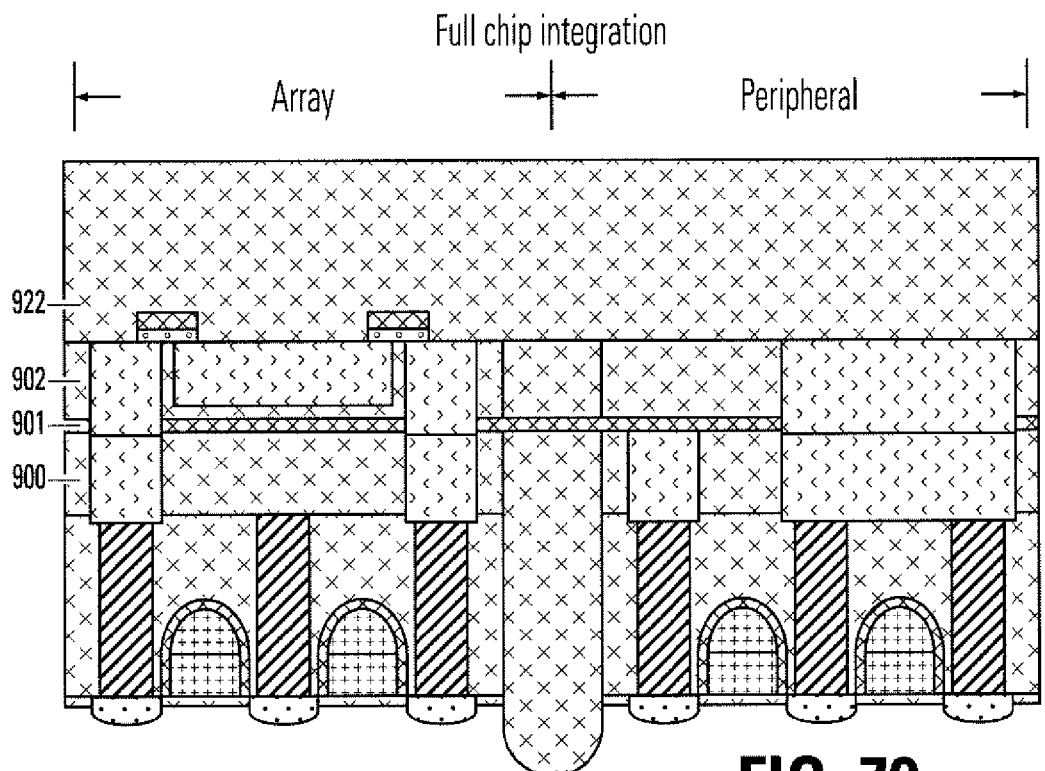
FIG. 79 illustrates a further stage in manufacturing the alternative embodiment for making an embedded memory including results of deposition of an interlayer dielectric fill.
Figure 80:
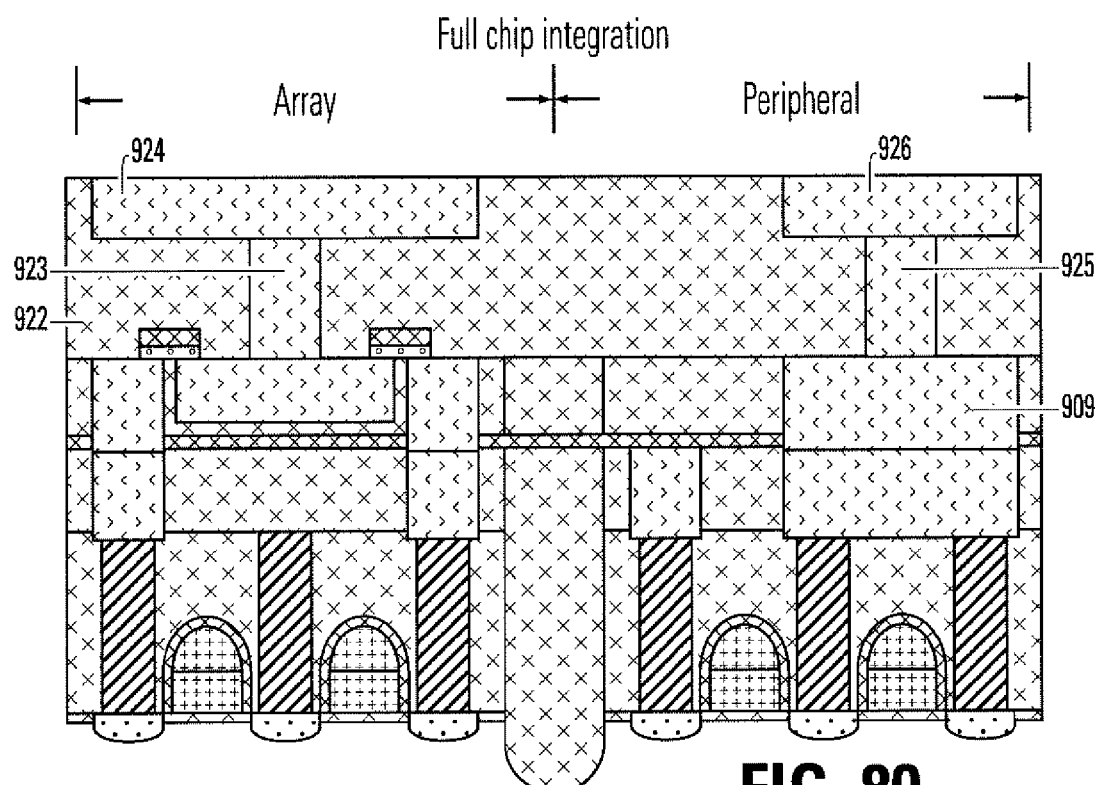
FIG. 80 illustrates a further stage in manufacturing the alternative embodiment for making an embedded memory including results of formation of patterned conductors in the interlayer dielectric fill.

FIG. 79 illustrates results of formation of an interlayer dielectric fill layer 922 over the phase change bridges, and over the peripheral area on the substrate. FIG. 80 illustrates results of via etching and patterned trench etching in the fill layer 922 and metal deposition in the vias and trenches to form a third patterned conductor layer. In this embodiment, a patterned conductor layer may be formed by a dual damascene process in the interlayer dielectric fill 922 using techniques known in the art. The position of the conductive plugs 923 and 925 can be defined using a photoresist mask, or other technique for defining the patterns. Likewise, the patterned conductors 924 and 926 are defined using photoresist lithography in a representative embodiment. The conductor 924 is arranged as a bitline in the array region on the device. The conductor 926 is used for interconnecting components as a third layer of metallization in the peripheral circuitry.

Figure 81:
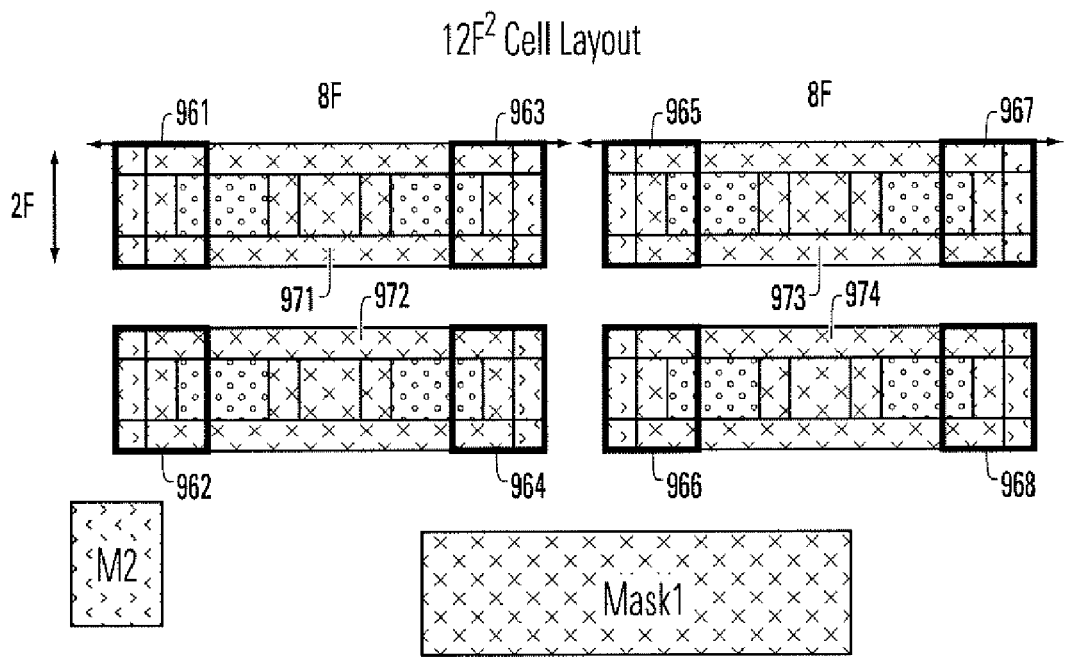
FIG. 81 illustrates a mask layout for defining the electrode trenches of FIG. 74.
Figure 82:
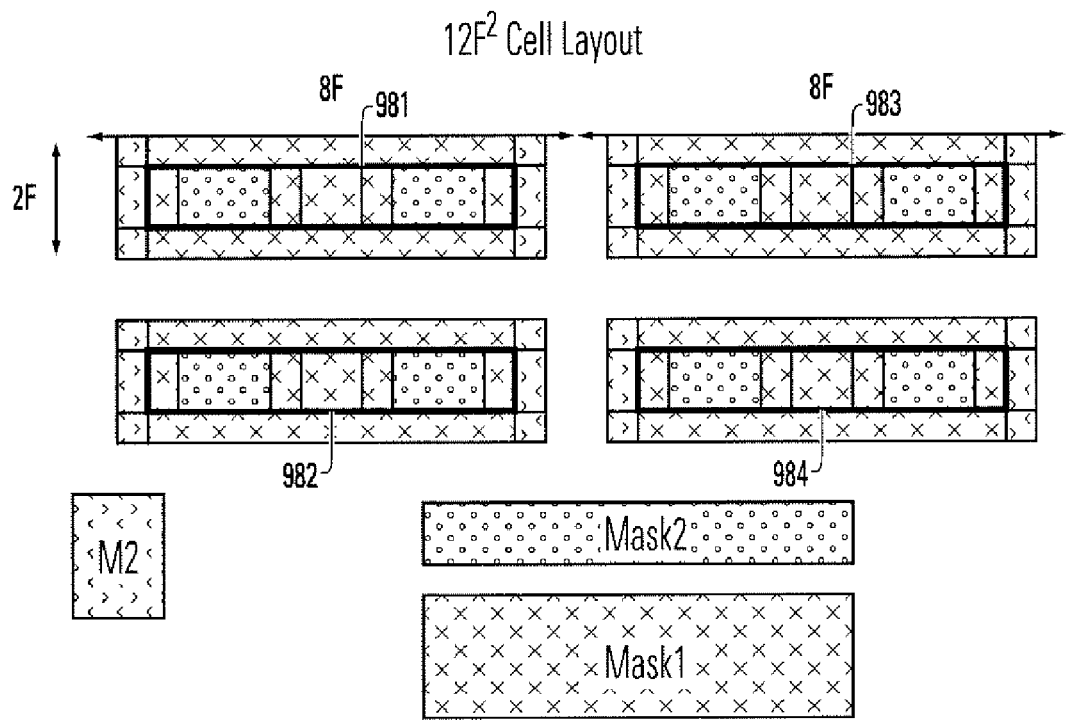
FIG. 82 illustrates a mask layout for defining the phase change bridges of FIG. 78.

FIGS. 81-83 illustrate the layout of a representative set of masks used for defining the trenches of FIG. 74, the bridges of FIG. 78 and the vias for the plugs of FIG. 80. In FIG. 81, Metal 2 areas 961-968 identify the locations of conductive plugs corresponding to plugs 110 and 112 of FIG. 73 for four pairs of memory cells. The dimensions of the Metal 2 areas are about 1.5F by 2F in the example shown, where F is the minimum feature size of the patterning process (e.g. photolithographic process) used to define the structures. The Mask 1 areas 971-974 identify the locations of trenches corresponding to the trench 910 of FIG. 74, overlapping the areas 961-968 slightly. The dimensions of the Mask 1 areas 971-974 are about 2F by about 6F, and overlap the Metal 2 areas 961-968 by about 1F in the example shown. The resulting area is about 7F by about 2F, and allowing for a 1F distance between structures, the area of the two cell structure is about 8F by 3F. Thus, the structure represented by FIGS. 81-83 has a per cell area of about 12F2. FIG. 82 illustrates Mask 2 areas 981-984 which identify the locations of Masks used to define the phase change material bridges corresponding to bridges 920, 921 of FIG. 78. The dimensions of the Mask 2 areas are about 1F by 6F. The Mask 2 areas define strips which overlap the Metal 2 areas by about 1F and overlie the electrode members and insulating members corresponding to member 915, 914 and 916 of FIG. 76. FIG. 83 illustrates via areas V2 which identify the locations of vias in which conductive plugs corresponding to plug 923 of FIG. 80 are formed. In the illustrated embodiment, the dimensions of the via V2 areas 991-994 are about 2F by 2F. The via V2 areas 991-994 define squares that intersect the Mask 2 areas near the center of the Mask 2 areas, dividing the strips of phase change material to form the separate bridges 920, 921. The resulting bridges have dimensions about 1F by 2F. In alternate embodiments, the width of the phase change bridges can be less than 1F, as described in detail above.

The embodiments illustrated in FIGS. 73-83 comprise embedded memory on an integrated circuit including three patterned conductor layers, with the phase change bridges formed in the middle patterned conductor layer. In other embedded memory products, more than three patterned conductor layers may be used. The phase change bridges can be formed in any particular layer according to this process, including the bottom layer, and any intermediate layer above the bottom layer. Embodiments can also be configured to form the phase change bridges on a top patterned conductor layer.

Most phase change memory cells known to applicant are made by forming a small pore filled with phase change material, and top and bottom electrodes contacting the phase change material. The small pore structure is used to reduce the programming current. This invention reduces programming current without formation of the small pore, resulting in better process control. Furthermore, there are no top electrodes on the cell, avoiding some possible damage of the phase change material from processes used to form the top electrode.

A cell described herein comprises two bottom electrodes with a dielectric spacer in between and a bridge of phase change material on the top of the electrodes spanning across the spacer. The bottom electrodes and dielectric spacer are formed in an electrode layer over front-end-of-line CMOS logic structures or other function circuit structures, providing a structure that easily support embedded memory and function circuits on a single chip, such as chips referred to as system on a chip SOC devices.

Advantages of an embodiment described herein include that the phase change happens on the center of the bridge over the dielectric spacer, rather than on the interface with an electrode, providing better reliability. Also, the current used in reset and programming is confined in a small volume allowing high current density and resultant local heating at lower reset current levels and lower reset power levels. The structure in embodiments described herein allows two dimensions of the cell to be defined by thin film thickness, achieving better process control at nanometer scales. Only one dimension of cell can be defined by a lithographic process using a trimmed mask layer, which avoids more complex shrinking techniques.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A memory device, comprising:
a substrate;
a pair of transistors having a common source region and two drain regions in the substrate;
a dielectric layer over the substrate, first and second contact plugs and a common source line in the dielectric layer;
an electrode structure having first, second, and third electrode members, wherein the first, second, and third electrode members have coplanar top surfaces;
an insulating structure separating each electrode member from one another, the insulating structure having first and second fence members and having a base member, the first fence member between the first and second electrode members, the second fence member between the second and third electrode members, the base member at an intermediate position between the second electrode member and the common source line;
a pair of bridges of phase change material, including a first bridge on the first and second electrode members across the first fence member, and a second bridge on the second and third electrode members across the second fence member; and
a first contact plug on the second electrode member.

2. The device of claim 1, further comprising word lines extending in a first direction acting as gates of the pair of transistors, the word lines substantially parallel to the common source line.

3. The device of claim 2, further comprising a bit line extending in a second direction, substantially perpendicular to the first direction.

4. The device of claim 1, further comprising second and third contact plugs in electrical contact with the two drain regions of the pair of transistors, the common source line is in electrical contact with the common source region of the pair of transistors.

5. The device of claim 1, wherein the pair of bridges is narrower than the electrode structure.

6. The device of claim 1, wherein the base member is thicker than the first and second fence members.

7. The device of claim 1, wherein a thickness of the fence members is about 50 nm or less, and at least one of the first bridge and the second bridge comprises a thin film with a thickness about 50 nm or less and a width about 50 nm or less.

8. The device of claim 1, wherein a thickness of at least one of the first fence member and the second fence member is about 20 nm or less, and at least one of the first bridge and the second bridge comprises a thin film with a thickness about 20 nm or less and a width about 20 nm or less.

9. The device of claim 1, wherein said first bridge has a thickness about 10 nm or less and a width about 10 nm or less.

10. The device of claim 1, wherein said second bridge has a thickness about 10 nm or less and a width about 10 nm or less.

11. The device of claim 1, wherein the insulating structure comprises silicon nitride.

12. The device of claim 1, wherein the phase change material comprises a combination of Ge, Sb, and Te.

13. The device of claim 1, wherein the phase change material comprises a combination of two or more materials from the group of Ge, Sb, Te, Se, In, Ti, Ga, Bi, Sn, Cu, Pd, Pb, Ag, S, and Au.

14. A memory device, comprising:
a substrate;
a pair of transistors having a common source region and two drain regions in the substrate;
a dielectric layer over the substrate, first and second contact plugs and a common source line in the dielectric layer;
an electrode structure having first, second, and third electrode members, wherein the first, second, and third electrode members have coplanar top surfaces;
an insulating structure separating each electrode member from one another, the insulating structure having first and second fence members and having a base member, the first fence member sandwiched between the first and second electrode members, the second fence member sandwiched between the second and third electrode members, the first fence member having a first minimum thickness equal to a first distance between the first and second electrode members, and the second fence member having a second minimum thickness equal to a second distance between the second and third electrode members;
a pair of bridges of phase change material, including a first bridge on the first and second electrode members across the first fence member, and a second bridge on the second and third electrode members across the second fence member; and a first contact plug on the second electrode member.

15. The device of claim 14, further comprising word lines extending in a first direction and acting as gates of the pair of transistors, the word lines substantially parallel to the common source line.

16. The device of claim 15, further comprising a bit line extending in a second direction, substantially perpendicular to the first direction.

17. The device of claim 14, further comprising second and third contact plugs in electrical contact with the two drain regions of the pair of transistors, the common source line is in electrical contact with the common source region of the pair of transistors.

18. The device of claim 14, wherein the pair of bridges is narrower than the electrode structure.

19. The device of claim 14, wherein the base member is thicker than the first and second fence members.

* * * * *